(12) United States Patent
Kumar et al.

(10) Patent No.: US 7,355,207 B2
(45) Date of Patent: Apr. 8, 2008

(54) SILICON CARBIDE SEMICONDUCTOR DEVICE AND METHOD FOR MANUFACTURING THE SAME

(75) Inventors: Rajesh Kumar, Nagoya (JP); Tsuyoshi Yamamoto, Kariya (JP); Hiroki Nakamura, Handa (JP); Toshiyuki Morishita, Nagoya (JP); Takasumi Ohyanagi, Hitachinaka (JP); Atsuo Watanabe, Hitachiota (JP)

(73) Assignees: DENSO CORPORATION, Kariya (JP); Hitachi, Ltd., Tokyo (JP)

( * ) Notice: Subject to any disclaimer, the term of this patent is extended or adjusted under 35 U.S.C. 154(b) by 224 days.

(21) Appl. No.: 11/135,661

(22) Filed: May 24, 2005

(65) Prior Publication Data

US 2005/0258454 A1    Nov. 24, 2005

(30) Foreign Application Priority Data

May 24, 2004   (JP)   ............................. 2004-153126
May 24, 2004   (JP)   ............................. 2004-153127

(51) Int. Cl.
*H01L 29/15* (2006.01)
*H01L 31/0312* (2006.01)

(52) U.S. Cl. ...................................... 257/77
(58) Field of Classification Search .................... 257/77
See application file for complete search history.

(56) References Cited

U.S. PATENT DOCUMENTS 5,323,040 A * 6/1994 Baliga ........................ 257/332
5,672,889 A * 9/1997 Brown ........................ 257/77
5,753,938 A * 5/1998 Thapar et al. ................. 257/77
6,313,482 B1 * 11/2001 Baliga ......................... 257/77
6,917,054 B2 * 7/2005 Onose et al. .................. 257/77
7,061,027 B2 * 6/2006 Tanaka et al. ............... 257/192
2003/0042491 A1 * 3/2003 Kumar et al. ................. 257/77
2005/0145852 A1 * 7/2005 Kumar et al. ................. 257/77

FOREIGN PATENT DOCUMENTS

JP    A-H08-167713    6/1996
JP    A-2003-68758    3/2003
JP    A-2003-69043    3/2003

OTHER PUBLICATIONS

J.H. Zhao et al., "3.6 mΩcm², 1726V 4H-SiC Normally-off Trenched-and-Implanted Vertical JFETs", ISPSD 2003, 2003 IEEE, Apr. 14-17, pp. 1-4. (Discussed in p. 3 of the spec.).

* cited by examiner

*Primary Examiner*—Jerome Jackson
*Assistant Examiner*—Anthony Ho
(74) *Attorney, Agent, or Firm*—Posz Law Group, PLC

(57) ABSTRACT

A manufacturing method of a silicon carbide semiconductor device includes the steps of: preparing a semiconductor substrate including a silicon carbide substrate, a drift layer and a first semiconductor layer; forming a plurality of first trenches in a cell portion; forming a gate layer on an inner wall of each first trench by an epitaxial growth method; forming a first insulation film on the surface of the semiconductor substrate; forming a gate electrode on the first insulation film for connecting to the gate layer electrically; forming a source electrode on the first insulation film for connecting to the first semiconductor layer in the cell portion; and forming a drain electrode connected to the silicon carbide substrate electrically.

8 Claims, 31 Drawing Sheets

SILICON CARBIDE SEMICONDUCTOR DEVICE AND METHOD FOR MANUFACTURING THE SAME

CROSS REFERENCE TO RELATED APPLICATIONS

This application is based on Japanese Patent Applications No. 2004-153126 filed on May 24, 2004, and No. 2004-153127 filed on May 24, 2004, the disclosures of which are incorporated herein by reference.

FIELD OF THE INVENTION

The present invention relates to a silicon carbide semiconductor device and a method for manufacturing the device.

BACKGROUND OF THE INVENTION

A silicon semiconductor device equipped with a guard ring in a peripheral portion of a semiconductor chip is well-known. FIG. 31 shows a cross sectional view of this silicon semiconductor device. This semiconductor device is provided with a semiconductor substrate 103 having an $N^-$ type epitaxial layer 102 formed on an $N^+$ type silicon semiconductor substrate 101. In a cell portion of this semiconductor device, a P type body region 106 has been formed on a surface layer of the epitaxial layer 102, and an $N^+$ type source region 105 has been formed within the P type body region 106. Also, both a gate electrode 108 and a source electrode 109 have been formed on the semiconductor substrate 103. Also, in an outer peripheral portion which is located at an outer peripheral portion of the cell portion, a $P^+$ type guard ring diffusion layer 110 has been formed in the surface layer of the semiconductor substrate 103 by thermally diffusing an impurity, while a depth of this $P^+$ type guard ring diffusion layer 110 defined from the surface of the semiconductor substrate 103 is made deeper than a depth of the P type body region 106.

As previously explained, since the $P^+$ type layer of the guard ring is deeply formed as compared with the depth of the P type body layer of the cell portion, electric field concentration can be relaxed.

On the other hand, there is a silicon carbide semiconductor device equipped with a vertical type JFET having a trench. FIG. 20 is a cross sectional view for showing a conventional silicon carbide semiconductor device equipped with a JFET. This conventional silicon carbide semiconductor device is provided with an $N^+$ substrate J1 corresponding to a drain region, an $N^-$ drift layer J2, an $N^+$ type source layer J3, a $P^+$ type body layer J5, a $P^+$ type gate layer J6, a passivation layer J7, a gate wiring pattern J8, a silicon oxide film J9, a source electrode J10, and a drain electrode J11.

This conventional silicon carbide semiconductor device is manufactured by the below-mentioned method. After the $N^-$ type drift layer J2 and the $N^+$ type source layer J3 have been sequentially formed on the $N^+$ type substarate J1, a trench J4 is formed from a surface of the $N^+$ type source layer J3 up to the $N^-$ type drift layer J2. Then, an inclined ion implantation is carried out so as to form the $P^+$ type gate layer J6 in a region which is faced to a side plane of the trench J4 within the $N^-$ type drift layer J2. In the inclined ion implantation, an implantation angle is inclined with respect to a surface of the substrate. Subsequently, a vertical ion implantation is carried out so as to form the $P^+$ type body layer J5 in a region which is faced to a bottom plane of the trench J4 within the $N^-$ type drift layer J2.

Thereafter, the passivation film J7 is formed on a side wall of the trench J4, and the gate wiring pattern J8 is formed on the bottom plane of the trench J4. Furthermore, the silicon oxide film J9 is formed on the gate wiring pattern J8 in such a manner that the internal portion of the trench J4 is embedded. Then, the source electrode J10 is formed in such a manner that the source electrode J10 is formed to connect to the $N^+$ type source layer J3. Also, the drain electrode J11 is formed in such a manner that the drain electrode J11 is formed to connect to the $N^+$ substrate J1. Such a silicon carbide semiconductor device as shown in FIG. 20 may be manufactured in the above-described manner. This device is, for example, disclosed in J. H. Zhao et. al., "3.6 mΩcm2, 1726V 4H—SiC Normally-off Trenched-and-Implanted Vertical JFETs," in Power Semiconductor Device and Ics 2003, Proceedings, ISPSD 2003 IEEE 15th International Symposium, IEEE, 14-17 Apr. 2003, p. 50-53.

While the silicon carbide semiconductor device manufactured in the above-explained manner owns such a semiconductor structure which flows current from the drain electrode J11 toward the source electrode J10 along with the longitudinal direction, a cell size thereof can be made very narrow, and the memory cells can be integrated in a very fine mode, as compared with that of the semiconductor structure which flows current along with the lateral direction. Also, since the silicon oxide film J9 has been formed on the gate wiring pattern J8 in this silicon carbide semiconductor device, the thickness of this oxide film J9 becomes thick. As a result, there is a merit that an input capacitance of a gate is low.

However, the above-described conventional silicon carbide semiconductor device owns the below-mentioned problems.

As a first problem, an input resistance of the gate is high. As previously explained, since both the $P^+$ type body layer J5 and the $P^+$ type gate layer J6 have been formed in this silicon carbide semiconductor device, both a film thickness J5a of the $P^+$ type body layer J5 and a film thickness J6a of the $P^+$ type gate layer J6 are determined based upon ranges of ion implantation. Also, in the case that ions are implanted with respect to a substrate of a silicon carbide semiconductor, a range of impurity ions is normally small. As a consequence, the film thickness J5a of the $P^+$ type body layer J5 and the film thickness J6a of the $P^+$ type gate layer J6 are smaller than, or equal to 1 μm, namely are thin. As a consequence, the input resistance of the gate becomes high.

It should be understood that as a method for making both a film thickness of a $P^+$ type body layer and a film thickness of a $P^+$ type gate layer thicker, there is such a method for implanting ions that an accelerated voltage has been set to high energy, for instance, several MeV. However, in this ion implantation method, ion implanting apparatus with high energy is required. Also, when the ions are implanted in the high energy, damages may remain when the ions are implanted, and there is a risk that a junction between a gate and a drain may be destroyed. Therefore, this ion implantation method with the high energy is not preferably acceptable.

As a second problem, a withstanding voltage between the gate and the drain is low. In this silicon carbide semiconductor device, the $P^+$ type gate layer J6 owns a shape which is widened along the lateral direction shown in this drawing, and the $P^+$ type body layer J5 owns a shape which is widened along the lower direction shown in this drawing. In other words, a width of the $P^+$ type gate layer J6 along a parallel direction with respect to the substrate surface is different from a width of the P+ type body layer J5 along a vertical direction with respect to this substrate surface. As a result, in this semiconductor device, a step portion J12 is produced in a portion where the P+ type gate layer J6 is located adjacent to the P+ type body layer J5. As a consequence, in such a case that a voltage is applied to this semiconductor device, although not shown in this drawing, an equipotential line has been bent in this step portion J12 in an equipotential distribution. Since electric field concentration occurs in this step portion J12, the withstanding voltage between the gate and the drain becomes low.

As a third problem, a contact resistance between a gate layer and a gate electrode is high. This reason is given as follows. That is, as represented in FIG. 20, while this silicon carbide semiconductor device owns such a structure that the gate wiring pattern J8 and the P+ type body layer J5 have been connected on the bottom plane of the trench J4, a contact area is small because of only the connection between the gate wiring pattern J8 and the P+ type body layer J5. In such a structure, even when an input resistance of a gate is tried to be lowered in order to increase a switching speed, in the case that a cell size is, for instance, 3 μm, or 4 μm, the input resistance of the gate could not be sufficiently lowered.

As a fourth problem, in such a case that while a motor, or the like is connected to the silicon carbide semiconductor device, this silicon carbide semiconductor device is operated, there is a risk that a gate driving circuit is destroyed. That is, when surge energy such as back electromotive force which is produced from an inductance load is applied to this silicon carbide semiconductor device, the surge energy is extracted from the drain electrode J11 via the P+ type body layer J5 to the gate wiring pattern J8. This destruction risk is caused by the following reason. That is, in the silicon carbide semiconductor device having the structure described in Power Semiconductor Device and Ics 2003, Proceedings, ISPSD 2003 IEEE 15th International Symposium, IEEE, 14-17 Apr. 2003, p. 50-53, the P+ type body layer J5 has been connected to the gate wiring pattern J8 on the bottom plane of the trench J4, and no specific measure with respect to the surge energy has been carried out.

SUMMARY OF THE INVENTION

In view of the above-described problem, it is an object of the present invention to provide a silicon carbide semiconductor device having excellent electric properties. Further, it is another object of the present invention to provide a method for manufacturing a silicon carbide semiconductor device having excellent electric properties.

A method for manufacturing a silicon carbide semiconductor device includes the steps of: preparing a semiconductor substrate including a silicon carbide substrate, a drift layer and a first semiconductor layer, wherein the silicon carbide substrate has a first conductive type, wherein the drift layer has the first conductive type, is made of silicon carbide and is disposed on the silicon carbide substrate, and wherein the first semiconductor layer has the first conductive type, is made of silicon carbide and is disposed on the drift layer; forming a plurality of first trenches in a cell portion of the semiconductor substrate, wherein each of the first trenches has a depth from a surface of the first semiconductor layer to the drift layer; forming a gate layer on an inner wall of each first trench by an epitaxial growth method, wherein the gate layer has a second conductive type and is made of silicon carbide; forming a first insulation film on the surface of the semiconductor substrate; forming a gate electrode on the first insulation film, wherein the gate electrode is connected to the gate layer electrically; forming a source electrode on the first insulation film, wherein the source electrode is connected to the first semiconductor layer in the cell portion; and forming a drain electrode connected to the silicon carbide substrate electrically.

In the above method provides the silicon carbide semiconductor device having the gate layer thicker than that of a conventional device. Accordingly, input resistance of the gate becomes lower. Further, the gate layer on the inner wall of the first trench is formed by the epitaxial method so that the shape of the gate layer is traced along with the shape of the inner wall of the first trench. Thus, the gate layer has no step portion so that electric field concentration at the corner of the gate layer is suppressed. Therefore, the withstand voltage between the gate and the drain in the device becomes higher. Accordingly, the method provides the silicon carbide semiconductor device having excellent electric properties.

Preferably, the method further includes the steps of: forming a plurality of second trenches between the step of preparing the semiconductor substrate and the step of forming the source electrode, wherein the second trenches are formed on a region, which is different from the cell portion, and wherein the second trenches have intervals between two neighboring second trenches, each interval being wider than an interval between two neighboring first trenches; and forming a second semiconductor layer on an inner wall of each second trench by an epitaxial growth method, wherein the second semiconductor layer has the second conductive type and is made of silicon carbide. In the step of forming the source electrode, the source electrode is connected to the second semiconductor layer electrically so that a diode is provided, and the diode is formed in the region, which is different from the cell portion, is connected to the source electrode electrically, and is provided by the drift layer and the second semiconductor layer. In this case, the interval between two second trenches is wider than that between two first trenches, so that an interval between two neighboring second semiconductor layers becomes wider than that between tow gate layers. Thus, the withstand voltage of the diode is lower than that of the cell portion. When surge energy such as inverse electromotive force is applied to the drain electrode, the diode is firstly broken down before the cell portion is broken down. Therefore, the surge energy is discharged from the source electrode. Accordingly, a gate operation circuit in the device is prevented from failure, when the surge energy is applied to the device.

Preferably, the method further includes the steps of: forming a third trench between the step of preparing the semiconductor substrate and the step of forming the source electrode, wherein the third trench is formed on a region between the cell portion and the diode; and forming a third semiconductor layer on an inner wall of the third trench by an epitaxial growth method, wherein the third semiconductor layer has the second conductive type and is made of silicon carbide. In the step of forming the source electrode, the source electrode is formed to isolate from the third semiconductor layer, and in the step of forming the gate electrode, the gate electrode is formed to isolate from the third semiconductor layer. In this case, a floating layer is formed between the cell portion and the diode. Thus, when the gate voltage is applied to the gate layer, the gate electrode and the source electrode are prevented from short-circuiting therebetween.

Preferably, in the step of preparing the semiconductor substrate, the semiconductor substrate has a principal surface of a (0001)-Si surface, and in the step of forming the first trenches, each first trench is formed in such a manner that the first trench has a bottom parallel to the principal surface of the semiconductor substrate and a sidewall perpendicular to the principal surface of the semiconductor substrate. In this case, the gate layer formed on the (0001)-Si surface has a thickness thicker than that of the gate layer formed on a surface perpendicular to the (0001)-Si surface. Further, the carrier concentration of the gate layer formed the (0001)-Si surface is higher than that on the surface perpendicular to the (0001)-Si surface. Thus, the gate layer on the bottom of the trench has thick thickness and high carrier concentration, compared with that of the gate layer on the sidewall of the trench. Accordingly, the input resistance of the gate becomes lower. Further, a gate wiring can be connected to the gate layer disposed on the bottom of the trench, so that the gate layer is connected to the gate wiring with excellent ohmic contact. Thus, the contact resistance between the gate layer and the gate electrode becomes lower.

Further, a method for manufacturing a silicon carbide semiconductor device includes the steps of: preparing a semiconductor substrate including a silicon carbide substrate, a drift layer and a first semiconductor layer, wherein the silicon carbide substrate has a first conductive type, wherein the drift layer has the first conductive type, is made of silicon carbide and is disposed on the silicon carbide substrate, and wherein the first semiconductor layer has the first conductive type, is made of silicon carbide and is disposed on the drift layer; forming a plurality of first trenches in a cell portion of the semiconductor substrate, wherein each first trench has a depth from a surface of the first semiconductor layer to the drift layer; forming a plurality of second trenches in a periphery portion of the semiconductor substrate, wherein each second trench has a depth from the surface of the first semiconductor layer, the depth which is equal to the depth of the first trench; forming a gate layer on an inner wall of each first trench by an epitaxial growth method, wherein the gate layer has a second conductive type and is made of silicon carbide; forming a guard ring layer on an inner wall of each second trench by an epitaxial method, wherein the guard ring layer is made of silicon carbide and has the second conductive type; forming an insulation film on the surface of the semiconductor substrate; forming a gate electrode on the insulation film, wherein the gate electrode is connected to the gate layer electrically; forming a source electrode on the insulation film, wherein the source electrode is connected to the first semiconductor layer in the cell portion; and forming a drain electrode connected to the silicon carbide substrate electrically.

The above method provides the silicon carbide semiconductor device having a JFET including the substrate as a drain, the first semiconductor layer as a source and a part of the drift layer as a channel. Further, the guard ring has the depth equal to the depth of the gate layer in the cell portion. Accordingly, input resistance of the gate becomes lower. Further, the withstand voltage between the gate and the drain in the device becomes higher. Thus, the method provides the silicon carbide semiconductor device having excellent electric properties.

Preferably, the method further includes the step of: removing the first semiconductor layer disposed on the periphery portion between the step of preparing the semiconductor substrate and the step of forming the second trenches. In the step of forming the second trenches, the second trenches are formed in the periphery portion, of which the first semiconductor layer is removed. In this case, the depth of the guard ring becomes deeper than that of the bottom of the gate layer. Accordingly, electric field concentration at the periphery portion is reduced, so that the withstand voltage of the device is increased.

Further, a silicon carbide semiconductor device includes: a semiconductor substrate including a silicon carbide substrate, a drift layer and a first semiconductor layer, which are disposed in this order, where in the silicon carbide substrate has a first conductive type, wherein the drift layer has the first conductive type and is made of silicon carbide, and wherein the first semiconductor layer has the first conductive type and is made of silicon carbide; a plurality of first trenches disposed in a cell portion of the semiconductor substrate, wherein each of the first trench has a depth from a surface of the first semiconductor layer to the drift layer, and has a rectangular cross section in a vertical direction of the semiconductor substrate; a gate layer disposed on an inner wall of each first trench, wherein the gate layer is made of silicon carbide, has a second conductive type, and has an epitaxial construction; a channel region disposed between the gate layer; a first insulation film disposed on a surface of the semiconductor substrate; a gate electrode disposed on the first insulation film and connected to the gate layer electrically; a source electrode electrically connected to the first semiconductor layer disposed in the cell portion; and a drain electrode electrically connected to the silicon carbide substrate.

In the above device, input resistance of the gate becomes lower. Further, the gate layer has no step portion so that electric field concentration at the corner of the gate layer is suppressed. Therefore, the withstand voltage between the gate and the drain in the device becomes higher. Accordingly, the method provides the silicon carbide semiconductor device having excellent electric properties.

Further, a silicon carbide semiconductor device includes: a semiconductor substrate including a silicon carbide substrate, a drift layer disposed on the silicon carbide substrate and a first semiconductor layer disposed on the drift layer, wherein the silicon carbide substrate has a first conductive type, wherein the drift layer has the first conductive type and is made of silicon carbide, and wherein the first semiconductor layer has the first conductive type and is made of silicon carbide; a plurality of first trenches disposed in a cell portion of the semiconductor substrate, wherein each first trench has a depth from a surface of the first semiconductor layer to the drift layer; a gate layer disposed on an inner wall of each first trench, wherein the gate layer is made of silicon carbide, has a second conductive type, and has an epitaxial construction along with the inner wall of the first trench; a plurality of second trenches disposed in a periphery portion of the semiconductor substrate, wherein each second trench has a depth equal to the depth of the first trench; a guard ring layer disposed on an inner wall of each second trench, wherein the guard ring layer is made of silicon carbide, has a second conductive type, and has an epitaxial construction along with the inner wall of the second trench; an insulation film disposed on the surface of the semiconductor substrate; a gate electrode disposed on the insulation film and connected to the gate layer electrically; a source electrode electrically connected to the first semiconductor layer disposed in the cell portion; and a drain electrode electrically connected to the silicon carbide substrate.

The above device provides a JFET including the substrate as a drain, the first semiconductor layer as a source and a part of the drift layer as a channel. The guard ring has the depth equal to the depth of the gate layer in the cell portion. Accordingly, input resistance of the gate becomes lower. Further, the withstand voltage between the gate and the drain in the device becomes higher. Thus, the method provides the silicon carbide semiconductor device having excellent electric properties.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
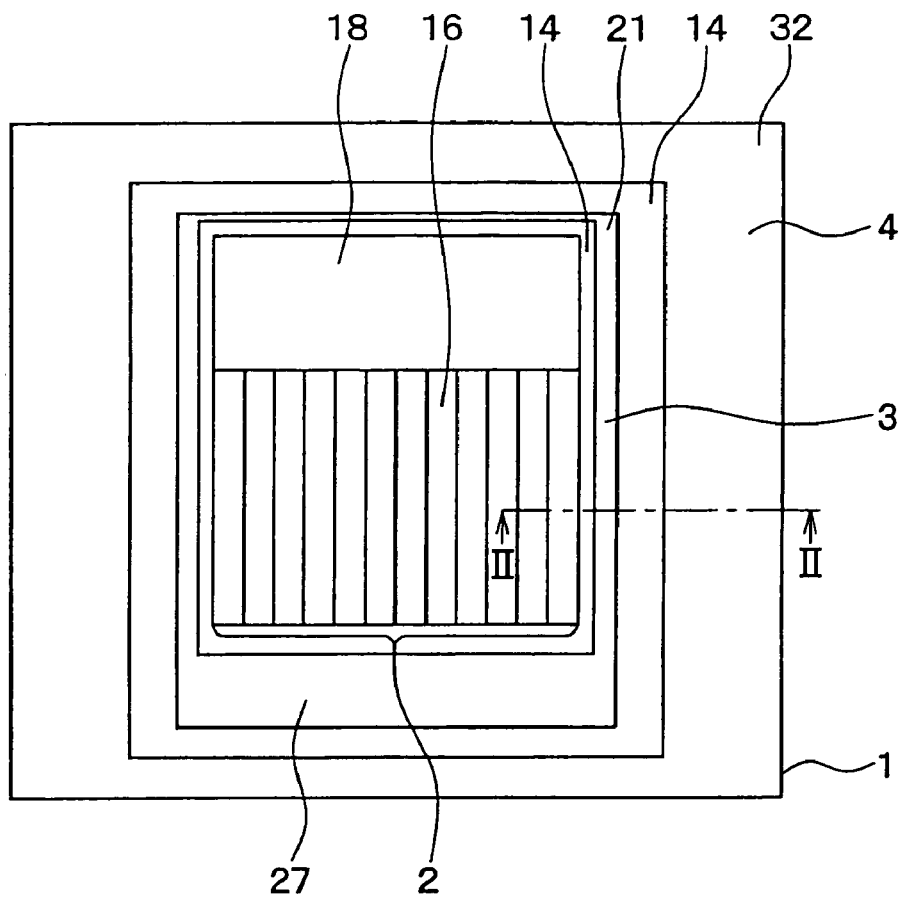
FIG. 1 is a plan view showing a silicon carbide semiconductor device according to a first embodiment of the present invention.

FIG. 1 is a plan view for showing a silicon carbide semiconductor device equipped with a JFET, according to a first embodiment mode of the present invention. Also, FIG. 2 is a cross sectional view for indicating the semiconductor device, taken along a line II-II shown in FIG. 1.

Figure 2:
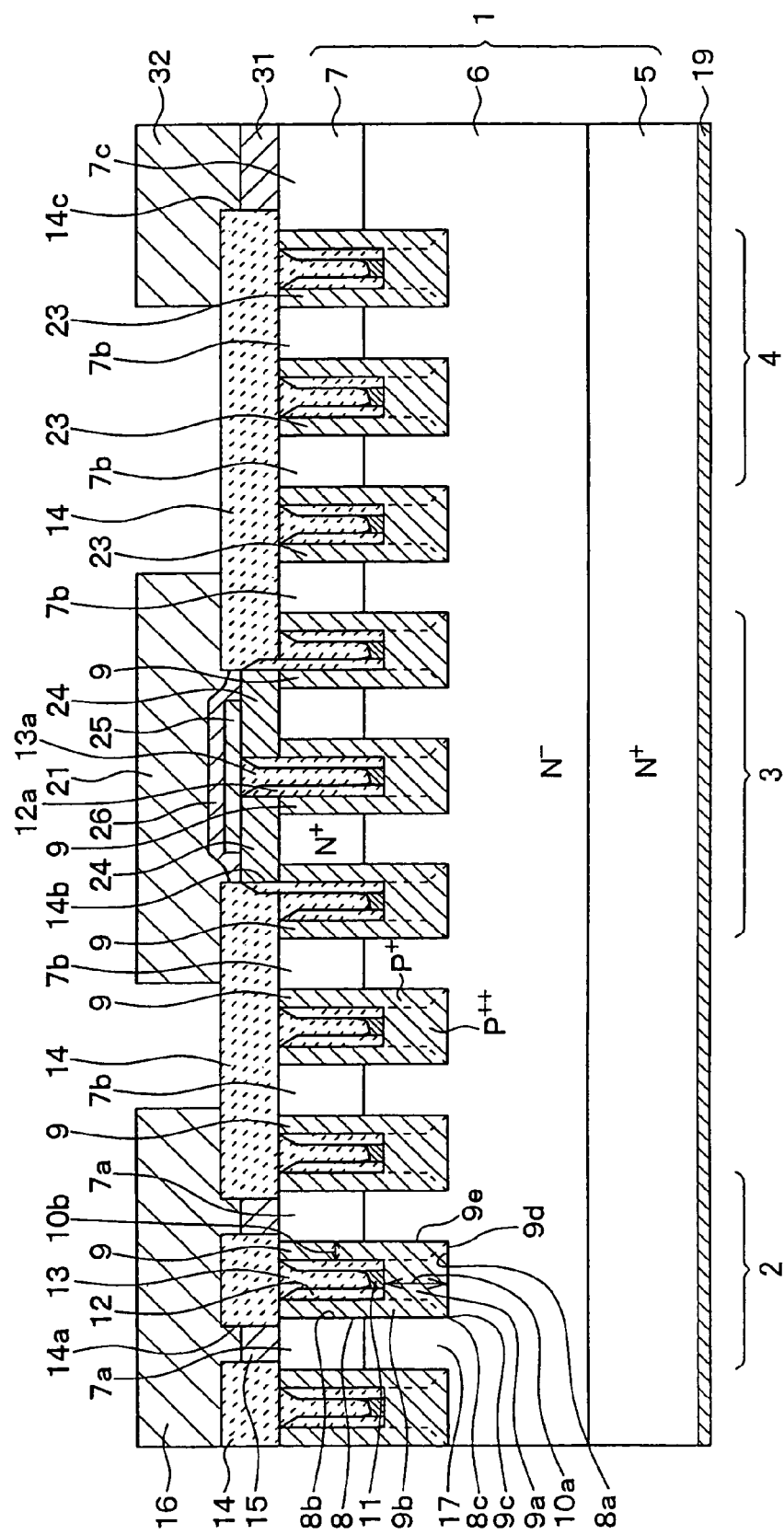
FIG. 2 is a cross sectional view showing the device taken along line II-II in FIG. 1.

As represented in FIG. 1 and FIG. 2, the silicon carbide semiconductor device of this first embodiment mode has been equipped with a cell portion 2, a gate wiring portion 3, and an outer peripheral portion 4. The cell portion 2 is located at a center of a semiconductor substrate 1. The gate wiring portion 3 and the outer peripheral portion 4 are sequentially positioned on the outer peripheral side of this cell portion 2.

As illustrated in FIG. 2, in the semiconductor substrate 1, an $N^-$ type drift layer 6 and an $N^+$ type semiconductor layer 7 functioning as a first semiconductor layer have been sequentially formed on a major surface of an $N^+$ type substrate 5. In this first embodiment mode, a first conductivity type is defined as an N type, and a second conductivity type is defined as a P type. The $N^+$ type substrate 5, the $N^-$ type drift layer 6, and the $N^+$ type semiconductor layer 7 have been manufactured by silicon carbide. A major surface of the semiconductor substrate 1 has been formed as a (0001)-Si face. Also, a drain electrode 19 has been formed on the side of a rear plane of the $N^+$ type substrate 5.

The cell portion 2 corresponds to a region which is operated as a transistor within the semiconductor substrate 1. In the cell portion 2, the N⁺ type substrate 5 constitutes a drain layer, and the N⁺ type semiconductor layer 7 constitutes a source layer 7a.

In the cell portion 2, a plurality of trenches 8 have been formed in the semiconductor substrate 1 in such a manner that these plural trenches 8 have been separated form each other. A depth of each of the trenches 8 is made from a surface of the source layer 7a and is reached to the N⁻ type drift layer 6. A bottom plane 8a of this trench 8 has been constructed as a (0001)-Si face, and a side plane 8b thereof has been vertically located with respect to the bottom plane 8a. In other words, a bottom plane corner portion 8c of the trench 8 has been made at a right angle. It should be understood that while such a shape defined by both the bottom plane 8a and the side plane 8b may be merely made in a substantially rectangular shape, the bottom plane corner portion 8c of the trench 8 may be alternatively rounded. In this case, the above-described "substantially rectangular shape" implies not only such a shape whose corners are made in right angles, but also a shape whose corners are rounded.

Then, in the cell portion 2, a P type gate layer 9 made of silicon carbide has been formed on an inner wall of each of the trenches 8. While the P type gate layer 9 has been manufactured by an epitaxial growth method, the P type gate layer 9 has such a shape which is fitted to the inner walls 8a and 8b of the trench 8. In other words, the P type gate layer 9 owns a U-shaped form. Then, a contour which is defined by both a bottom plane 9d and a side plane 9e of the P type gate layer 9 owns a substantially rectangular shape which is similar to the sectional shape of the trench 8.

The P type gate layer 9 has been constituted by a bottom plane-sided P⁺⁺ type gate layer 9a, and a side plane-sided P⁺ type gate layer 9b. The bottom plane-sided P⁺⁺ type gate layer 9a corresponds to a portion which has been formed on the bottom plane 8a of each of the trenches 8. The side plane-sided P⁺ type gate layer 9b corresponds to a portion which has been formed on the side plane 8b of each of the trenches 8. A thickness 10a in the bottom plane-sided P⁺⁺ type gate layer 9a along the vertical direction with respect to the bottom plane 8a of each of the trenches 8 becomes thicker than a thickness 10b in the side plane-sided P⁺ type gate layer 9b along the vertical direction with respect to the side plane 8b of each of the trenches 8. Also, carrier concentration of the bottom plane-sided P⁺⁺ type gate layer 9a becomes higher than that of the side plane-sided P⁺ type gate layer 9b.

A gate wiring-purpose metal 11 has been formed on a surface of the bottom plane-sided P⁺⁺ type gate layer 9a inside each of the trenches 8 of the cell portion 2. The gate wiring purpose metal 11 has been electrically connected to a gate electrode 21 via the gate wiring-purpose metal 11 in a gate wiring portion 3 (will be explained later), and this gate wiring-purpose metal 11 has been connected to the bottom plane-sided P⁺⁺ type gate layer 9a. The gate wiring-purpose metal 11 is manufactured by, for example, Ti (titanium).

Furthermore, a side wall 12 has been formed within each of the trenches 8 of the cell portion 2. The side wall 12 is made of an insulating film, and has been formed only on the side plane-sided P⁺ type gate layer 9b. In addition, an embedded insulating film 13 has been formed on both the side wall 12 and the gate wiring-purpose metal 11. In other words, the trench 8 is completely blocked by both the side wall 12 and the embedded insulating film 13. The side wall 12 and the embedded insulating film 13 are constituted by, for example, a silicon oxide film. Both the sidewall 12 and the embedded insulating film 13 correspond to a second insulating film.

In the cell portion 2, an interlayer insulating film 14 and a source electrode 16 have been sequentially formed on the surface of the semiconductor substrate 1. Then, the source electrode 16 has been electrically connected to the source layer 7a via an ohmic electrode 15 which has been formed in a contact hole 14a of the interlayer insulating film 14. Concretely speaking, the interlayer insulating film 14 has been formed by a silicon oxide film, the ohmic electrode 15 has been formed by Ni, and the source electrode 16 has been formed by Al.

Also, as shown in FIG. 1, the source electrode 16 has been electrically connected to a source electrode pad portion 18 which is positioned on an upper side of the cell portion 2 as viewed in this drawing.

The gate wiring portion 3 is a region where the gate electrode 21 has been formed. A structure of the semiconductor substrate 1 in the gate wiring portion 3 is made of a structure similar to that of the cell portion 2. In other words, in the gate wiring portion 3, a trench 8 has been formed in the semiconductor substrate 1. Then, while a P type gate layer 9 has been formed inside the trench 8, this P type gate layer 9 has been electrically connected to the P type gate layer 9 of the cell portion 2. Further, both a side wall 12 and an embedded insulating film 13 have been formed inside the trench 8. An N⁺ type semiconductor layer 7b which is located in the gate wiring portion 3 within the N⁺ type semiconductor layer 7 has been electrically isolated with respect to both the source electrode 16 and the gate electrode 21.

In the gate wiring portion 3, a P type semiconductor layer 24 used for a contact has been formed on the surface of the N⁺ type semiconductor layer 7b within the contact hole 14b in such a manner that this N⁺ type semiconductor layer 7b is completely covered by this P type semiconductor layer 24. The contact hole 14b has been formed in the interlayer insulating film 14 on the surface of the semiconductor substrate 1. The contact-purpose P type semiconductor layer 24 has been connected to P type semiconductor layers 24 located on both sides of the N⁺ type semiconductor layer 7b. The P type semiconductor layer 24 has been arranged only in the gate wiring portion 3, namely only within the region which is located under the lower side of the gate electrode 21. This P type semiconductor layer 24 corresponds to a fourth semiconductor layer.

Also, in the gate wiring portion 3, the heights of both the sidewall 12a and the embedded insulating film 13a are the same height as the surface of the P type semiconductor layer 24. An Al (gold) metal layer 25 has been formed on the surface of the side wall 12 and the surface of the embedded insulating film 13 in this gate wiring portion 3. Furthermore, an Ni (nickel) electrode 26 has been formed on a portion of the P type semiconductor layer 24 which is not covered by the Al metal layer 25, and formed on a surface of the Al metal layer 25.

Also, as shown in FIG. 1, the gate electrode 21 has been electrically connected to a gate electrode pad portion 27 which is located on a lower side of the cell portion 2 as viewed in this drawing.

The outer peripheral portion 4 corresponds to such a region which may maintain a withstanding voltage. A structure of the semiconductor substrate 1 in the outer peripheral portion 4 is also made similar to the structure of the cell portion 2. It should also be noted that a P type semiconductor layer 23 which has been formed in each of the trenches 8 within the outer peripheral portion 4 is electrically isolated. This P type semiconductor layer 23 may function as a guard ring. Also, while the N⁺ type semiconductor layer 7c which is located on the outermost peripheral portion within the N⁺ type semiconductor layer 7 located in the outer peripheral portion 4 has been electrically connected via an Ni electrode 31 to a metal electrode 32, this N⁺ type semiconductor layer 7c may function as an equipotential ring. The N⁺ type semiconductor layer 7b which is located on the side of the cell portion 2 rather than the N⁺ type semiconductor layer 7c within the N⁺ type semiconductor layer 7 has been electrically isolated from both the source electrode 16 and the gate electrode 21.

In the silicon carbide semiconductor device which has been manufactured with the above-explained structure, the cell portion 2 is operated in, for example, a normally-off mode (will be explained later). Such a portion which is located on the lower side of the source layer 7a and is positioned between the adjoining P type gate layers 9 within the N⁻ type drift layer 6 corresponds to a channel region 17. Then, in the case that a voltage is not applied to the adjoining P type gate layers 9, the channel region 17 is pinched off by depletion layers which are extended from both the adjoining P type gate layers 9. As a result, no current flows between the source and the drain. Then, in the case that a voltage is applied between the adjoining P type gate layers 9, since the extended amounts of the depletion layers which are extended to the channel region 17 are reduced, a current flows between the source and the drain.

Next, a description is made of a method for manufacturing the silicon carbide semiconductor device of this first embodiment mode. FIG. 3 to FIG. 16 represent manufacturing steps as to this silicon carbide semiconductor device.

Figure 3:
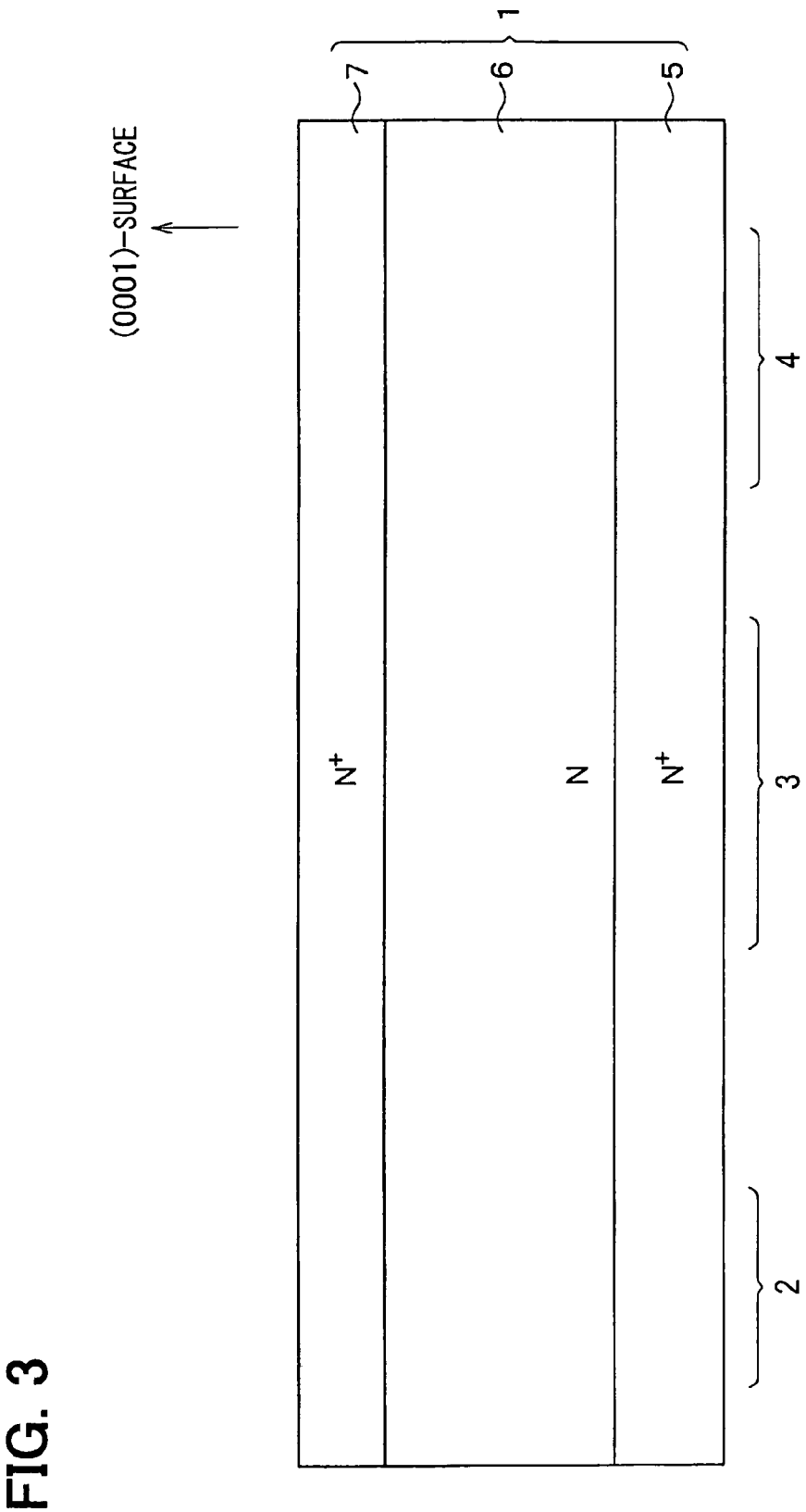
FIG. 3 is a cross sectional view explaining a manufacturing method of the device according to the first embodiment.

First, in the step shown in FIG. 3, a step for preparing a semiconductor substrate 1 is carried out. That is, both an N⁻ type drift layer 6 and an N⁺ type semiconductor layer 7 are sequentially formed on a surface of an N⁺ type substrate 5 by way of the epitaxial growth method. A major surface of the N⁺ type substrate 5 corresponds to a (0001)-Si face. At this time, the major surface of the semiconductor substrate 1 has become a (0001)-Si face.

Subsequently, in the step indicated in FIG. 4, a plurality of trenches 8 which are mutually separated from each other are formed at the same time by way of a photolithography and an etching process in a region which is scheduled to form a cell portion 2 of the semiconductor substrate 1, in another region which is scheduled to form a gate wiring portion 3, and in another region which is scheduled to form an outer peripheral portion 4. At this time, a depth of each of the trenches 8 is made equal to such a depth which is started from the surface of the N⁺ type semiconductor layer 7 and is reached to the N⁻ type drift layer 6. A bottom plane 8a of each of the trenches 8 is set parallel to the surface of the semiconductor substrate 1, and a side plane 8b of each of the trenches 8 is set vertically with respect to the surface of the semiconductor substrate 1. It should be noted that the region which is scheduled to form the gate wiring portion 3 corresponds to such a region which is scheduled to form a gate electrode.

As a result, the bottom plane 8a of each of the trenches 8 becomes a "(0001)-Si face", whereas the side plane 8b of each of the trenches 8 becomes an "a face." This "a face" corresponds to either a "(11-20)-face or a "(1-100)-face." Due to restrictions in expressions, "-(bar)" which is to be expressed over a numeral is normally expressed in front of this numeral. In this case, a shape which is defined by the bottom plane 8a and the side plane 8b of each of the trenches 8 becomes a rectangular shape. Alternatively, after the trenches 8 have been formed, such a process operation for rounding corners portions of the bottom planes of the trenches 8.

Subsequently, in the step shown in FIG. 5, a P type semiconductor layer 41 made of silicon carbide is formed by way of the epitaxial growth method on an inner wall of each of the trenches 8 up to the surface of the semiconductor substrate 1. At this time, the interior portions of the trenches 8 are not completely embedded by the P type semiconductor layer 41.

As a consequence, a P type gate layer 9 having a shape formed along the inner wall of each of the trenches 8 is formed in the region which is scheduled to form the cell portion 2. This P type gate layer 9 is constituted by both a bottom plane-sided P⁺⁺ type gate layer 9a on the bottom plane 8a of each of the trenches 8, and a side plane-sided P⁺ type gate layer 9b on the side plane 8b of each of the trenches 8. A thickness of the bottom plane-sided P⁺⁺ type gate layer 9a and carrier concentration thereof are thicker and higher than a thickness of the side plane-sided P⁺ type gate layer 9b and carrier concentration thereof. This reason is given as follows. That is, while plane azimuth of the trench bottom plane 8a is different from that of the trench side plane 8b, both film forming rates and the carrier concentration on the trench bottom plane 8a and the trench side plane 8b are different from each other. Also, when the P type gate layer 9 is formed, at the same time, a P type semiconductor layer 24 having a shape fitted along the inner wall of each of the trenches 8 is formed in the region which is scheduled to form the gate wiring portion 3, and also, a P type semiconductor layer 23 having a shape fitted along the inner wall of each of the trenches 8 is formed in the region which is scheduled to form the outer peripheral portion 4.

Figure 6:
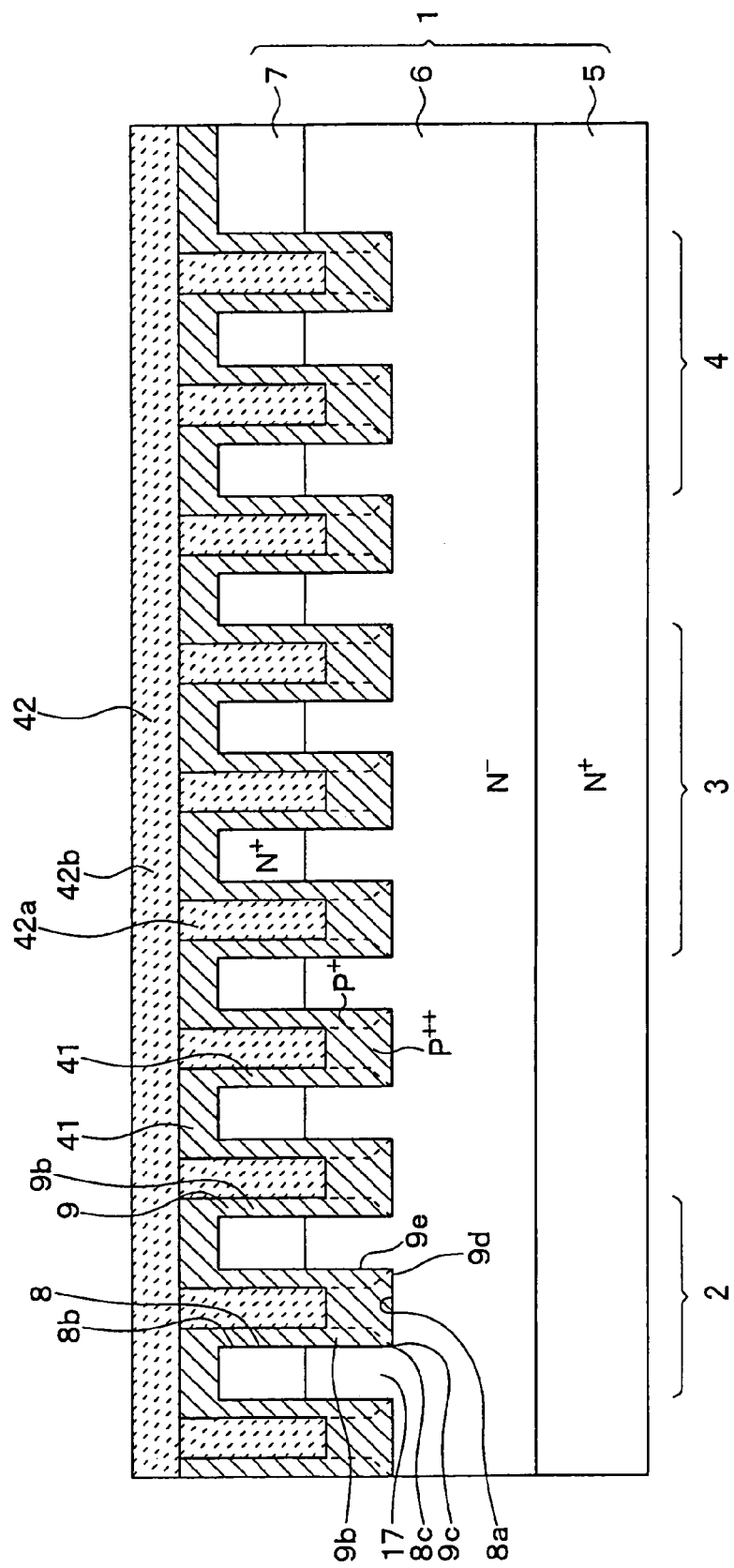
FIG. 6 is a cross sectional view explaining the manufacturing method of the device according to the first embodiment.

Subsequently, in the step represented in FIG. 6, for instance, a silicon oxide film 42 is formed as an insulating film on the surface of the P type semiconductor layer 41. Thereafter, the silicon oxide film 42 is flattened, and a silicon oxide film 42 is further formed on this flattened silicon oxide film 42. As a consequence, the inner portion of each of the trenches 8 is completely blocked by the P type semiconductor layer 41 and the silicon oxide film 42a and a silicon oxide film 42b is formed on the surface of the P type semiconductor layer 41 over the semiconductor substrate 1.

Figure 7:
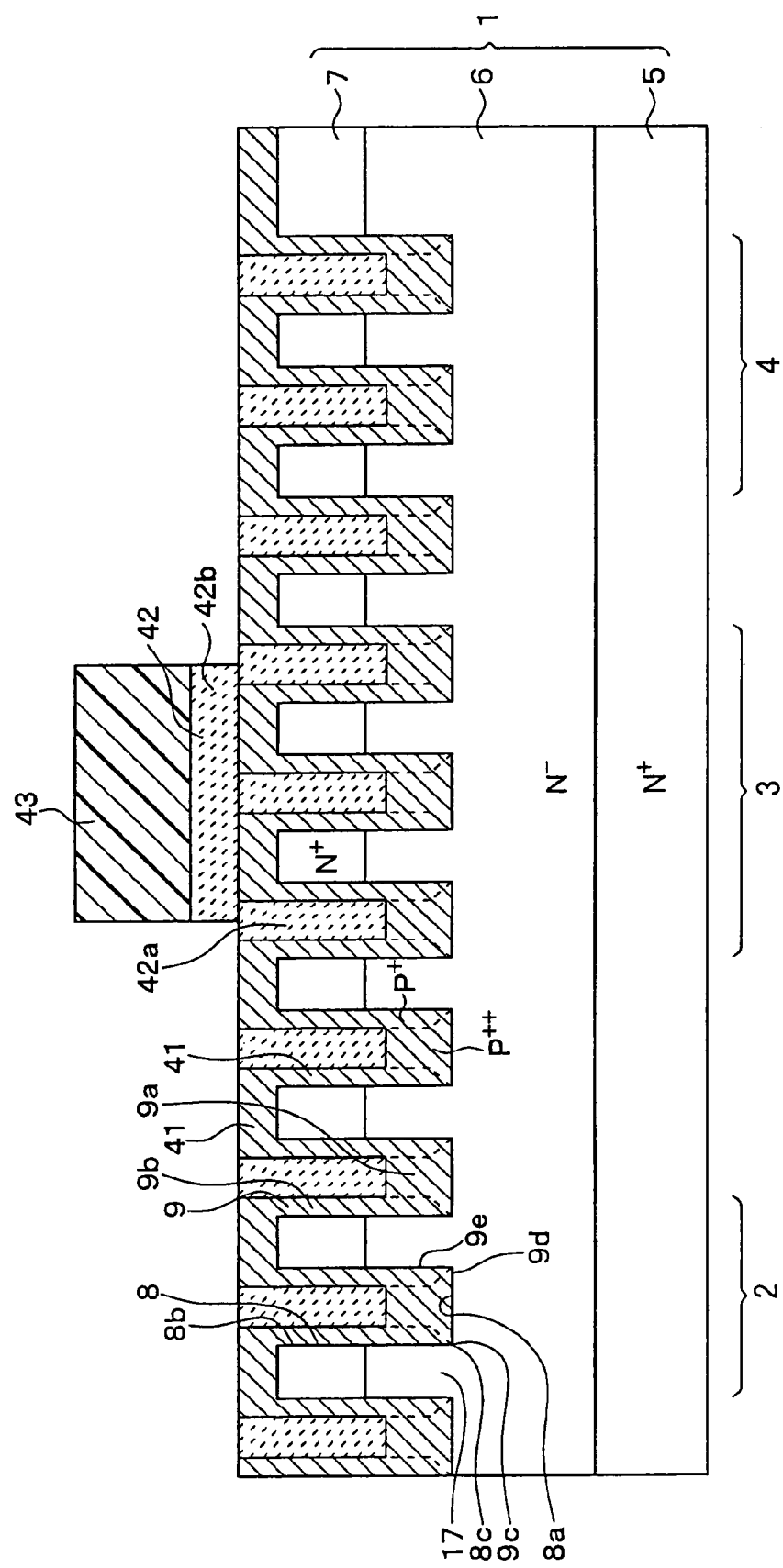
FIG. 7 is a cross sectional view explaining the manufacturing method of the device according to the first embodiment.

Subsequently, in the step indicated in FIG. 7, a photoresist 43 is formed on the surface of the silicon oxide film 42. Then, only such a silicon oxide film 42b of the region which is scheduled to form the gate wiring portion 3 is left, and the silicon oxide film 42b of other regions within the silicon oxide film 42b on the surface of the semiconductor substrate 1 by way of both a photolithography and an etching process.

Subsequently, in the step shown in FIG. 8, while the silicon oxide film 42b is used as a mask, the P type semiconductor layer 41 on the surface of the semiconductor substrate 1 is etched. Thereafter, both the silicon oxide film 42b and the upper portion of the silicon oxide film 42a within each of the trenches 8 are removed. As a result, the P type semiconductor layer 41 is left on the surface of the N⁺ type semiconductor layer 7 only in the region which is scheduled to form the gate wiring portion 3, whereas the N⁺ type semiconductor layer 7 is exposed from the P type semiconductor layer 41 in other regions. This left P type semiconductor layer 41 constitutes the P type semiconductor layer 24.

Figure 9:
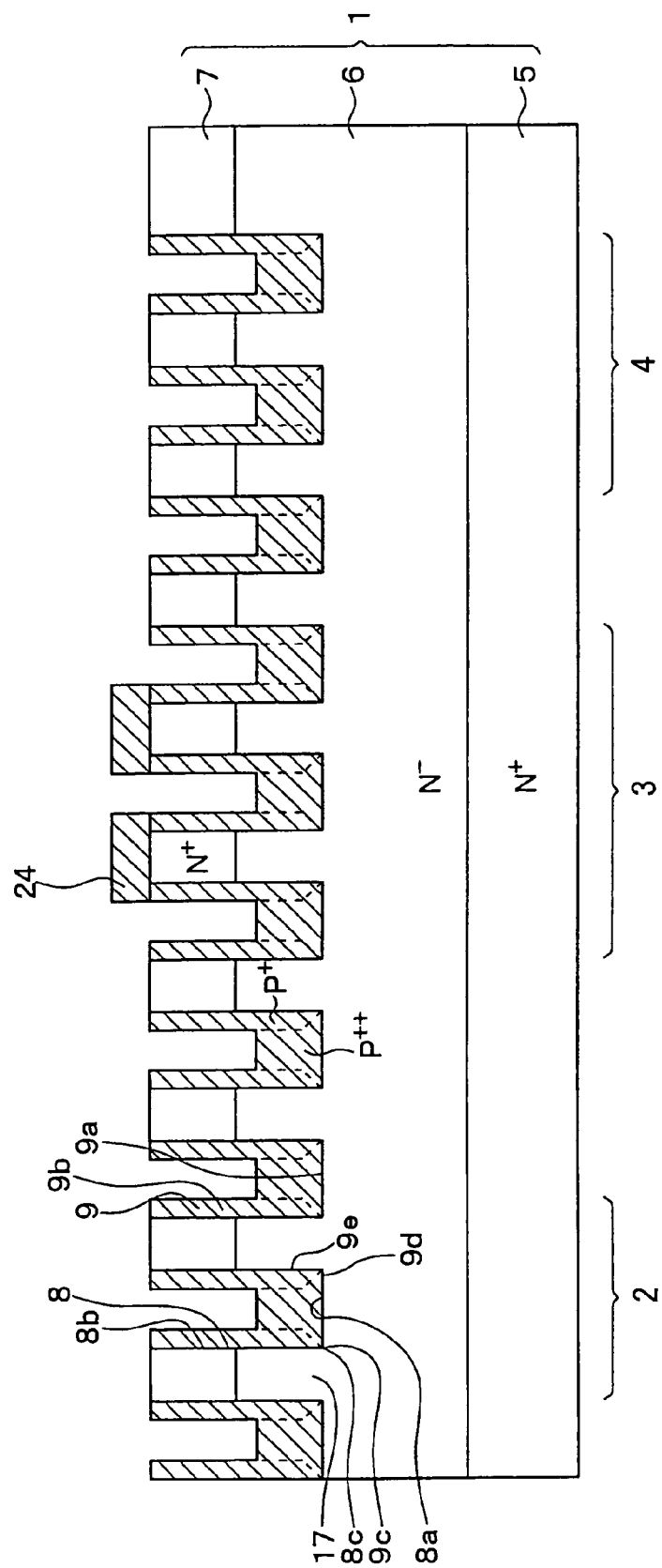
FIG. 9 is a cross sectional view explaining the manufacturing method of the device according to the first embodiment.

Subsequently, in the step indicated in FIG. 9, the silicon oxide film 42a inside each of the trenches 8 is etched so as to completely remove the silicon oxide film 42a from the interior portion of each of the trenches 8.

Figure 10:
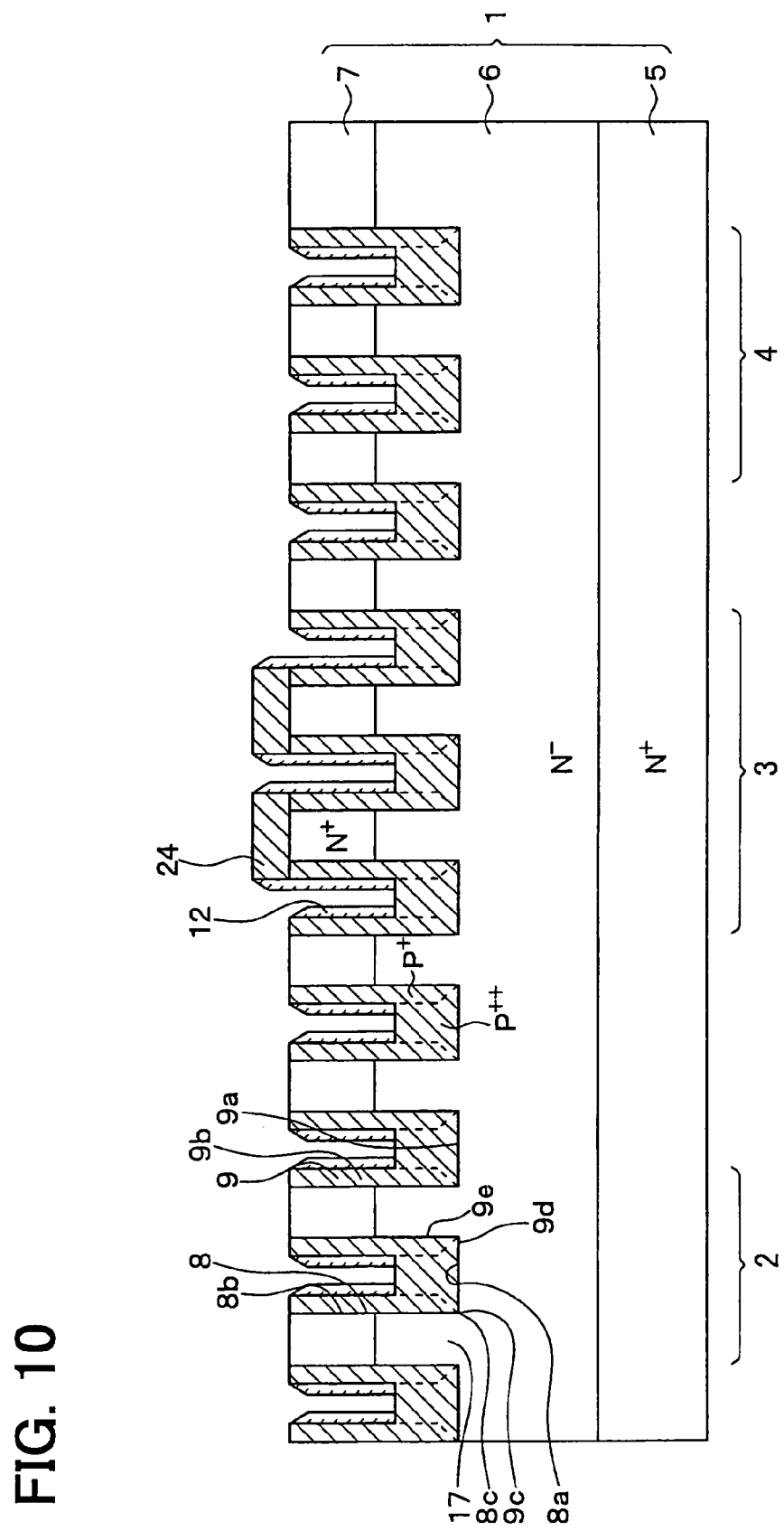
FIG. 10 is across sectional view explaining the manufacturing method of the device according to the first embodiment.

Subsequently, in the step represented in FIG. 10, a silicon oxide film is formed on the surface of the semiconductor substrate 1 inside each of the trenches 8 and is etched back, so that a side wall 12 is formed inside each of the each trenches 8.

Figure 11:
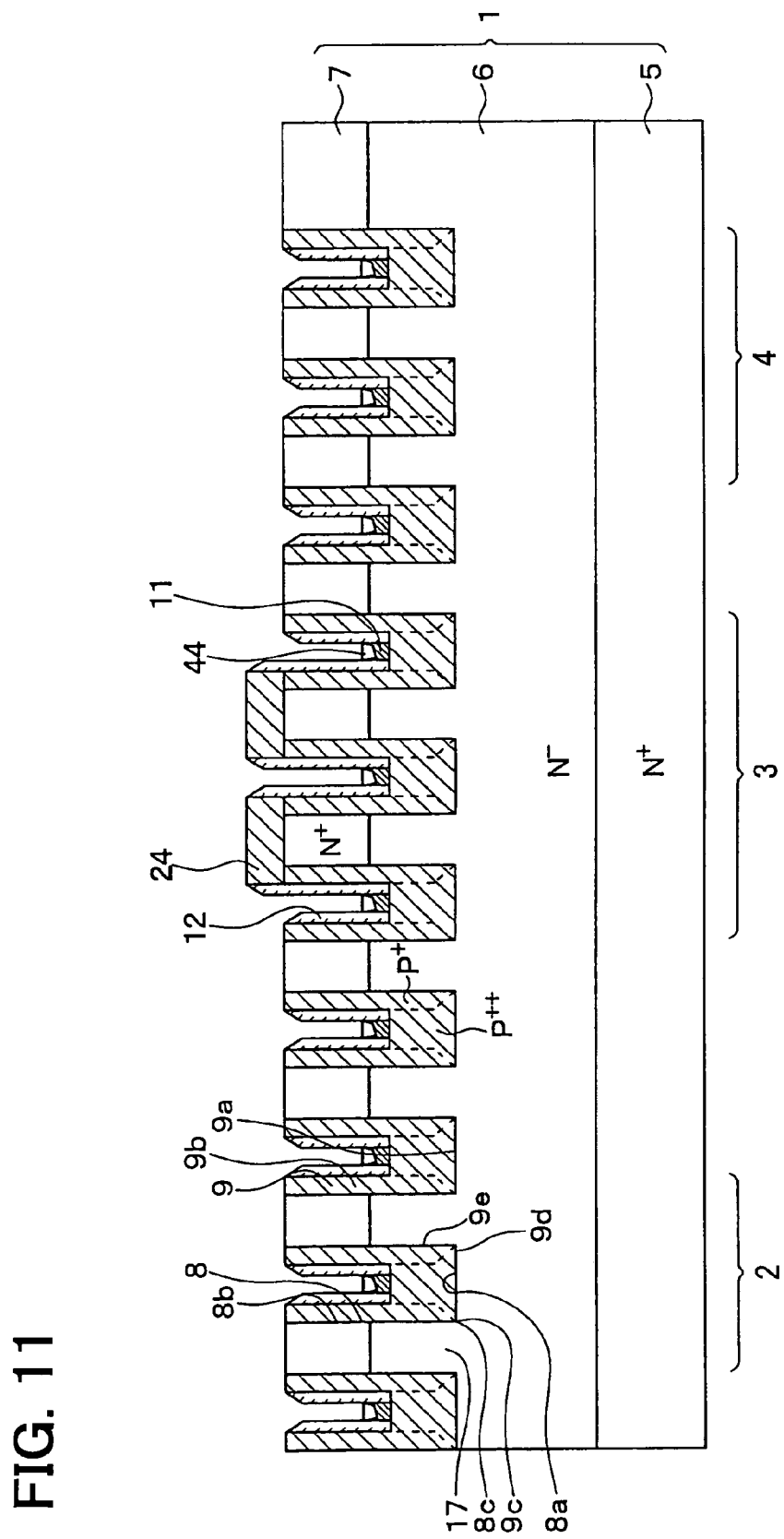
FIG. 11 is a cross sectional view explaining the manufacturing method of the device according to the first embodiment.

Next, in the step represented in FIG. 11, both a Ti (titanium) film and a photoresist are sequentially formed on the surface of the semiconductor substrate 1 which contains the interior portion of each of the trenches 8, and are etched back, so that a photoresist 44 is left inside each of the trenches 8 is left. Next, while the photoresist 44 is employed as a mask, the Ti film is etched. As a result, a gate wiring-purpose metal film 11 is formed inside each of the trenches 8.

Figure 12:
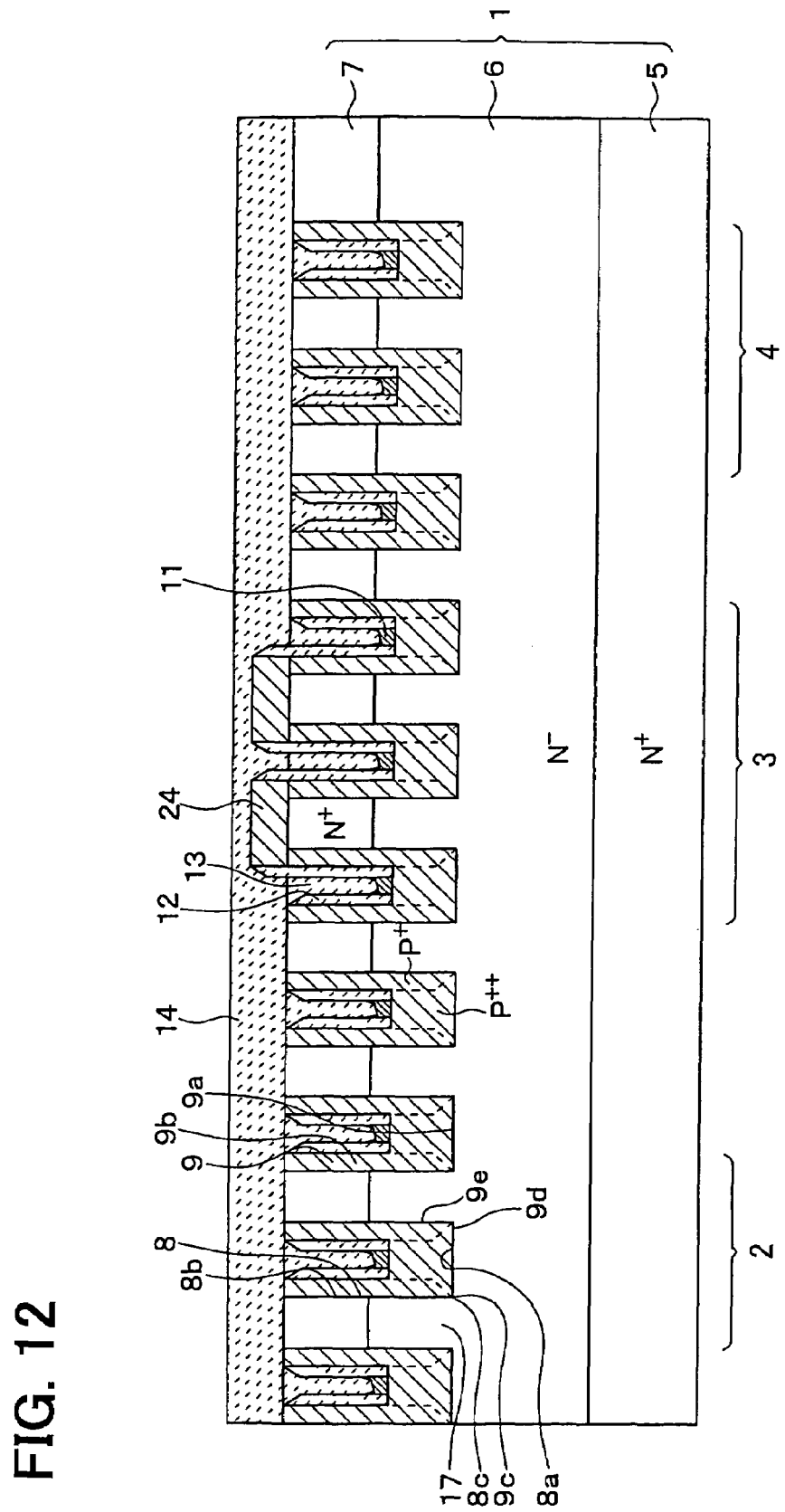
FIG. 12 is a cross sectional view explaining the manufacturing method of the device according to the first embodiment.

Next, in the step shown in FIG. 12, the photoresists 44 formed inside the trenches 8 are removed. A silicon oxide film is formed on the surface of the semiconductor substrate 1 which contains the interior portions of the trenches 8, and then, the formed silicon oxide film is etched back so as to be flattened, and further, a silicon oxide film is formed. As a result, an embedded silicon oxide film 13 is formed in each of the trenches 8, and an interlayer insulating film 14 is formed on the surface of the semiconductor substrate 1.

Subsequently, in the step shown in FIG. 13, a photoresist 45 is formed on the surface of the interlayer insulating film 14. Then, a contact hole 14a is formed in the interlayer insulating film 14 in such a manner that the N$^+$ type semiconductor layer 7 is exposed from this contact hole 14a in the region which is scheduled to form the cell portion 2 by way of both a photolithography and an etching process. Thereafter, the photoresist 45 is removed.

Figure 14:
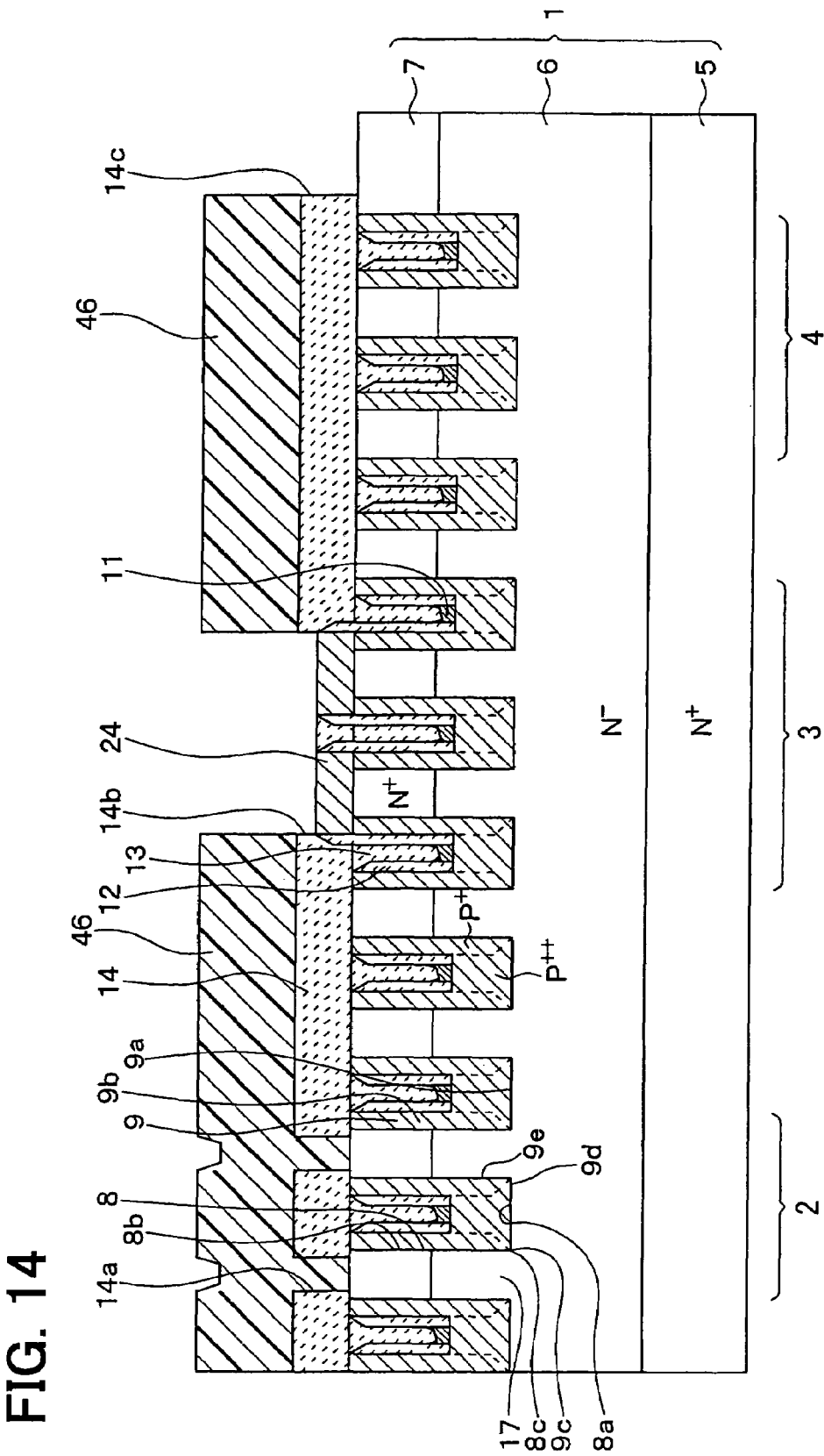
FIG. 14 is a cross sectional view explaining the manufacturing method of the device according to the first embodiment.

Subsequently, in the step shown in FIG. 14, a photoresist 46 is again formed on the surface of the interlayer insulating film 14. Then, a contact hole 14b is formed in the interlayer insulating film 14 in such a manner that the P type semiconductor layer 24 is exposed from this contact hole 14b in the region which is scheduled to form the gate wiring portion 8 by way of both a photolithography and an etching process. The P type semiconductor layer 24 has been formed on the surface of the N$^+$ type semiconductor layer 7. Also, at the same time, a contact hole 14c is formed in the interlayer insulating film 14 in such a manner that the N$^+$ type semiconductor layer 7 located in the outermost peripheral portion is exposed in the region which is scheduled to form the outer peripheral portion 4.

Figure 15:
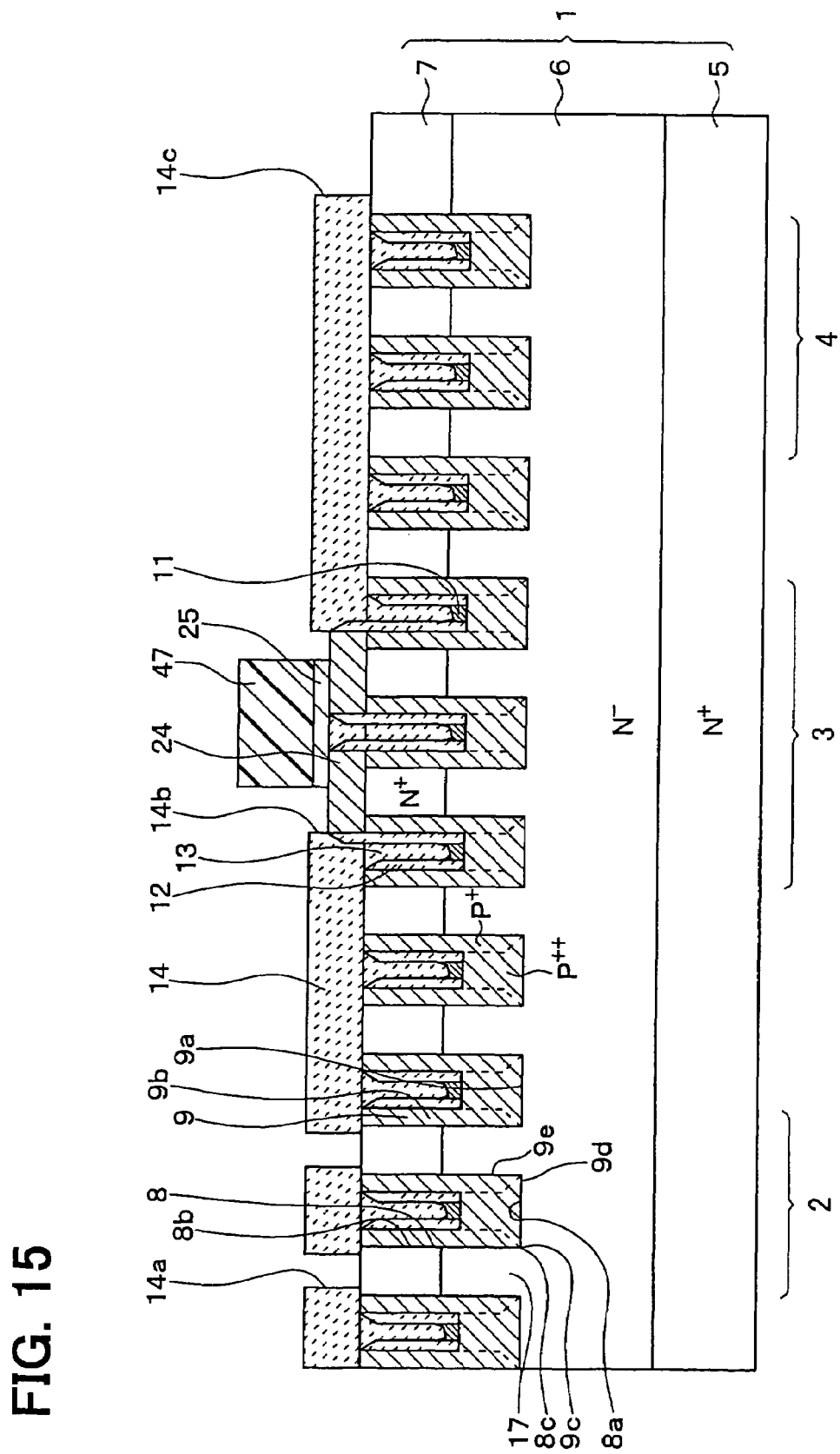
FIG. 15 is a cross sectional view explaining the manufacturing method of the device according to the first embodiment.

Next, in the step represented in FIG. 15, a metal containing Al (aluminium) is vapor-deposited on the surface of the interlayer insulating film 14 containing the interior portions on the contact holes 14a, 14b, and 14c. Then, a photoresist 47 is formed on the surface of the metal containing Al in the region which is scheduled to form the gate wiring portion 3, and the metal containing Al is patterned by way of a photolithography and a wet etching process. As a result, an Al metal layer 25 is formed on a surface of a portion of the P type semiconductor layer 24 and a surface of the embedded insulating film 13. Thereafter, the photoresist 47 is removed.

Subsequently, in the step indicated in FIG. 16, Ni (nickel) is vapor-deposited on the surface of the interlayer insulating film 14 containing the inner portions of the contact holes 14a, 14b, 14c, and then, the vapor-deposited Ni is treated by both a photolithography and an etching process, or a lift off method. Thereafter, the treated Ni is processed by a sintering process operation. As a result, an Ni electrode as the ohmic electrode 15, a Ni electrode 26, and an Ni electrode 31 are formed inside the contact holes 14a, 14b, and 14c respectively.

Also, Ni is also formed on the rear plane of the N$^+$ type substrate 5. As a result, a drain electrode 19 is formed on the rear plane of the N$^+$ type substrate 5.

Thereafter, an Al metal film is formed on the surface of the interlayer insulating film 14 which contains the interior portions of the contact holes 14a, 14b, 14c, and then, the formed Al metal film is patterned. As a consequence, as shown in FIG. 2, a source electrode wiring pattern 16 which has been electrically connected to the N$^+$ type semiconductor layer 7a is formed in the region which is scheduled to form the cell portion 2. Also, a gate electrode 21 which has been electrically connected to the P type gate layer 9 is formed in the region which is scheduled to form the gate wiring portion 3. Also, a metal electrode 32 which has been electrically connected to the N$^+$ type semiconductor layer 7 located at the outermost peripheral position is formed in the region which is scheduled to form the outer peripheral portion 4. Since the above-described manufacturing steps have been carried out, the silicon carbide semiconductor device having the semiconductor structure as shown in FIG. 2 may be accomplished.

Figure 4:
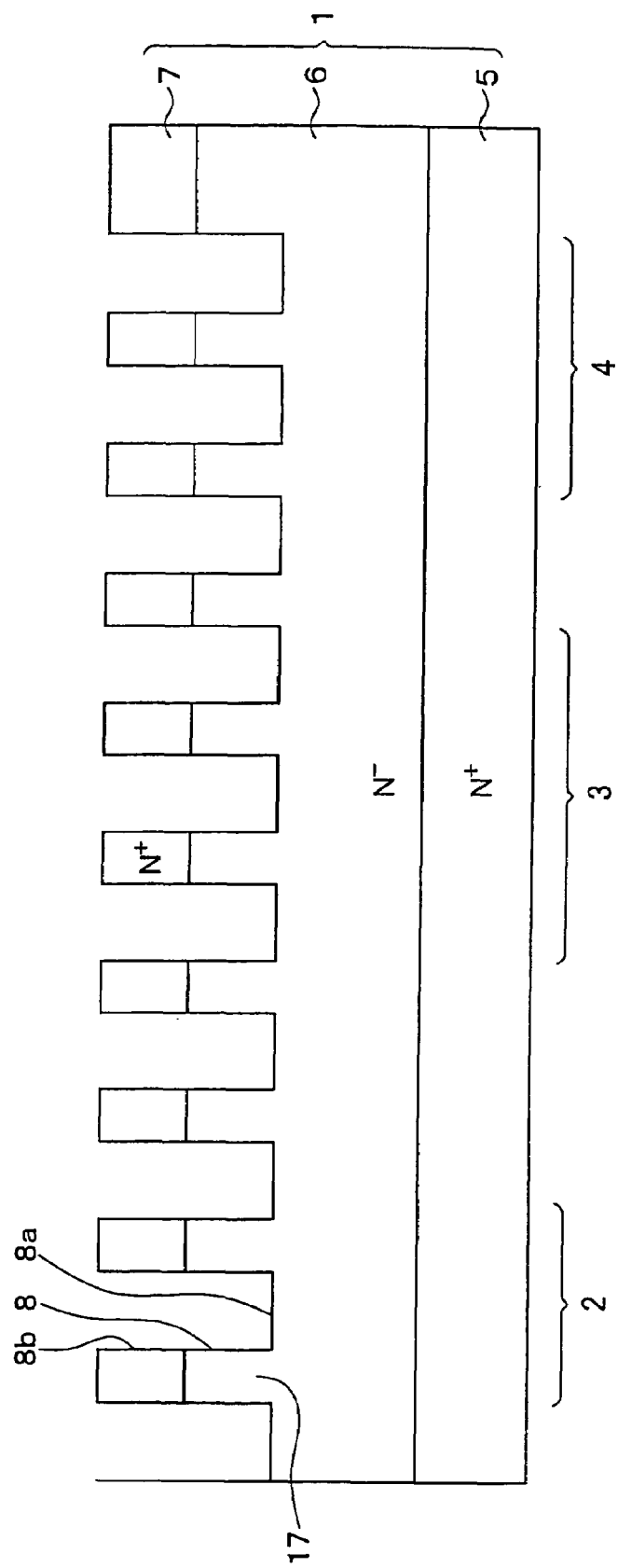
FIG. 4 is a cross sectional view explaining the manufacturing method of the device according to the first embodiment.
Figure 5:
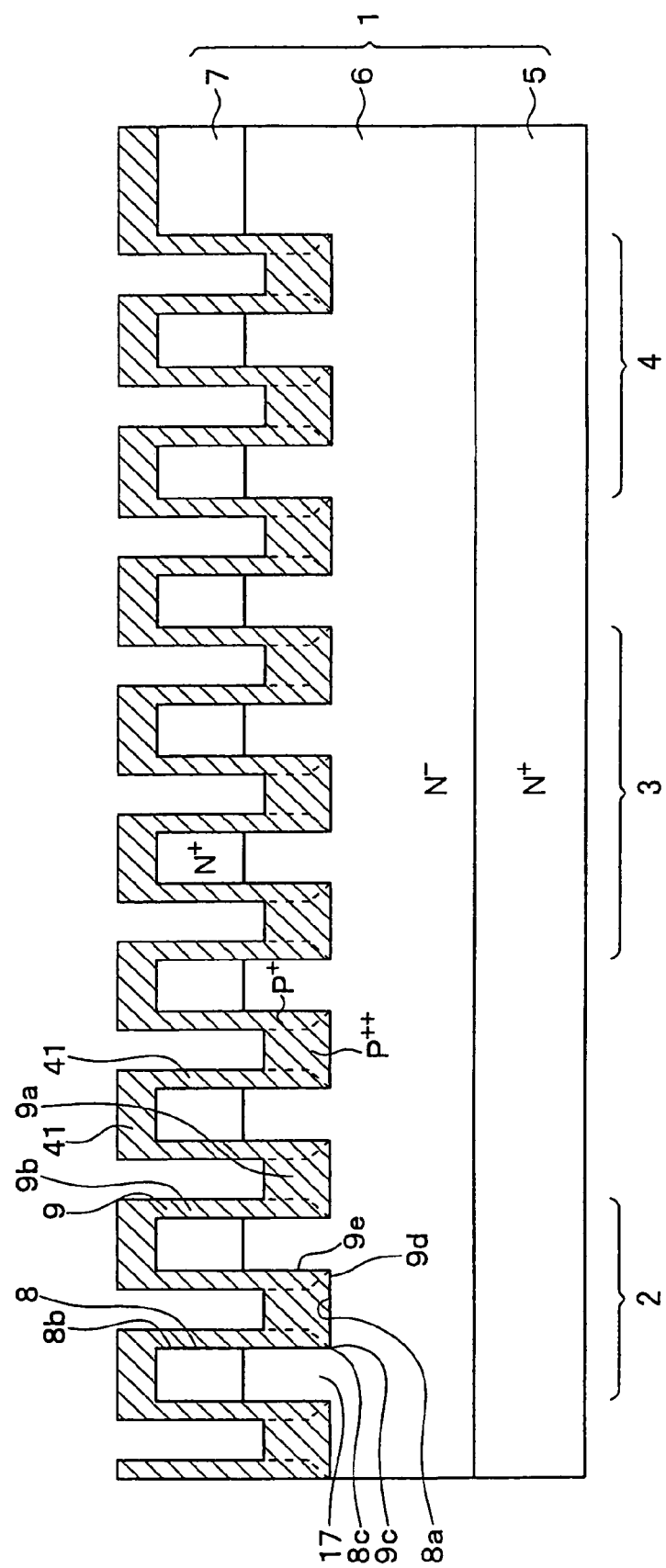
FIG. 5 is a cross sectional view explaining the manufacturing method of the device according to the first embodiment.

In this first embodiment mode, in the step shown in FIG. 4, the trenches 8 have been formed in the semiconductor substrate 1, and in the step indicated in FIG. 5, the P type gate layer 9 which is fitted along the inner wall of each of the trenches 8 has been formed in the region which is scheduled to form the cell portion 2 by way of the epitaxial growth method.

An epitaxial growth method corresponds to a method for depositing a semiconductor layer on a substrate, and has no relationship with both ranges and diffusion distances of impurity ions contained in a silicon carbide substrate. As a consequence, this epitaxial growth method can make the thickness of the P type gate layer 9 thicker, as compared with that of the conventional manufacturing method for manufacturing the gate layer by way of the ion implantation as explained in the above-described technical background. In other words, both the thickness 10a of the bottom plane-sided P$^{++}$ type gate layer 9a and the thickness 10b of the side plane-sided P$^+$ type gate layer 9b can be made larger than 1 μm.

Also, in the above-described conventional method for forming the gate layer by the ion implantation, when the ions are implanted, defects are produced and are left. As a result, all of the ions which have been implanted cannot be replaced by either Si or C at the lattice positions of silicon carbide. In other words, in the ion implantation, the activation rate of the impurity is low, the impurity cannot be caused to function as the original dopant, and thus, the carrier concentration of the gate layer cannot be easily increased.

To the contrary, in the epitaxial growth method employed in this first embodiment mode, while a defect is not produced (although defect is produced when ions are implanted), all of the impurities can be replaced by either Si or C at the lattice positions of silicon carbide. In other words, all of the impurities may function as the dopant. As a consequence, the carrier concentration of the gate layer can be easily increased, as compared with that of the conventional manufacturing method for manufacturing the gate layer by implanting the ions.

As apparent from the above-described manufacturing methods, in accordance with this first embodiment mode, the silicon carbide semiconductor device equipped with the JFET can be manufactured, which has the lower input resistance of the gate, as compared with that of the conventional manufacturing method.

Furthermore, in this first embodiment mode, since the P type gate layer 9 has been formed on the inner wall of each of the trenches 8 by way of the epitaxial growth method, atoms attached on the side plane 8b of the trench 8 are moved to the bottom plane 8a of the trench 8. In other words, since migration occurs, the thickness 10a of the bottom plane-sided gate layer 9a of each of the trenches 8 can be made thicker than the thickness 10b of the side plane-sided gate layer 9b of each of the trenches 8.

Also, in the step shown in FIG. 4, each of the trenches 8 has been formed in the semiconductor substrate 1 whose major surface is the (0001)-Si face in such a manner that the bottom plane 8a is set parallel to the surface of the semiconductor substrate 1, and the side plane 8b is vertically set with respect to the semiconductor substrate 1. In other words, the bottom plane 8a of the trench 8 is defined as the (0001)-Si face, and the side plane 8b of the trench 8 is defined as the "a face." As a consequence, in the step shown in FIG. 5, when the P type gate layer 9 is formed by way of the epitaxial growth method, the thickness of the trench bottom plane-sided gate layer 9a of the P type gate layer 9 becomes thicker than the thickness of the trench side plane-sided gate layer 9b thereof, and the carrier concentration of the trench bottom plane-sided gate layer 9a of the P type gate layer 9 becomes higher than the carrier concentration of the trench side plane-sided gate layer 9b thereof, due to the face azimuth depending characteristics as to the growth rate and the carrier concentration.

As a consequence, both the thickness 10b and the carrier concentration of the trench side plane-sided gate layer 9b of the P type gate layer 9 are mainly and merely process-designed, so that the thickness of the trench bottom plane-sided gate layer 9a of the P type gate layer 9 can be made thicker than the thickness of the trench side plane-sided gate layer 9b thereof, and also, the carrier concentration of the trench bottom plane-sided gate layer 9a of the P type gate layer 9 can be made higher than the carrier concentration of the trench side plane-sided gate layer 9b thereof. The higher the carrier concentration is increased, the lower the resistance value becomes. Also, since the trench bottom plane-sided gate layer 9a of the P type gate layer 9 is connected to the gate wiring-purpose metal 11, the ohmic characteristics as to the trench bottom plane-sided gate layer 9a and the gate wiring-purpose metal 11 can become superior.

As a result, in accordance with this first embodiment modes, as compared with such a semiconductor device that the carrier concentration and the thickness of the trench bottom plane-sided gate layer 9a of the P type gate layer 9 are made equal to the carrier concentration and the thickness of the trench side plane-sided gate layer 9b thereof, the silicon carbide semiconductor device equipped with the JFET can be manufactured, the gate input resistance of which is low.

Also, in this first embodiment mode, the thickness of the trench bottom plane-sided gate layer 9a of the P type gate layer 9 is made thicker than the thickness of the trench side plane-sided gate layer 9b thereof, and the shape of the P type gate layer 9 has been made in the U-shaped form, while the trenches 8 are not completely blocked by the P type semiconductor layer 41. Then, the embedded insulating film 13 has been formed inside each of the trenches 8.

In this case, the input capacitance of the gate is determined on the basis of the thickness of the interlayer insulating film 14 which is located on the upper side of each of the trenches 8 as viewed in the drawing. It is desirable that the input capacitance of the gate is small. To this end, the thickness of the interlayer insulating film 14 is required to become thick. As a consequence, in accordance with this first embodiment mode, the thickness of the interlayer insulating film 14 can be essentially made thick, and thus, the input capacitance of the gate can be reduced, as compared with such a case that the P type gate layer 9 has been formed by completely blocking the trenches 8 by the P type semiconductor layer 41.

As apparent from the above-explained description, in this first embodiment mode, while the thickness of the trench bottom plane-sided gate layer 9a of the P type gate layer 9 can be made thicker, the embedded insulating film 13 can be formed. The compatibility can be established in such a case that the input resistance of the gate can be made lower than that of the conventional art, and the input capacitance of the gate can be made lower than that of the conventional art.

As previously explained, in accordance with this first embodiment mode, since the carrier concentration of the P type gate layer 9 can be made higher than that of the conventional manufacturing method, the extension of the depletion layer which is extended from the P type gate layer 9 toward the N$^-$ type drift layer 6 can be increased, and thus, the channel region 17 can be readily pinched off. As a consequence, in accordance with this first embodiment mode, the interval of the gate layers used to realize the normally-off operation can be designed to become wider, as compared with that of the conventional manufacturing method. As a result, the silicon carbide semiconductor device equipped with the JFET can be manufactured, the ON-state resistance of which is low, as compared with that of the conventional manufacturing method.

Also, in this first embodiment mode, since the P type gate layer 9 has been formed on the inner wall of each of the trenches 8 by way of the epitaxial growth method, the contour of the P type gate layer 9 can be made in the substantially rectangular shape which is identical to the sectional shape of this trench 8. In other words, the shape of the gate layer can be made as such a shape having no stepped portion between the P$^+$ type body layer J5 and the P$^+$ type gate layer J6, as previously explained.

Figure 20:
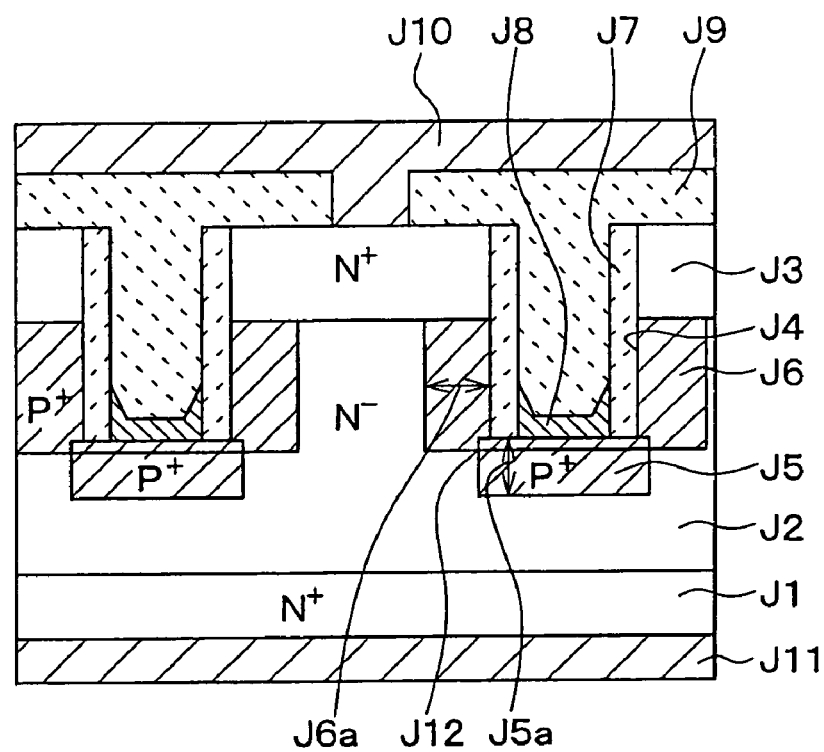
FIG. 20 is a cross sectional view showing a silicon carbide semiconductor device according to a related art.

As a consequence, as compared with the conventional semiconductor device shown in FIG. 20, the electric field concentration occurred in the vicinity of the bottom plane corner portions of the P type gate layer 9 can be suppressed. As a result, the withstanding voltage between the gate and the drain can be made higher than that of the conventional semiconductor device. In such a view point that the withstanding voltage is increased, it is preferable that the bottom plane corner portion 9c of the P type gate layer 9 is rounded. This reason is given as follows: That is, in the case that the bottom plane corner portion 9c is rounded, the electric field concentration may be relaxed, as compared with such a case that the bottom plane corner portion 9c is made in the rectangular shape.

Figure 8:
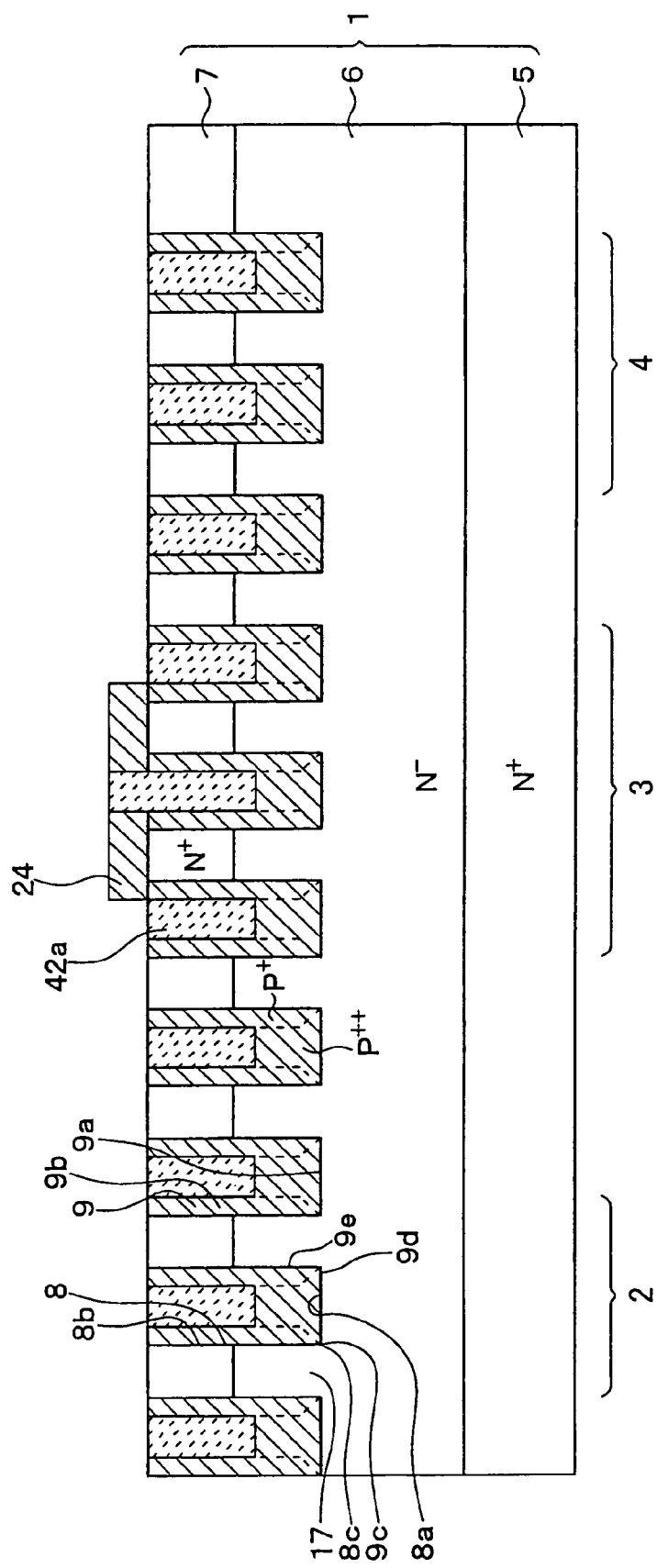
FIG. 8 is a cross sectional view explaining the manufacturing method of the device according to the first embodiment.

In this first embodiment mode, in the step shown in FIG. 5, the P type semiconductor layer 41 has been formed on the inner walls of the trenches 8 up to the surface of the semiconductor substrate 1; and in the step indicated in FIG. 8, the P type semiconductor layer 41 has been left on the surface of the N$^+$ type semiconductor layer 7 only in the region which is scheduled to form the gate wiring portion 3. As a result, the P type semiconductor layer 24 has been formed in the gate wiring portion 3, while this P type semiconductor layer 24 has been connected to the P type semiconductor layer 22 and has covered the N$^+$ type semiconductor layer 7. Then, in the steps shown in FIG. 15 and FIG. 16, the Al metal layer 25, the Ni electrode 26, and the gate electrode 21 have been formed. As a result, the P type semiconductor layer 24 has been electrically connected via the Al metal layer 25 and the Ni electrode 26 to the gate electrode 21.

As previously explained, the P type semiconductor layer 22 within each of the trenches 8 is electrically connected to the gate electrode 21 via the P type semiconductor layer 24 on the surface of the semiconductor substrate 1 in the gate wiring portion 3, so that the contact area between the P type gate layer 9 and the gate electrode 21 can be made larger than that of the conventional semiconductor device in which the P$^+$ type body larger J5 has been connected to the gate wiring pattern J8 on the bottom plane of the trench J4 as indicated in FIG. 20.

It should be understood that in this first embodiment mode, the below-mentioned case has been exemplified. That is, the P type semiconductor layer 41 is left on the surface of the N$^+$ type semiconductor layer 7 only in the region which is scheduled to form the gate wiring portion 3. Alternatively, while the P type semiconductor layer 41 may be left in a region other than the region for the gate wiring portion 3, the P type semiconductor layer 24 may be arranged in a region other tan the region for the gate wiring portion 3.

It should also be noted that since the P type semiconductor layer 24 is located opposite to the N$^+$ type semiconductor layer 7, it is preferable to make the area small, in which the P type semiconductor layer 24 is located opposite to the N$^+$ type semiconductor layer 7 in such a view point that the input capacitance is reduced.

As a consequence, such an arrangement is desirable that the P type semiconductor layer 41 is left only in the region which is scheduled to form the gate wiring portion 3 and the P type semiconductor layer 24 is arranged only within such a region which is positioned just under the gate electrode 21 instead of another arrangement. That is, the P type semiconductor layer 41 is left in the region other than the region for the gate wiring portion 3, and the P type semiconductor layer 24 is arranged in the region other than the region for the gate wiring portion 3.

It should also be noted that in this first embodiment mode, the surface of the N$^+$ type semiconductor layer 7 in the region which is scheduled to form the gate wiring portion 3 is brought into such a condition that this surface is completely covered by the P type semiconductor layer 24. As a consequence, there is no problem that the N$^+$ type semiconductor layer 7 is shortcircuited with the gate electrode 21.

Also, in this first embodiment mode, the Al metal layer 25 has been formed on the surface of the embedded insulating film 13 in the step shown in FIG. 15. Al (aluminium) may be readily diffused in an oxide film. As a consequence, in this first embodiment mode, Al contained in the Al metal layer 25 is diffused in the embedded insulating film 13. As a result, the embedded insulating film 13 may be changed into an electric conductor, and thus, the embedded insulating film 13 may function as an ohmic electrode. As apparent from the above-described fact, the contact area between the P type gate layer 9 and the gate electrode 21 can be increased, as compared with that of the above-explained conventional manufacturing method.

As a result, in accordance with this first embodiment mode, the silicon carbide semiconductor device equipped with the JFET can be manufactured, in which the contact resistance between the gate layer and the gate electrode is lower than that of the conventional manufacturing method.

Second Embodiment

Figure 17:
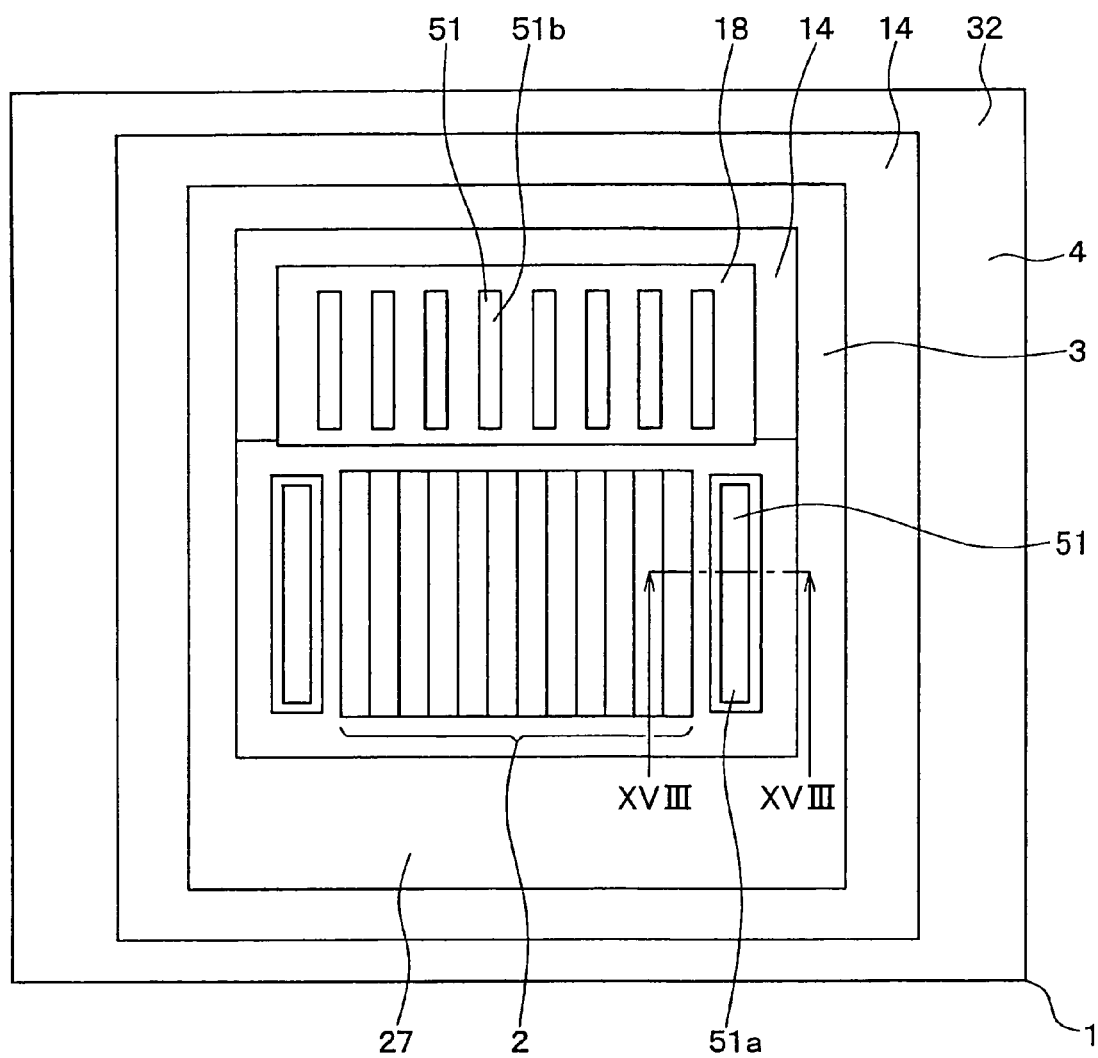
FIG. 17 is a plan view showing a silicon carbide semiconductor device according to a second embodiment of the present invention.
Figure 18:
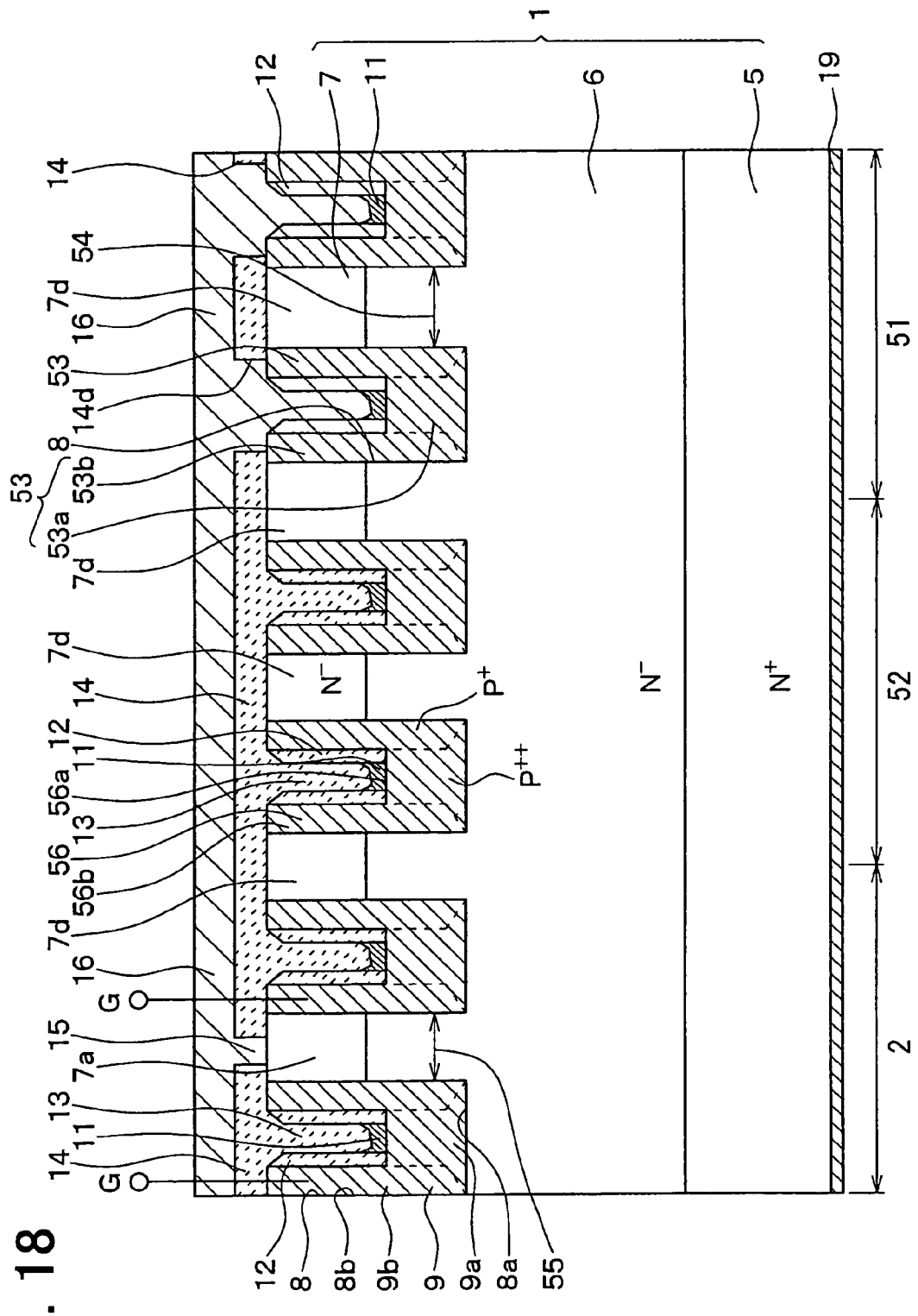
FIG. 18 is a cross sectional view showing the device taken along line XVIII-XVIII in FIG. 17.

FIG. 17 is a plan view for indicating a silicon carbide semiconductor device according to a second embodiment mode of the present invention. FIG. 18 is a cross sectional view for showing the silicon carbide semiconductor device, taken along a line XVIII-XVIII of FIG. 17.

A major different point of the semiconductor device according to this second embodiment mode from the semiconductor device of the first embodiment mode is given as follows: That is, as represent in FIG. 17 and FIG. 18, both a body diode portion 51 and a floating P type layer region 52 are provided between the cell portion 2 and the outer peripheral portion 4 with respect to the semiconductor device according to the first embodiment mode.

In this second embodiment mode, as shown in FIG. 17, the body diode portion 51 has been arranged between the cell portion 2 and the gate wiring portion 3. Precisely speaking, two sets of the body diode portions 51 have been arranged in a region 651a which is different from the cell portion 2 and a source electrode pad portion 18, and another region 651b under the source electrode pad portion 18.

In the body diode portion 51, the structure of the semiconductor substrate 1 is substantially same as that of the cell portion 2, and electric connections between the respective electrodes and the structural portions corresponding to the P type gate layer 9 and the source layer 7a of the cell portion 2 are different from those of the cell portion 2.

That is to say, as represented in FIG. 18, in the body diode portion 51, similar to the cell portion 2, a P type semiconductor layer 53 has been formed on the inner wall of each of the trenches 8 in the semiconductor substrate 1. Each of the trenches 8 has such a depth defined from a surface of an N$^+$ type semiconductor layer 7d up to the N$^-$ type drift layer 6. A body diode has been constituted by this P type semiconductor layer 53 and the N$^-$ type drift layer 6. In this second embodiment mode, the depth of each of the trenches 8 of the body diode portion 51 is equal to the depth of each of the trenches 8 of the cell portion 2, while these depths are measured from the surface of the semiconductor substrate 1. It should also be noted that each of the trenches 8 of the body diode portion 51 corresponds to a second trench of the present invention, and the P type semiconductor layer 53 corresponds to the second semiconductor layer.

The P type semiconductor layer 53 has been constituted by a P$^{++}$ type layer 53a and a P$^+$ type layer 53b. The P$^{++}$ type layer 53a has been formed on the bottom plane of each of the trenches 8. The P$^+$ type layer 53b has been formed on the side plane of each of the trenches 8. The P$^{++}$ type layer 53a owns the same structure as that of the bottom plane-sided P$^{++}$ type gate layer 9a of the cell portion 2, and the P$^+$ type layer 53b owns the same structure as that of the side plane-sided P$^+$ type gate layer 9b of the cell portion 2. Then, similar to the cell portion 2, both a gate wiring-purpose metal 11 and a side wall 12 have been formed on a surface of the P type semiconductor layer 53.

Although the shape of each of the trenches 8 of the body diode portion 51 is identical to the shape of each of the trenches 8 of the cell portion 2, an interval 54 of the adjoining trenches 8 in the body diode portion 51 is made wider than an interval 55 of the adjoining trenches 8 in the cell portion 2. In other words, the interval 54 of the adjoining P type semiconductor layers 53 is made wider than the interval 55 of the adjoining P type gate layers 9.

Also, the interlayer insulating film 14 and the source electrode 16 have been sequentially formed on the surface of the semiconductor substrate 1, and the P type semiconductor layer 53 has been electrically connected to the source electrode 16 via the contact hole 14d of the interlayer insulating film 14.

Also, the N$^+$ type semiconductor layer 7d of the body diode portion 51 is not connected to the source electrode 16, but is brought into a floating condition. This floating condition implies such a condition that the N$^+$ type semiconductor layer 7d is electrically isolated with respect to other electrodes.

As indicated in FIG. 18, the floating P type layer region 52 has been arranged between the cell portion 2 and the body diode portion 51. Also, in the floating P type layer region 52, a structure of the semiconductor substrate 1 is similar to that of the cell portion 2, and structural portions corresponding to the P type gate layer 9 and the source layer 7a of the cell portion 2 are brought into a floating condition.

In other words, in the floating P type layer region 52, while each of the trenches 8 has been formed in the semiconductor substrate 1 similar to the cell portion 2, a floating P type layer 56 has been formed on the surface of each of the trenches 8. In this second embodiment mode, a depth of each of the trenches 8 of the floating P type layer region 52 is made equal to a depth of each of the trenches 8 of the cell portion 2. These depths are defined from the surface of the semiconductor substrate 1. It should also be noted that each of the trenches 8 of the floating P type layer region 52 corresponds to a third trench, and the floating P type layer 56 corresponds to a third semiconductor layer.

The floating P type layer 56 is constituted by a P$^{++}$ type layer 56a and a P$^+$ type layer 56b. The P$^{++}$ type layer 56a has been formed on the bottom plane of each of the trenches 8. The P$^+$ type layer 56b has been formed on the side plane of each of the trenches 8. Both the P$^{++}$ type layer 53a and the P$^+$ type layer 53b own the same structures as those of the bottom plane-sided P$^{++}$ type gate layer 9a of the cell portion 2, and the side plane-sided P$^+$ type gate layer 9b thereof respectively.

Similar to the cell portion 2, both the gate wiring-purpose metal 11 and the side wall 12 have been formed on the surface of this floating P type layer 56, and the trenches 8 have been blocked by the embedded insulating film 13. Furthermore, the interlayer insulating film 14 has been formed on the surface of the semiconductor substrate 1.

Then, the floating P type layer 56 is not electrically connected to the P type gate layer 9 of the cell portion 2, namely, is not electrically connected to the gate electrode 21, but is brought into a floating condition. Also, the N$^+$ type semiconductor layer 7d of the surface layer of the semiconductor substrate 1 is not electrically connected to the source electrode 16, namely is brought into a floating condition.

A structure of the cell portion 2 is similar to that of the first embodiment mode. However, in this cell portion 2, even in such a region which is located adjacent to the floating P type layer region 52, the P type semiconductor layer 9 has been electrically connected to the gate electrode 21. This P type semiconductor layer 9 is located adjacent to the N$^+$ type semiconductor layer 7 which has been electrically connected to the source electrode 16. In other words, the P type gate layers 9 have been arranged on both sides of the source layer 7a. This semiconductor device structure is caused to be effectively operated as a transistor.

Although not shown in the drawings, a floating P type layer region has been arranged even between the body diode portion 51 and the gate wiring portion 3.

Next, a description is made of a method for manufacturing the semiconductor device of this second embodiment mode. In this example, such a case that both the body diode portion 51 and the floating P type layer region 52 are manufactured in the same manufacturing steps as those of the cell portion 2 will now be exemplified.

As will be explained later, the manufacturing steps of this second embodiment mode correspond to such steps formed by partially changing the manufacturing steps in the first embodiment mode. In the step shown in FIG. 4, a plurality of trenches 8 are formed in a region which is scheduled to form the cell portion 2, and at the same time, a plurality of trenches 8 are also formed in a region which is scheduled to form the body diode portion 51, and in a region which is scheduled to form the floating P type layer region 52. At this time, an interval between the adjoining trenches 8 in the region which is scheduled to form the body diode portion 51 is made wider than an interval between the adjoining trenches 8 in the region which is scheduled to form the cell portion 2. It should also be noted that the region which is scheduled to form the body diode portion 51 corresponds to a region which is different from the region for scheduling to form the cell portion 2.

In the step shown in FIG. 5, the P type gate layer 9 is formed in the region which is scheduled to form the cell portion 2, and at the same time, the P type semiconductor layer 53 having the same shape as that of the P type gate layer 9 is formed in the region which is scheduled to form the body diode portion 51, and also, the floating P type layer 56 having the same shape as that of the P type gate layer 9 is formed in the region which is scheduled to form the floating P type layer region 52.

Figure 13:
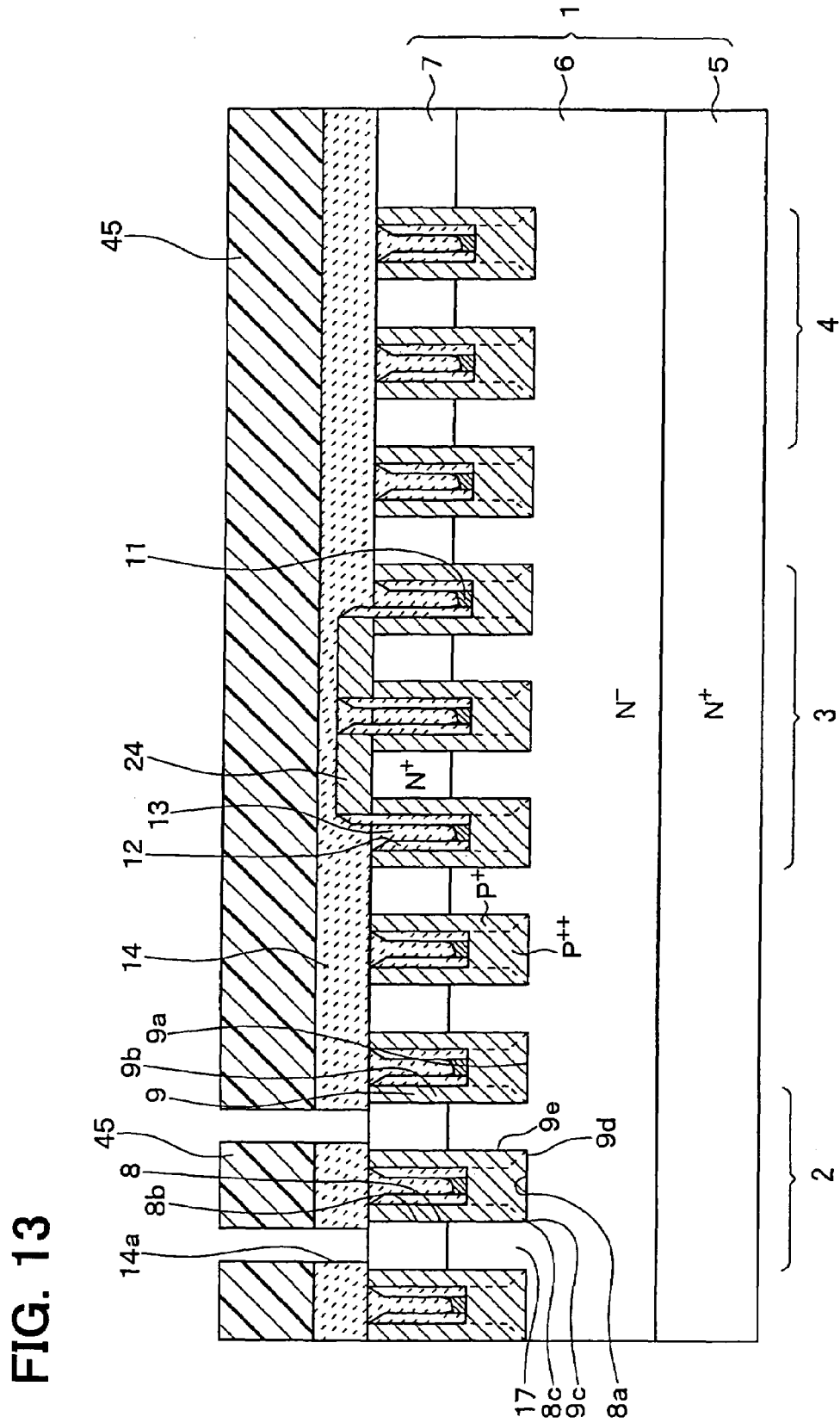
FIG. 13 is a cross sectional view explaining the manufacturing method of the device according to the first embodiment.

In the steps indicated in FIG. 11 to FIG. 13, the gate wiring-purpose metals 11 and 12, the embedded insulating film 13, and the interlayer insulating film 14 are manufactured in the regions which are scheduled to form the cell portion 2, the body diode portion 51, and the floating P type layer region 52.

Then, in the steps represented in FIG. 13 to FIG. 16, both the source electrode 16 and the gate electrode 21 are formed. Concretely speaking, in the steps indicated in FIG. 13 to FIG. 15, a contact hole 14d is formed in a portion positioned on the P type semiconductor layer 53 within the interlayer insulating film 14 in the region which is scheduled to form the body diode portion 51. At this time, none of contact hole is formed over the N$^+$ type semiconductor layer 7d and the floating P type layer 56 in the region which is scheduled to form the floating P type layer region 52, and over the N$^+$ type semiconductor layer 7d in the region which is scheduled to form the body diode portion 51 within the interlayer insulating film 14.

Figure 16:
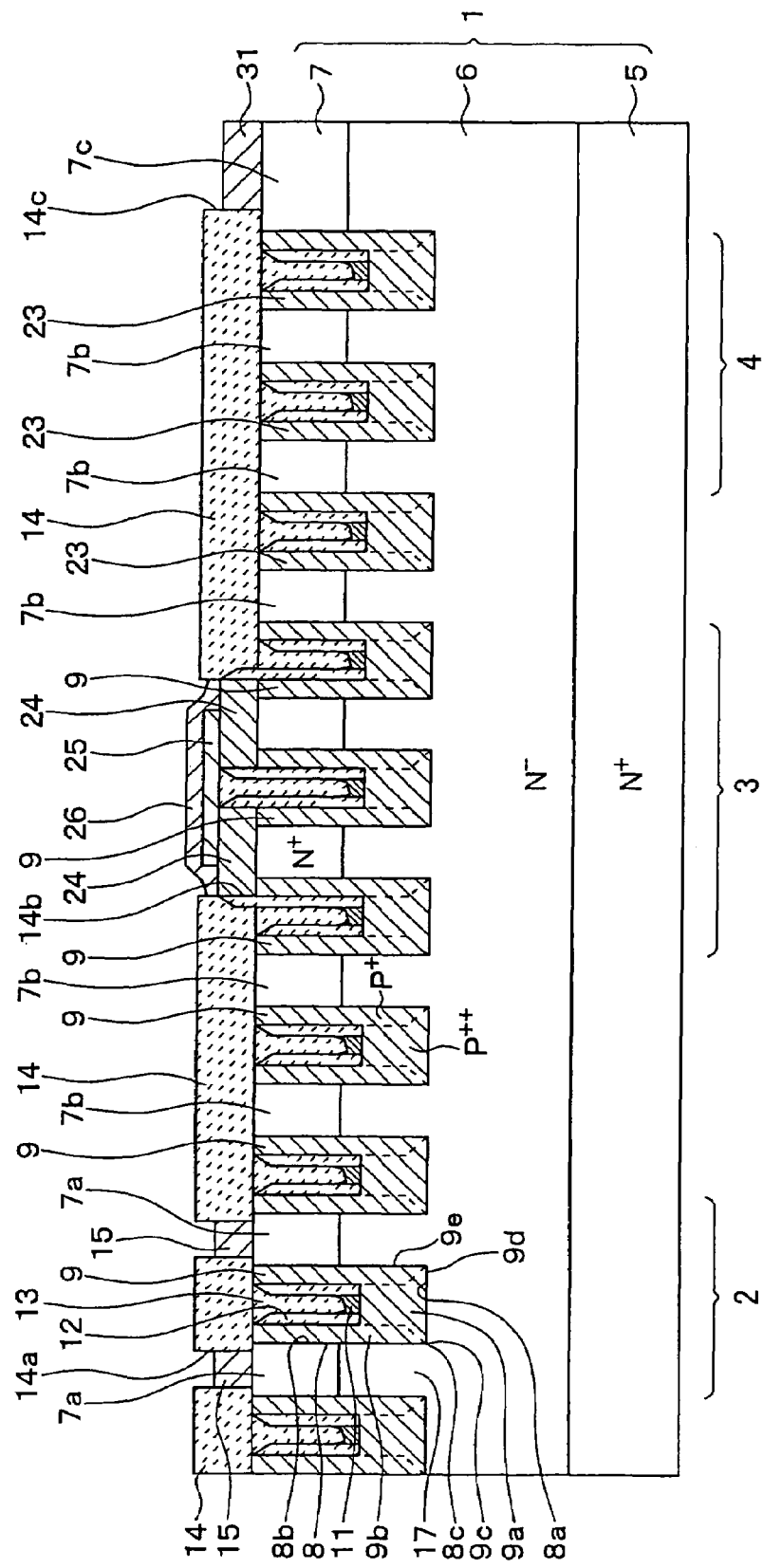
FIG. 16 is a cross sectional view explaining the manufacturing method of the device according to the first embodiment.

In the step shown in FIG. 16, since a metal film is formed on the surface of the interlayer insulating film 14, the source layer 7a is electrically connected to the P type semiconductor layer 53, and further, are electrically insulated from the N$^+$ type semiconductor layer 7d so as to form the source electrode 16. At the same time, the P type gate layer 9 is electrically connected to the P type semiconductor layer 53, and further, is electrically insulated from the floating P type layer 56 so as to form the gate electrode 21.

As explained above, in this second embodiment mode, the P type semiconductor layer 53 electrically connected to the source electrode 16 has been arranged between the cell portion 2 and the gate wiring portion 3. Then, the body diode is constituted by this P type semiconductor layer 53 and the N$^-$ type drift layer 6. Then, the interval 54 between the adjoining P type semiconductor layers 53 is made wider than the interval 55 between the adjoining P type gate layers 9 in the cell portion 2.

As a consequence, in the semiconductor device of this second embodiment mode, the electric fields are concentrated in the bottom plane corner portions of the P type semiconductor layers 53 in the body diode portion 51, as compared with the bottom plane corner portions of the P type gate layer 9 in the cell portion 2. Thus, the body diode portion 51 owns the lower withstanding voltage structure than that of the cell portion 2. Accordingly, in the case that surge energy such as back electromotive force is applied to the drain electrode 19, this surge energy can break down the body diode before the cell portion 2 is broken down.

As a consequence, in such a case that the surge energy is applied to the drain electrode 19, it is possible to avoid that the surge energy is concentrated to the gate electrode 21 of the cell portion 2, and also, it is possible to suppress destruction of a gate driving circuit, as compared with the conventional semiconductor device.

Also, in this second embodiment mode, the floating P type layer region 52 has been provided between the cell portion 2 and the body diode portion 51. Assuming now that this floating P type layer region 52 is not provided, a chip area of a silicon carbide semiconductor device can be decreased. However, in such a case that the cell portion 2 is located adjacent to the body diode portion 51, when a voltage is applied to the gate electrode 21, a depletion layer which is extended from the P type gate layer 9 of the cell portion 2 is connected to a depletion layer in a junction between the P type semiconductor layer 53 and the N⁻ type drift layer 6 of the body diode portion 51. As explained above, if a punchthrough happens to occur, then the gate electrode 21 is shortcircuited with the source electrode 16, and thus, a withstanding voltage is lowered.

To the contrary, in accordance with this second embodiment mode, since the floating P type layer 56 is arranged in the floating P type layer region 52, even when the voltage is applied to the gate electrode 21, the occurrence of the above-explained punchthrough can be prevented, and it is possible to avoid that the gate electrode 21 is shortcircuited with the source electrode 16. As a consequence, such a problem that the withstanding voltage is lowered as explained in such a case that the floating P type layer region 52 is not provided can be avoided. In other words, if the semiconductor structure of this second embodiment mode is employed, then the withstanding voltage can be maintained.

Also, in this second embodiment mode, the N⁺ type semiconductor layer 7d in the body diode 51 is brought into the floating condition. Assuming now that this N⁺ type semiconductor layer 7d is electrically connected to the source electrode 16 similar to the source layer 7a, a stray bipolar transistor which is constituted by the N⁺ type semiconductor layer 7d, the P type semiconductor layer 53, and the N⁻ type drift layer 6 is turned on. Thus, there is a risk that the cell portion 2 may be destroyed.

To the contrary, in accordance with this second embodiment mode, since the N⁺ type semiconductor layer 7d is brought into the floating condition, it is possible to avoid that the cell portion 2 is destroyed since the stray bipolar transistor is erroneously operated.

Also, in such a case that this N⁺ type semiconductor layer 7d is electrically connected to the source electrode 16 in the body diode portion 51, the flow of current between the source electrode 16 and the drain electrode 19 in the body diode portion 51 is carried out by pinching off the depletion layer between the respective P type semiconductor layers 53.

However, the interval 54 between the adjoining P type semiconductor layers 53 in the body diode portion 51 is made wider than the interval 55 between the adjoining P type gate layers 9. As a result, in such a case that the interval 54 between the adjoining P type semiconductor layers 53 and the interval 55 between the adjoining P type gate layers 9 are fluctuated due to the fluctuation occurred in the manufacturing steps, there are some possibilities that the depletion layer between the adjoining P type semiconductor layer 53 rather than the adjoining P type gate layer 9 cannot be connected. As previously explained, in the case that the depletion layer between the adjoining P type semiconductor layers 53 cannot be connected, a current may flow from the N⁺ type semiconductor layer 7d.

As a consequence, in this second embodiment mode, since the N⁺ type semiconductor layer 7d is brought into the floating condition, even when the interval between the adjoining P type semiconductor layers 53 and the like is fluctuated due to the fluctuation in the manufacturing steps, such a current leakage can be firmly prevented.

Also, in this second embodiment mode, since the cell portion 2 and the body diode portion 51 are formed in the same semiconductor substrate 1, namely within the same semiconductor chip, the manufacturing cost thereof can be reduced, as compared with that of such a case that the cell portion 2 and the body diode portion 51 are formed in separate semiconductor chips.

Also, in this second embodiment mode, the cell portion 2, the body diode portion 51, and the floating P type layer 652 are manufactured in the same manufacturing step, the manufacturing steps can be simplified, as compared with that of such a manufacturing method that the cell portion 2, the body diode portion 51, and the floating P type layer 652 are manufactured in the separate manufacturing steps.

It should also be understood that although such an example that the body diode portion 51 is arranged between the cell portion 2 and the gate wiring portion 3 has been exemplified in this second embodiment mode, the present invention is not limited only to this exemplification. The body diode portion 51 can be alternatively arranged in any other regions if these regions are located between the cell portion 2 and the outer peripheral portion 4. For instance, the body diode portion 51 can be alternatively arranged between the gate wiring portion 3 and the outer peripheral portion 4.

It should also be noted that although such an example that both the body diode portion 51 and the floating P type layer region 52 are formed at the same time when the cell portion 2 is formed in this second embodiment mode, the present invention is not limited only to this exemplification. Alternatively, both the body diode portion 51 and the floating P type layer region 52 can be formed in a manufacturing step other than the step for manufacturing the cell portion 2.

That is, the trenches 8 of the cell portion 2, and the body diode potion 51 and the trenches 8 of the floating P type layer region 52 can be respectively formed with a separate manufacturing step. Also, the P type gate layer 9, and the body diode portion 51, the P type semiconductor layers 53 of the floating P type layer region 52 and the floating P type layer 56 can be respective formed with the separate manufacturing step.

Third Embodiment

Figure 19:
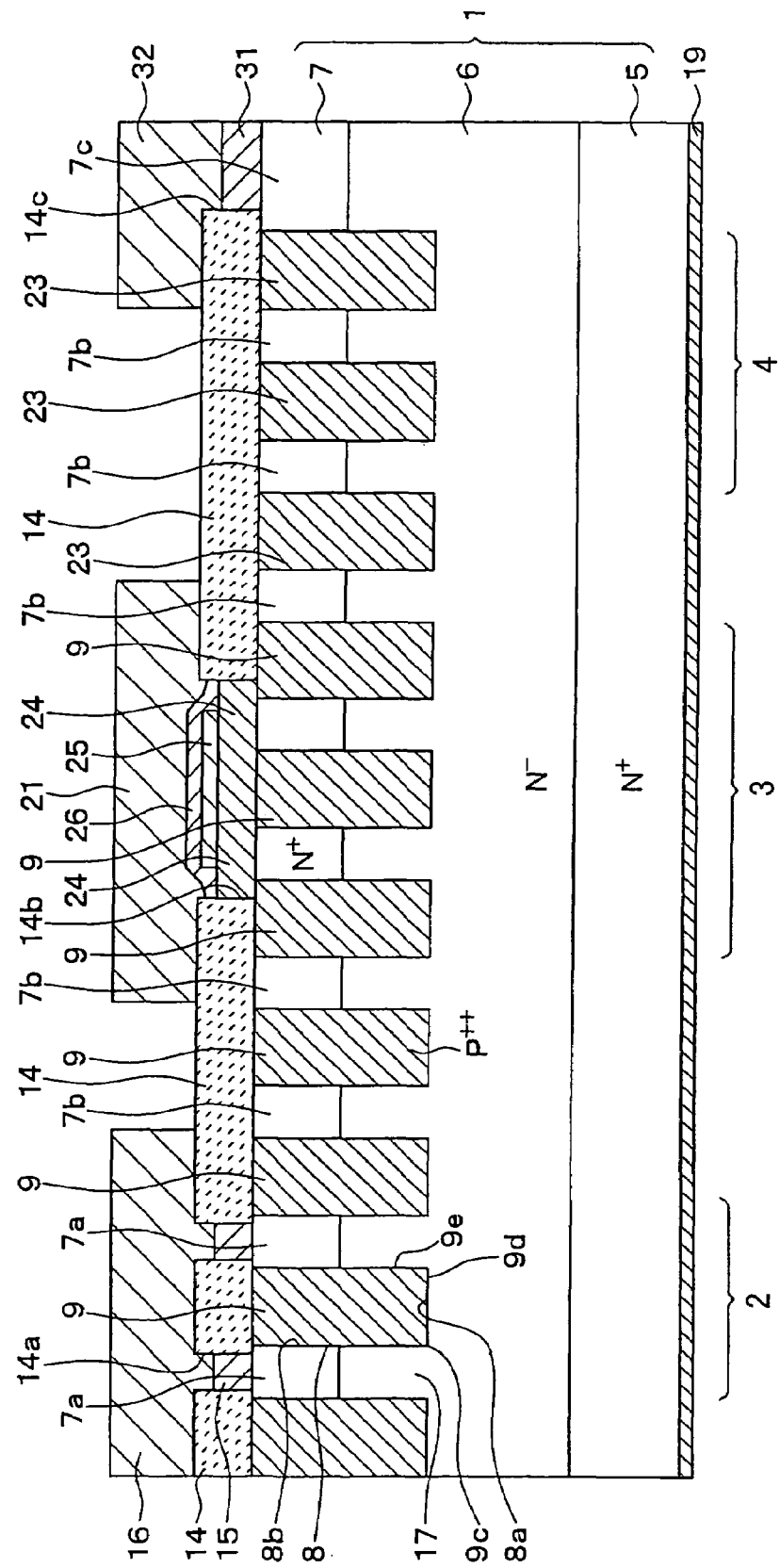
FIG. 19 is a cross sectional view showing a silicon carbide semiconductor device according to a third embodiment of the present invention.

FIG. 19 is a sectional view for indicating a silicon carbide semiconductor device according to a third embodiment mode of the present invention. In the first and second embodiment modes, the description has been made of such a case that the P type gate layer 9 having the U-shaped form has been formed in the cell portion 2. Alternatively, P type gate layers 9 can be formed by completely embedding P type semiconductor layers inside trenches 8. In other words, the shapes of the P type gate layers 9 can be alternatively made in such same shapes as the portions which have been removed by forming the trenches 8 in the semiconductor substrate 1 when the trenches 8 are formed in the semiconductor substrate 1.

Next, a method for manufacturing this silicon carbide semiconductor device will now be described. The manufacturing steps of the first embodiment mode are modified as follows: That is, in the step shown in FIG. 5, a P type semiconductor layer 41 formed on the surface of the semiconductor substrate 1 until the inner portions of the trenches 8 are completely blocked by the P type semiconductor layer 41. It should be understood that the forming steps shown in FIG. 10 and FIG. 11 are not required. Thus, the silicon carbide semiconductor device having the structure shown in FIG. 19 is manufactured in the above-explained manufacturing manner.

In this third embodiment mode, the P type gate layers 9 own such a structure that the interior portions of the trenches 8 are completely embedded by the P type semiconductor layer 41. As a consequence, a volume of each of the P type gate layers 9 becomes larger than the volume of each of the P type gate layers 9 in the first and second embodiment modes. As a result, in accordance with this third embodiment mode, an input resistance of the gate can be lowered, as compared with that of the first and second embodiment modes.

(Modifications)

In the above-described respective embodiment modes, the silicon carbide semiconductor devices equipped with the JFETs have been described in which such an N type impurity layer referred to as the N⁻ type channel layer 17 constitutes the channel. Alternatively, the present invention can be applied to such a silicon carbide semiconductor device equipped with a JFET, in which conductivity types as to respective structural elements of this silicon carbide semiconductor device are inverted with respect to the conductivity types of the above-explained silicon carbide semiconductor devices, and a P type impurity layer constitutes a channel thereof.

Also, in the above-described embodiment modes, the normally-off type JFETs have been exemplified. The present invention can be applied not only to such a normally-off type JFET, but also may be applied to a normally-on type JFET.

Fourth Embodiment

Figure 32:
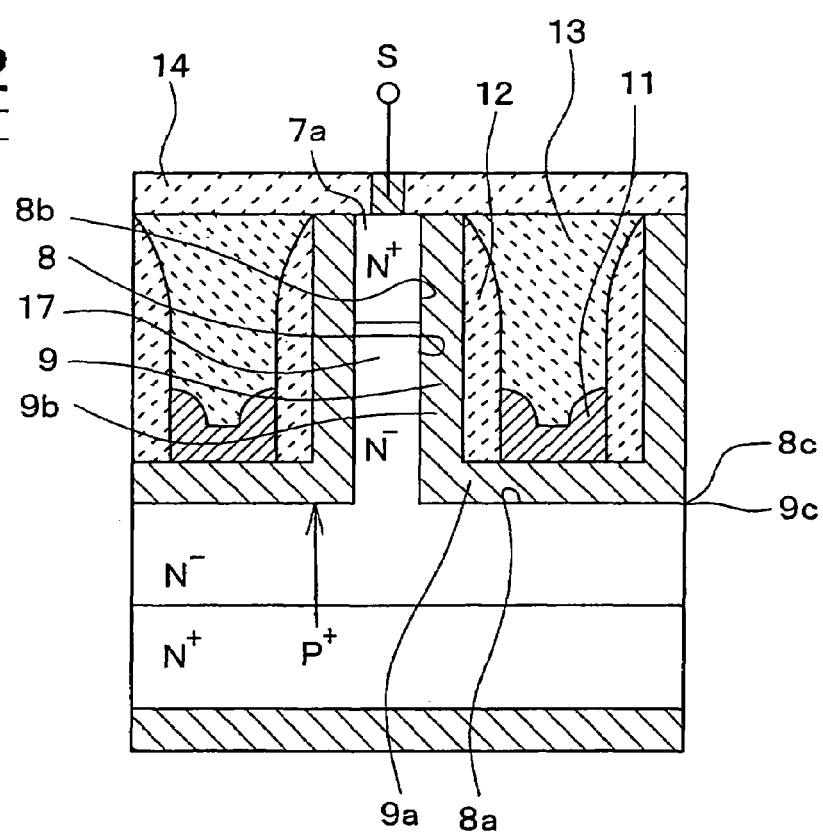
FIG. 32 is a cross sectional view showing a silicon carbide semiconductor device according to a comparison of the fourth embodiment of the present invention.

The inventors have considered a silicon carbide semiconductor device capable of solving the following problem. In a case that a voltage is applied to a semiconductor device, since electric field concentration occurs, there is such a problem that the withstanding voltage between a gate and a drain becomes low. The inventors have conceived such a silicon carbide semiconductor device shown in FIG. 32. FIG. 32 represents a silicon carbide semiconductor device equipped with a vertical JFET having a trench, which has been conceived by the inventors.

In FIG. 32, there is shown a cell portion of the silicon carbide semiconductor device. In this silicon carbide semiconductor device, a plurality of trenches 8 have been formed on a semiconductor substrate 1, while these trenches 8 have been separated from each other. A depth of each of the trenches 8 is started from a surface of a source layer 7a and is reached to an N⁻ type drift layer 6. Then, a P type gate layer 9 having a shape fitted to inner walls 8a and 8b of each of the trenches 8 has been formed on the inner walls 8a and 8b thereof by way of an epitaxial growth method. Also, a gate wiring-purpose metal 11, a side wall 12, and an embedded insulating layer 13 have been formed in an interior portion of each of the trenches 8. Both an interlayer insulating film 14 and a source electrode (not shown) have been sequentially formed on a surface of the semiconductor substrate 1.

As previously explained, in the silicon carbide semiconductor device shown in FIG. 32, since the P type gate layer 9 has been formed by way of the epitaxial growth method, the film thickness of the P type gate layer 9 has been made thick, as compared with that of the P type gate layer 9 which has been formed by the ion implantation. As a result, in this silicon carbide semiconductor device, the input resistance of the gate is low, as compared with that of the silicon carbide semiconductor device described in the above-mentioned non-patent publication 1.

Also, in the silicon carbide semiconductor device shown in FIG. 32, the P type gate layer 9 has been formed on the inner wall of each of the trenches 8 by way of the epitaxial growth method. As a consequence, a contour of the P type gate layer 9 owns such a shape fitted to the inner wall plane of each of the trenches 8, and thus, there is no such the above-explained stepped portion between the P⁺ type body layer J5 and the P⁺ type gate layer J6 in this P type gate layer 9.

As a result, in this silicon carbide semiconductor device, a withstanding voltage between the gate and the drain becomes high, as compared with that of the silicon carbide semiconductor device described in the above-explained non-patent publication 1.

On the other hand, also in the silicon carbide semiconductor device equipped with the above-described structure, it is conceivable that a guard ring is provided in the outer peripheral portion so as to improve the withstanding voltage of this silicon carbide semiconductor device. As this withstanding voltage improving method, it is conceivable that a method for diffusing an impurity may be employed as described in the above-explained patent publication 1.

However, in a silicon carbide semiconductor substrate, a diffusion of an impurity can hardly occur, as compared with that of a silicon semiconductor substrate. As a consequence, in accordance with the method for diffusing the impurity, it is practically difficult to form a guard ring in such a manner that a depth of this guard ring becomes the same depth as the P type gate layer 9 formed in the cell portion, or becomes deeper than this depth of the P type gate layer 9.

Figure 21:
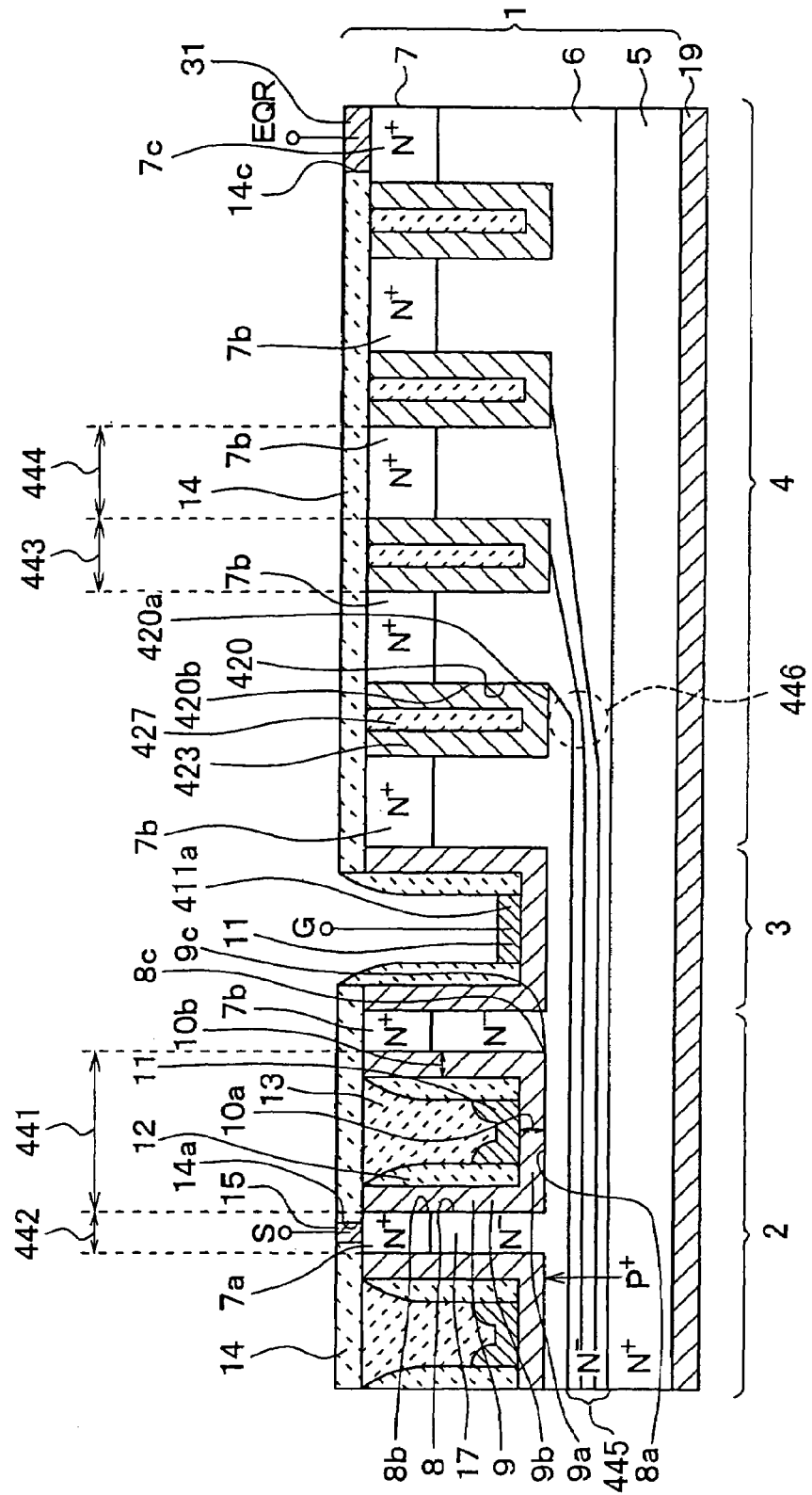
FIG. 21 is a cross sectional view showing a silicon carbide semiconductor device according to a first example of a fourth embodiment of the present invention.

In view of the above study, a silicon carbide semiconductor device as a first example according to a fourth embodiment mode of the present invention is provided, as shown in FIG. 21. Also, in FIG. 21, an equipotential distribution 445 is additionally represented. As indicated in FIG. 21, while the silicon carbide semiconductor device of this embodiment mode is provided with a semiconductor substrate 1, a cell portion 2 and an outer peripheral portion 4 have been formed in the semiconductor substrate 1. The outer peripheral portion 4 is located on the outer peripheral side of this semiconductor substrate 1. It should be understood that a structure of the cell portion 2 is identical to the structure of the silicon carbide semiconductor device shown in FIG. 32.

In the semiconductor substrate 1, an N⁻ type drift layer 6 and an N⁺ type semiconductor layer 7 functioning as a first semiconductor layer have been sequentially formed on a major surface of an N⁺ type substrate 5. In this embodiment mode, a first conductivity type is defined as an N type, and a second conductivity type is defined as a P type. The N⁺ type substrate 5, the N⁻ type drift layer 6, and the N⁺ type semiconductor layer 7 have been manufactured by silicon carbide. Also, a drain electrode 19 has been formed on the side of a rear plane of the N⁺ type substrate 5.

The cell portion 2 corresponds to a region which is operated as a transistor within the semiconductor substrate 1, which constitutes a JFET (junction field-effect transistor). In the cell portion 2, the N⁺ type substrate 5 constitutes a drain layer, and the N⁺ type semiconductor layer 7 constitutes a source layer 7a.

In the cell portion 2, a plurality of trenches 8 have been formed in the semiconductor substrate 1 in such a manner that these plural trenches 8 have been separated form each other. A depth of each of the trenches 8 is started from a surface of the source layer 7a and is reached to the N⁻ type drift layer 6. This trench 8 corresponds to a first trench. As represented in FIG. 21, in a sectional plane along a thickness direction of the semiconductor substrate 1, a width 441 of each of the trenches 8 is, for example, on the order of 0.5 to 1.5 µm, and an interval 442 of the adjoining trenches 8 is, for instance, on the order of 0.5 to 1.5 µm.

In this trench 8, a bottom plane 8a is located parallel to the surface of the semiconductor substrate 1, and a side plane 8b thereof has been vertically located with respect to the bottom plane 8a. In other words, a bottom plane corner portion 8c of the trench 8 has been made at a right angle. It should be understood that while such a shape defined by both the bottom plane 8a and the side plane 8b can be merely made in a substantially rectangular shape, the bottom plane corner portion 8c of the trench 8 may be alternatively rounded. In this case, the above-described "substantially rectangular shape" implies not only such a shape whose corners are made in right angles, but also a shape whose corners are rounded.

Then, in the cell portion 2, a P type gate layer 9 made of silicon carbide has been formed on an inner wall of each of the trenches 8. While the P type gate layer 9 has been manufactured by an epitaxial growth method, the P type gate layer 9 has such a shape which is fitted to the inner walls 8a and 8b of each of the trenches 8. In other words, the P type gate layer 9 owns a U-shaped form. Then, a contour which is defined by both a bottom plane and a side plane of the P type gate layer 9 owns a substantially rectangular shape which is similar to the sectional shape of each of the trenches 8. The P type gate layer 9 has been constituted by a bottom plane-sided gate layer 9a in a portion formed on a bottom plane 8a of the trenches 8, and a side plane-sided gate layer 9b in a portion formed on the side plane of the trenches 8.

As previously explained, since the P type gate layer 9 of this embodiment mode has been formed by way of the epitaxial growth method, a thickness 10a and another thickness 10b of the P type gate layer 9 are made thick, as compared with the thickness J5a of the P⁺ type body layer J5 and the thickness J6b of the P⁺ type gate layer J6 of the conventional silicon carbide semiconductor device explained in the above-described conventional art.

Also, in the above-described conventional method for forming the gate layer by the ion implantation, when the ions are implanted, defects are produced and are left. As a result, all of the ions which have been implanted cannot be replaced by either Si or C at the lattice positions of silicon carbide. To the contrary, in accordance with the epitaxial growth method, while a defect is not produced, all of the impurities can be replaced by either Si or C at the lattice positions of silicon carbide. As a consequence, the carrier concentration of the P type gate layer 9 of this first embodiment mode can be increased, as compared with that of the conventional silicon carbide semiconductor device.

As apparent from the above-described manufacturing methods, in accordance with the silicon carbide semiconductor device of this embodiment mode, an input resistance of a gate becomes low, as compared with that of the conventional silicon carbide semiconductor device.

Also, the shape of the P type gate layer 9 of this embodiment mode has been made to be fitted to the inner walls 8a and 8b of each of the trenches 8. As a result, there is no such a stepped portion between the P⁺ type body layer J5 and the P⁺ type gate layer J6, which has been explained above.

As a consequence, the electric field concentration which has occurred in the stepped portion between the P⁺ type body layer J5 and the P⁺ type gate layer J6 in the conventional silicon carbide semiconductor device can be suppressed. As a result, in the silicon carbide semiconductor device of this embodiment mode, the withstanding voltage between the gate and the drain becomes higher than that of the conventional silicon carbide semiconductor device.

A gate wiring-purpose metal 11 has been formed on a surface of the bottom plane-sided gate layer 9a inside each of the trenches 8 in the cell portion 2. The gate wiring-purpose metal 11 has been electrically connected to a gate electrode 21 (not shown), and this gate wiring-purpose metal 11 has been connected to the bottom plane-sided gate layer 9a. The gate wiring-purpose metal 11 is manufactured by, for example, Ti (titanium).

Furthermore, a side wall 12 has been formed within each of the trenches 8 in the cell portion 2. The side wall 12 is made of an insulating film, and has been formed only on the side plane-sided gate layer 9b. In addition, an embedded insulating film 13 has been formed on both the side wall 12 and the gate wiring-purpose metal 11. In other words, each of the trenches 8 is completely blocked by both the side wall 12 and the embedded insulating film 13. The side wall 12 and the embedded insulating film 13 are constituted by, for example, a silicon oxide film.

As previously explained, in this embodiment mode, the P type gate layer 9 has been made in a U-shaped form, and both the side wall 12 and the embedded insulating film 13 have been formed in the interior portion of each of the trenches 8.

In this case, an input capacitance of the gate is determined based upon a thickness of an interlayer insulating film 14 which is located on the upper side of each of the trenches 8 as viewed in the drawing. It is desirable that the input capacitance of the gate is low. To this end, the thickness of the interlayer insulating film 14 is required to become thick. As a consequence, in accordance with this embodiment mode, the thickness of the interlayer insulating film 14 can be essentially made thick, and thus, the input capacitance of the gate can be reduced, as compared with such a case that the P type gate layer 9 has been formed by completely blocking the trenches 8 by the P type semiconductor layer 41.

In the cell portion 2, an interlayer insulating film 14 and a source electrode (not shown) have been sequentially formed on the surface of the semiconductor substrate 1. Then, the source electrode has been electrically connected to the source layer 7a via an ohmic electrode 15 which has been formed in a contact hole 14a of the interlayer insulating film 14. Concretely speaking, the interlayer insulating film 14 has been formed by a silicon oxide film, the ohmic electrode 15 has been formed by Ni, and the source electrode 16 has been formed by Al.

The outer peripheral portion 4 has been arranged on the semiconductor substrate 1 in such a manner that the cell portion 2 is surrounded by this outer peripheral portion 4. The outer peripheral portion 4 corresponds to such a region for holding a withstanding voltage. A guard ring has been formed on the outer peripheral portion 4. Concretely speaking, in the outer peripheral portion 4, a plurality of trenches 420 have been formed in the semiconductor substrate 1, while a depth of each of the trenches 420 is equal to the depth of each of the trench 8 formed in the cell portion 2. A P type guard ring layer 423 made of silicon carbide has been formed on an inner wall of each of the trenches 420. The trench 420 corresponds to a second trench.

In the silicon carbide semiconductor device shown in FIG. 21, in the sectional plane along the thickness direction of the semiconductor substrate 1, a width 443 of each of the trenches 420 is made narrower than the width 441 of each of the trenches 8 in the cell portion 2, and an interval 444 between the adjoining trenches 420 is made wider than the interval 442 between the adjoining trenches 8. All of the intervals 444 between the adjoining trenches 420 are equal to each other. Alternatively, the width 443 of each of the trenches 420 may be made wider than the width 441 of each of the trenches 8. Concretely speaking, the width 443 of each of the trenches 420 may be selected to be, for example, approximately 1 to 10 μm, and the interval 444 between the adjoining trenches 420 may be selected to be, for instance, approximately 2 to 3 μm.

While the P type guard ring layer 423 has been formed by way of the epitaxial growth method, this P type guard ring layer 423 has been formed in such a shape which is fitted to the inner walls 420a and 420b of each of the trenches 420. In other words, the P type guard ring layer 423 has been shaped in a U-shaped form. Also, this P type guard ring layer 423 is not electrically connected to the source electrode and the gate electrode, but is electrically isolated with respect to these source and gate electrodes.

While an embedded insulating film 427 has been formed on the P type guard ring layer 423, each of the trenches 420 has been completely blocked by this embedded insulating film 427 and the P type guard ring layer 423.

Also, among a plurality of $N^+$ type semiconductor layers 7 which have been separated from each other by the plural trenches 420 located in the outer peripheral portion 4, an $N^+$ type semiconductor layer 7c located in the outermost peripheral position has been electrically connected via an Ni electrode 31 to a metal electrode (not shown). This $N^+$ type semiconductor layer 7c may function as an equipotential ring. Then, a plurality of $N^+$ type semiconductor layers 7b located on the side of the cell portion 2 rather than the $N^+$ type semiconductor layer 7c among the plural $N^+$ type semiconductor layers 7 located in the outer peripheral portion 4 have been electrically isolated.

Also, a gate wiring portion 3 has been formed between the cell portion 2 and the outer peripheral portion 4 in the semiconductor substrate 1. The gate wiring portion 3 corresponds to such a region that a gate electrode (not shown) has been formed. A structure of the semiconductor substrate 1 in the gate wiring portion 3 is similar to the structure of the cell portion 2, namely, one piece of trench 8 has been formed in this semiconductor substrate 1. Then, a P type gate layer 9 has been formed in an interior portion of each of the trenches 8. This P type gate layer 9 has been electrically connected the P type gate layer 9 of the cell portion 2. Furthermore, similar to the cell portion 2, a side wall 12 has been formed on the side of a side plane 8b of each of the trenches 8 over the P type gate layer 9, and also, a gate wiring-purpose metal 411a connected to the P type gate layer 9 has been formed on the side of a bottom plane 8a of this trench 8 over the P type gate layer 9. This gate wiring-purpose metal 1a has been electrically connected to the gate electrode.

In the silicon carbide semiconductor device which has been manufactured with the above-explained structure, the cell portion 2 is operated in, for example, a normally-off mode (will be explained later). Such a portion which is located on the lower side of the source layer 7a and is positioned between the adjoining P type gate layers 9 within the $N^-$ type drift layer 6 corresponds to a channel region 17. Then, in the case that a voltage is not applied to the adjoining P type gate layers 9, the channel region 17 is pinched off by depletion layers which are extended from both the adjoining P type gate layers 9. As a result, no current flows between the source and the drain. Then, in the case that a voltage is applied between the adjoining P type gate layers 9, since the extended amounts of the depletion layers which are extended to the channel region 17 are reduced, a current flows between the source and the drain.

Next, a description is made of a method for manufacturing this silicon carbide semiconductor device with reference to FIG. 21.

First, a step for preparing a semiconductor substrate 1 is carried out. That is, both an $N^-$ type drift layer 6 and an $N^+$ type semiconductor layer 7 are sequentially formed on a surface of an $N^+$ type substrate 5 by way of the epitaxial growth method.

Subsequently, a step for forming a trench 8 of the cell portion 2 and a plurality of trenches 420 of the outer peripheral portion 4 is carried out. In this step, the plurality of trenches 8 which are mutually separated from each other are formed in a region which is scheduled to form a cell portion 2 of the semiconductor substrate 1, and in another region which is scheduled to form a gate wiring portion 3 by way of a photolithography and an etching process. At this time, a depth of each of the trenches 8 is made equal to such a depth which is started from the surface of the $N^+$ type semiconductor layer 7 and is reached to the $N^-$ type drift layer 6.

Also, at the same time, in this step, a plurality of trenches 420 which are mutually separated from each other are formed in a region which is scheduled to form the outer peripheral portion 4 of the semiconductor substrate 1. At this time, a depth of each of the trenches 420 defined from the surface of the semiconductor substrate 1 is made equal to a depth of each of the trenches 8. It should be understood that since both the trenches 8 and the trenches 420 are formed at the same time by employing the same mask in this step, the depths of these trenches 420 can be easily made equal to those of the trenches 8.

Subsequently, a step for forming both a P type gate layer 9 and a P type guard ring layer 423 is carried out. In this step, a P type semiconductor layer made of silicon carbide is formed by way of an epitaxial growth method from an inner wall of each of the trenches 8 and an inner wall of each of the trenches 420 up to the surface of the semiconductor substrate 1. At this time, interior portions of the respective trenches 8 and 420 are not completely embedded by this P type semiconductor layer.

As a result, the P type gate layers 9 having the shapes fitted to the inner walls of the trenches 8 are formed in the region which is scheduled to form the cell portion 2 and the region which is scheduled to form the gate wiring portion 3. Also, at the same time, the P type guard ring layers 423 having the shapes fitted to the inner walls of the trenches 420 are formed in the region which is scheduled to form the outer peripheral portion 4.

Next, a step for forming both a side wall 12 of the cell portion 2 and an embedded insulating film 427 of the outer peripheral portion 4 is carried out. In this step, for instance, a silicon oxide film is formed on the surface of the semiconductor substrate 1, and then, this formed silicon oxide film is etched back. The surface of the semiconductor substrate 1 contains both the interior portions of the trenches 8 in the region which is scheduled to form the cell portion 2 and the interior portions of the trenches 420 in the region which is scheduled to form the outer peripheral portion 4. At this time, as indicated in FIG. 21, in the case that the width 443 of each of the trenches 420 formed in the region which is scheduled to form the outer peripheral portion 4 owns such a dimension that the side wall 12 cannot be formed, the silicon oxide films formed on the side planes 420b of each of the trenches 420 are connected to each other, while these side planes 420b are located opposite to each other. As a result, the interior portions of the trenches 420 are completely embedded by the silicon oxide films.

The side wall 12 is formed inside each of the trenches 8 in the region which is scheduled to form the cell portion 2, and at the same time, the embedded insulating film 427 is formed inside each of the trenches 420 in the region which is scheduled to form the outer peripheral portion 4.

Subsequently, a step for forming a gate wiring-purpose metal film 11 of the cell portion 2 and the gate wiring portion 3 is carried out. In this step, both a Ti (titanium) film and a photoresist are sequentially formed on the surface of the semiconductor substrate 1 which contains the interior portion of each of the trenches 8, and are etched back, so that a photoresist is left only inside each of the trenches 8. Next, while the photoresist is employed as a mask, the Ti film is etched. As a result, a gate wiring-purpose metal film 11 is formed inside each of the trenches 8. Thereafter, the photoresists which have been left inside the trenches 8 are removed.

Subsequently, a step for forming an interlayer insulating film 14 is carried out. A silicon oxide film is formed on the surface of the semiconductor substrate 1 which contains the interior portions of the trenches 8, and then, the formed silicon oxide film is etched back so as to be flattened, and further, a silicon oxide film is formed. As a result, an embedded silicon oxide film 13 is formed in each of the trenches 8, and further, an interlayer insulating film 14 is formed on the surface of the semiconductor substrate 1.

Subsequently, a step for forming a gate electrode, a source electrode, and a metal electrode used for an equipotential ring is carried out. In this step, a contact hole 14a is formed in the interlayer insulating film 14 in the region which is scheduled to form the cell portion 2 by way of a photolithography and a dry etching process. Also, a contact hole 14c is formed in such a portion located on the upper side of an N⁺ type semiconductor layer 7 located at the outermost peripheral position of the region which is scheduled to form the outer peripheral portion 4 among the N⁺ type semiconductor layers 7 which have been separated by the trenches 420 within the interlayer insulating film 14 in the region which is scheduled to form this outer peripheral portion 4.

Then, Ni (nickel) is vapor-deposited on the surface of the interlayer insulating film 14 containing the inner portions of the contact holes 14a and 14c, and then, the vapor-deposited Ni is treated by both a photolithography and an etching process, or a lift off method. Thereafter, the treated Ni is processed by a sintering process operation. As a result, an ohmic electrode 15 and an ohmic electrode 31 are formed inside the contact holes 14a and 14c respectively.

Thereafter, an Al metal film is formed on the surface of the interlayer insulating film 14, and then, the formed Al metal film is patterned. As a consequence, a source electrode wiring pattern which has been electrically connected to the N⁺ type semiconductor layer 7a is formed in the region which is scheduled to form the cell portion 2. Also, a gate electrode which has been electrically connected to the P type gate layer 9 is formed in the region which is scheduled to form the gate wiring portion 3. Also, a metal electrode which has been electrically connected via the contact hole 14c to the N⁺ type semiconductor layer 7c located at the outermost peripheral position is formed in the region which is scheduled to form the outer peripheral portion 4.

Also, a step for forming a drain electrode 19 is carried out. In this step, Ni is also formed as a film on the side of a rear plane of the N⁺ type substrate 5. As a result, the drain electrode 19 may be formed on the rear plane side of the N⁺ type substrate 5. Since the above-described manufacturing steps have been carried out, the silicon carbide semiconductor device having the semiconductor structure as indicated in FIG. 21 can be accomplished.

As previously explained, in accordance with this embodiment mode, after the trenches 420 have been formed in the region which is scheduled to form the outer peripheral portion 4 of the semiconductor substrate 1, the P type guard ring layers 423 are formed on the inner walls of the trenches 420 by way of the epitaxial growth method. The depths of the trenches 420 are equal to the depths of the trenches 8 of the cell portion 2.

As a consequence, even in such a case that the silicon carbide semiconductor substrate is employed in which the diffusion of the impurity can hardly occur, as compared with that of the silicon semiconductor substrate, the P type guard ring layers 423 having the same depths as those of the P type gate layers 9 of the cell portion 2 can be formed in the outer peripheral portion 4.

Also, in accordance with this embodiment mode, the trenches 8 of the cell portion 2 have been formed, and at the same time, the trenches 420 of the outer peripheral portion 4 have been formed. Then, the P type gate layers 9 have been formed on the inner walls of the trenches 8, and at the same time, the P type guard ring layers 423 have been formed on the inner walls of the trenches 420.

In this case, while both the trenches 8 and the P type gate layers 9 are formed in the cell portion 2, and also, both the trenches 420 and the P type guard ring layers 423 are formed in the outer peripheral portion 4, the formation of the trenches 8 and the formation of the trenches 420 can be alternatively carried out in separate forming steps, and the formation of the P type gate layers 9 and the formation of the P type guard ring layers 423 can be alternatively carried out in separate forming steps.

However, as explained in this embodiment mode, since the step for forming the trenches 8 and the step for forming the trenches 420 are carried out in a single manufacturing step, and also, the step for forming the P type gate layers 9 and the step for forming the P type guard ring layers 423 are carried out in a single manufacturing step, the manufacturing steps can be reduced, as compared with such a case that the respective forming steps are separately carried out. Also, since the trenches 8 of the cell portion 2 and the trenches 420 of the outer peripheral portion 4 are formed at the same time, the P type guard ring layers 423 can be readily formed in the outer peripheral portion 4 of the semiconductor substrate 1. The depths of the P type guard ring layers 423 are substantially equal to the depths of the P type gate layers 9 which are defined from the surface of the semiconductor substrate 1 in the cell portion 2.

As a result, when surge energy is applied to the drain electrode 19 in the semiconductor device of this embodiment mode, the depletion layers are extended from the P type guard ring layers 423, and the electric field applied to the cell portion 2 can be extended to the outer peripheral portion 4 without any unbalance. That is, in this case, as apparent from the equipotential distribution 445 shown in FIG. 21, equipotential lines are extended to the P type guard ring layers 423 of the outer peripheral portion 4.

As a result, the electric field concentration can be relaxed which is produced at the edge portion of the cell portion 2 in the case that none of these P type guard ring layers 423 is present. As a consequence, the withstanding voltage of the cell portion 2 can become high, as compared with that of such a case that the P type guard ring layers 423 are not formed.

Also, in this embodiment mode, in the step for forming both the source electrode and the metal electrode for the equipotential ring, the contact hole 14a has been formed in the interlayer insulating film 14 in the region which is scheduled to form the cell portion 2. Also, in this forming step, the contact hole 14c has been formed in the portion of the interlayer insulating film 14. This portion is located on the upper side of the N+ type semiconductor layer 7 located at the outermost peripheral position of the region which is scheduled to form the outer peripheral portion 4 among a plurality of the N+ type semiconductor layers 7 which have been divided by the trenches 420 in the interlayer insulating film 14 within this region which is scheduled to form the outer peripheral portion 4.

Then, after the Ni electrodes 15 and 31 have been formed in the contact holes 14a and 14c, the Al metal film is formed on the surface of the interlayer insulating film 14 and this formed Al metal film is patterned. As previously explained, the source electrode wiring pattern which has been electrically connected to the N+ type semiconductor layer 7a in formed in the region which is scheduled to form the cell portion 2. Also, the metal electrode has been formed in the region which is scheduled to form the outer peripheral portion 4, while this metal electrode has been electrically connected via the contact hole 14c to the N+ type semiconductor layer 7c which is located at the outermost peripheral position.

As previously explained, the N+ type semiconductor layer 7c which is located at the outermost peripheral position of the outer peripheral portion 4 is employed as the equipotential ring. In other words, the equipotential ring has been formed at the same time when the cell portion 2 is formed. As a result, the manufacturing steps can be reduced, as compared with that of such a case that the equipotential ring is formed in the semiconductor substrate 1 in the forming step which is different from the step for forming the cell portion 2.

Figure 22:
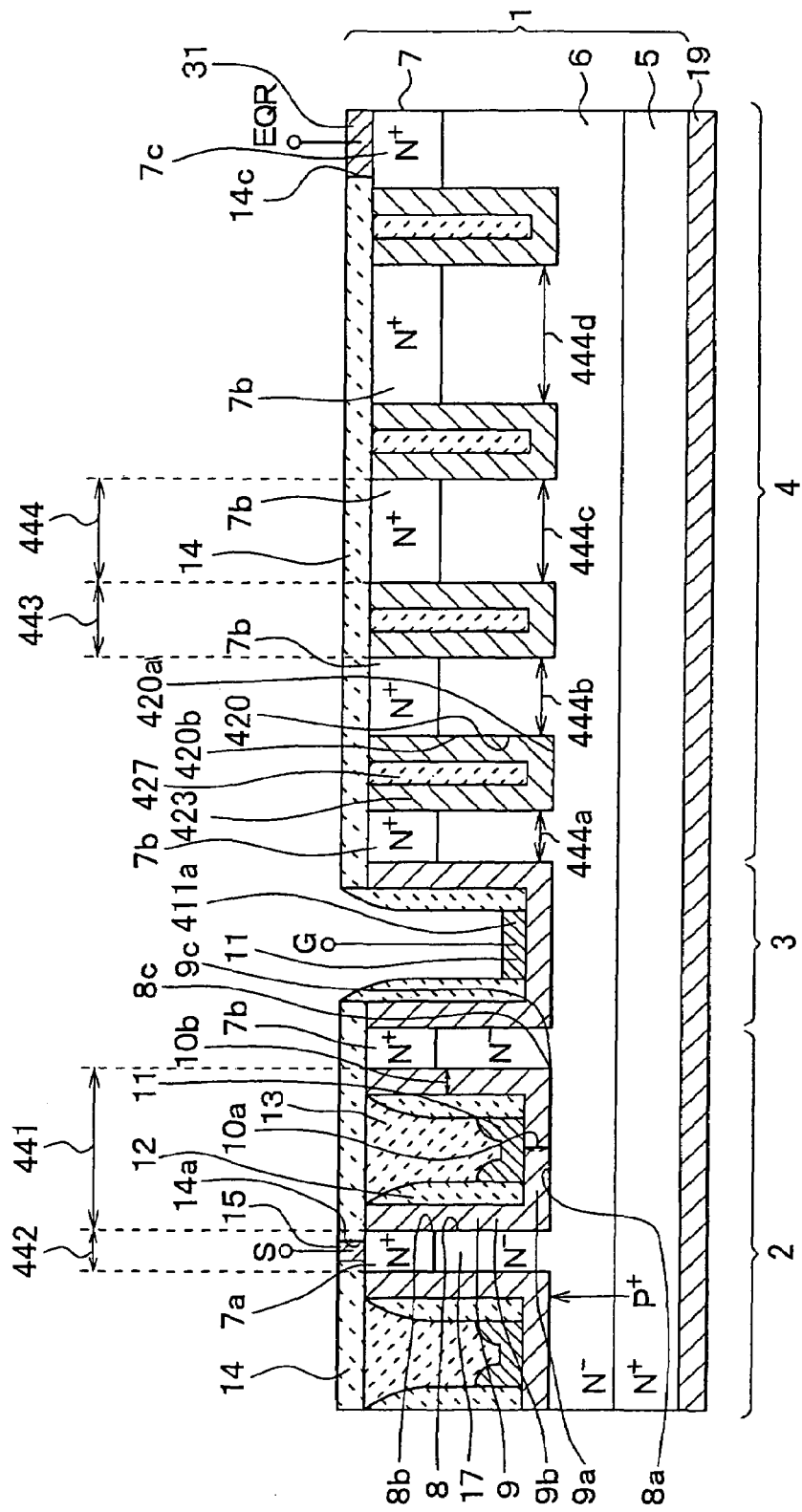
FIG. 22 is a cross sectional view showing a silicon carbide semiconductor device according to a second example of the fourth embodiment of the present invention.
Figure 23:
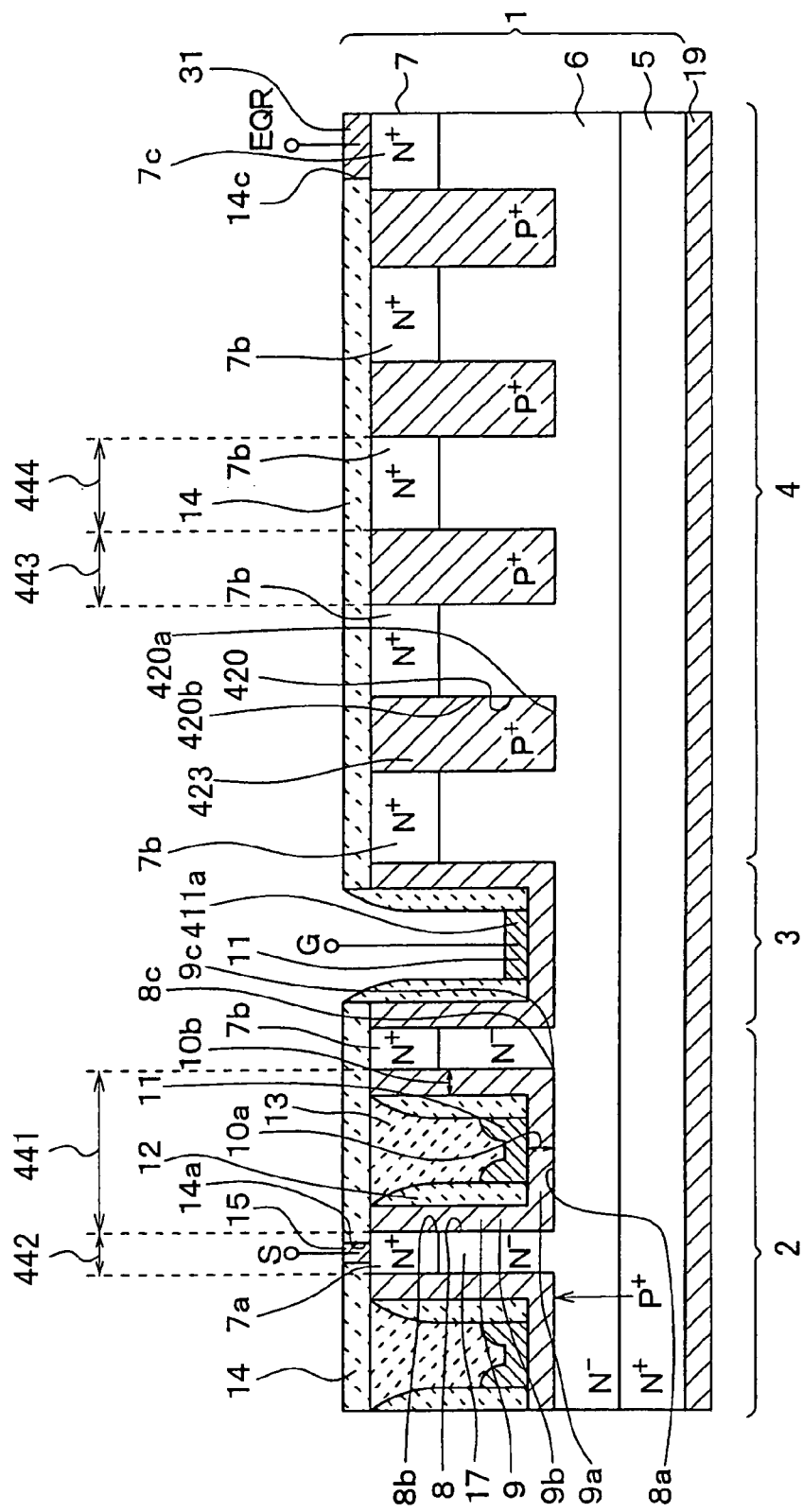
FIG. 23 is a cross sectional view showing a silicon carbide semiconductor device according to a third example of the fourth embodiment of the present invention.

FIG. 22 and FIG. 23 indicate silicon carbide semiconductor devices as a second example and a third example in this embodiment mode. It should be understood that structures of outer peripheral portions 4 of the silicon carbide semiconductor devices represented in FIG. 22 and FIG. 23 are different from the structure of the outer peripheral portion 4 provided in the silicon carbide semiconductor device shown in FIG. 21, and the same reference numerals of the silicon carbide semiconductor device shown in FIG. 21 will be employed a those for denoting similar structural portions of the silicon carbide semiconductor devices indicated in FIG. 22 and FIG. 23.

In the silicon carbide semiconductor device of FIG. 21, the description has been made of such a case that all of the intervals 444 between the adjoining trenches 420 in the outer peripheral portion 4 are equal to each other. Alternatively, as shown in FIG. 22, intervals 444a, 444b, 444c, and, 444d of the trenches 420 may be gradually increased in accordance with separated distances thereof from the cell portion 2.

In the semiconductor device shown in FIG. 22, ratios of dimensions as to the intervals 444a, 444b, 444c, 444d between the adjoining trenches 420 become sequentially arithmetic series from the side of the cell portion 2. For instance, the ratios of the dimensions as to the intervals 444 of the respective trenches 420 are defined as follows: That is, the interval 444a: the interval 444b: the interval 444c: the interval $444c = 10:12:14:16$.

In the silicon carbide semiconductor device shown in FIG. 21, as apparent from the equipotential distribution 445 represented in FIG. 21, the electric field concentration occurs in a broken line area 446 which is shown under such a P type guard ring layer 423 which is located at the nearest position with respect to the cell portion 2.

As a consequence, as shown in the semiconductor device of FIG. 22, since the intervals 444a, 444b, 444c, and, 444d of the trenches 420 are gradually increased in accordance with separated distances thereof from the cell portion 2, the electric field concentration occurred in the broken line area 446 in the outer peripheral portion 4 can be relaxed, so that the withstanding voltage of the outer peripheral portion 4 can be increased.

In the silicon carbide semiconductor device of FIG. 21, the description has been made of such a case that the shapes of the P type guard ring layers 423 in the outer peripheral portion 4 have been fitted to the shapes of the inner walls of the trenches 420. As indicated in FIG. 23, the shapes of the P type guard ring layers 423 may be alternatively made of such shapes that the trenches 420 are completely embedded only by P type semiconductor layers.

In this alternative case, the thicknesses of the P type semiconductor layers which are formed on the inner walls of the trenches 8 and the trenches 420 are increased, or the width 443 of the trench 420 is decreased with respect to the above-described manufacturing steps.

Fifth Embodiment

Figure 24:
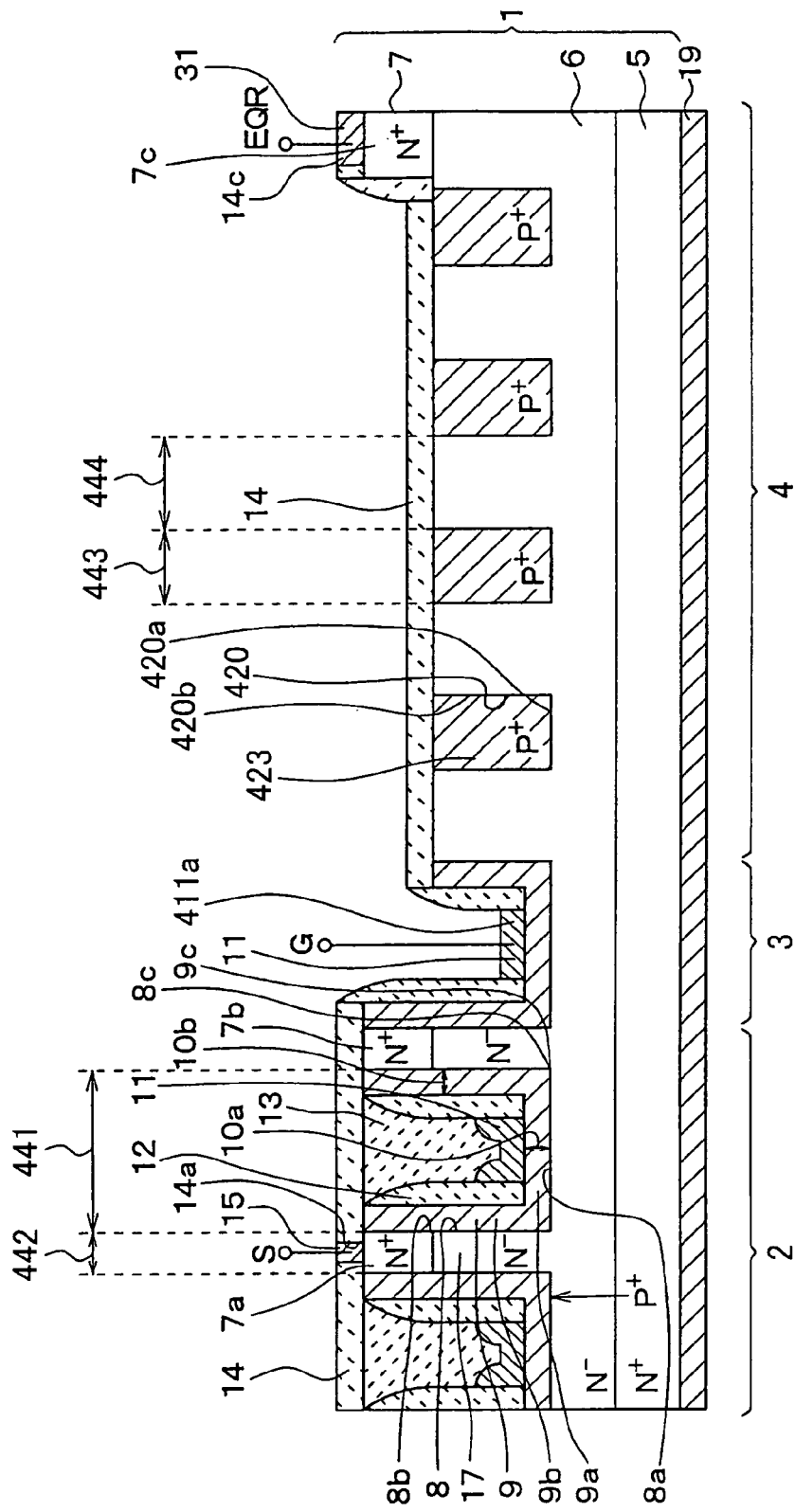
FIG. 24 is a cross sectional view showing a silicon carbide semiconductor device according to a fifth embodiment of the present invention.

FIG. 24 is a sectional view for indicating a silicon carbide semiconductor device according to a fifth embodiment mode of the present invention. It should be noted that the same reference numerals shown in FIG. 23 will be employed as those for denoting similar structural portions of the silicon carbide semiconductor device indicated in FIG. 24.

The silicon carbide semiconductor device shown in FIG. 24 owns the following structure. That is, while the N+ type semiconductor layer 7c located at the outermost peripheral portion among the plural N+ type semiconductor layers 7 separated by the trenches 420 is left, a plurality of the N+ type semiconductor layers 7b are completely removed with respect to the silicon carbide semiconductor device shown in FIG. 23.

This semiconductor device may be manufactured by changing the step for forming the P type guard ring layers 423, and by adding a step for removing the N+ type semiconductor layers 7b between the step for forming the P type guard ring layers 423 and the step for forming the interlayer insulating film 14 with respect to the manufacturing steps of the semiconductor device as explained in the embodiment mode.

Concretely speaking, in the step for forming the P type guard ring layers 423, the trenches 420 are completely embedded only by the P type semiconductor layer so as to form the P type guard ring layers 423.

Thereafter, the N⁺ type semiconductor layers 7b among the N⁺ type semiconductor layers 7 are completely removed by way of a photolithography and an etching process in the region which is scheduled to form the outer peripheral portion 4 of the semiconductor substrate 1. However, such an N⁺ type semiconductor layer 7c located at the outermost peripheral position is left.

Subsequently, similar to the first embodiment mode, a step for forming the gate wiring-purpose metal film 11 of the cell portion 2 and the gate wiring portion 3 is carried out, and a step for forming the interlayer insulating film 14 is carried out.

In this embodiment mode, as previously explained, an etching process is carried out with respect to the region which is scheduled to form the outer peripheral portion 2 in the semiconductor substrate 1 between the step for forming the P type guard ring layers 423 and the step for forming the interlayer insulating film 14. As a result, the N⁺ type semiconductor layers 7b among the plural N⁺ type semiconductor layers 7 separated by the trenches 420 are removed.

In this case, the N⁺ type semiconductor layers 7 have been formed in such a manner that impurity concentration thereof becomes higher than that of the N⁻ type drift layer 6. Generally speaking, in the case that impurity concentration of one semiconductor layer is higher than impurity concentration of the other semiconductor layer within semiconductor layers which constitute a PN junction, it is known that a breakdown voltage of the first-mentioned semiconductor layer is lower than a breakdown voltage of the other semiconductor layer.

As a result, in such a case that the N⁺ type semiconductor layers 7b are present in the outer peripheral portion 4 as explained in the semiconductor device of the fourth embodiment mode, when surge energy is applied to the drain electrode 19, there is such a risk that a breakdown occurs in the PN junction between the N⁺ type semiconductor layer 7b and the P type guard ring layer 423 prior to the PN junction between the N⁻ type drift layer 6 and the P type guard ring layer 423.

As a consequence, as described in this embodiment mode, since the structure of the silicon carbide semiconductor device is manufactured by removing the N⁺ type semiconductor layers 7b in the semiconductor device of FIG. 23, the withstanding voltage in the outer peripheral portion 4 can be improved, as compared with such a semiconductor device as shown in FIG. 23, in which the N type semiconductor layers 7b are present in the outer peripheral portion 4.

Sixth Embodiment

Figure 25:
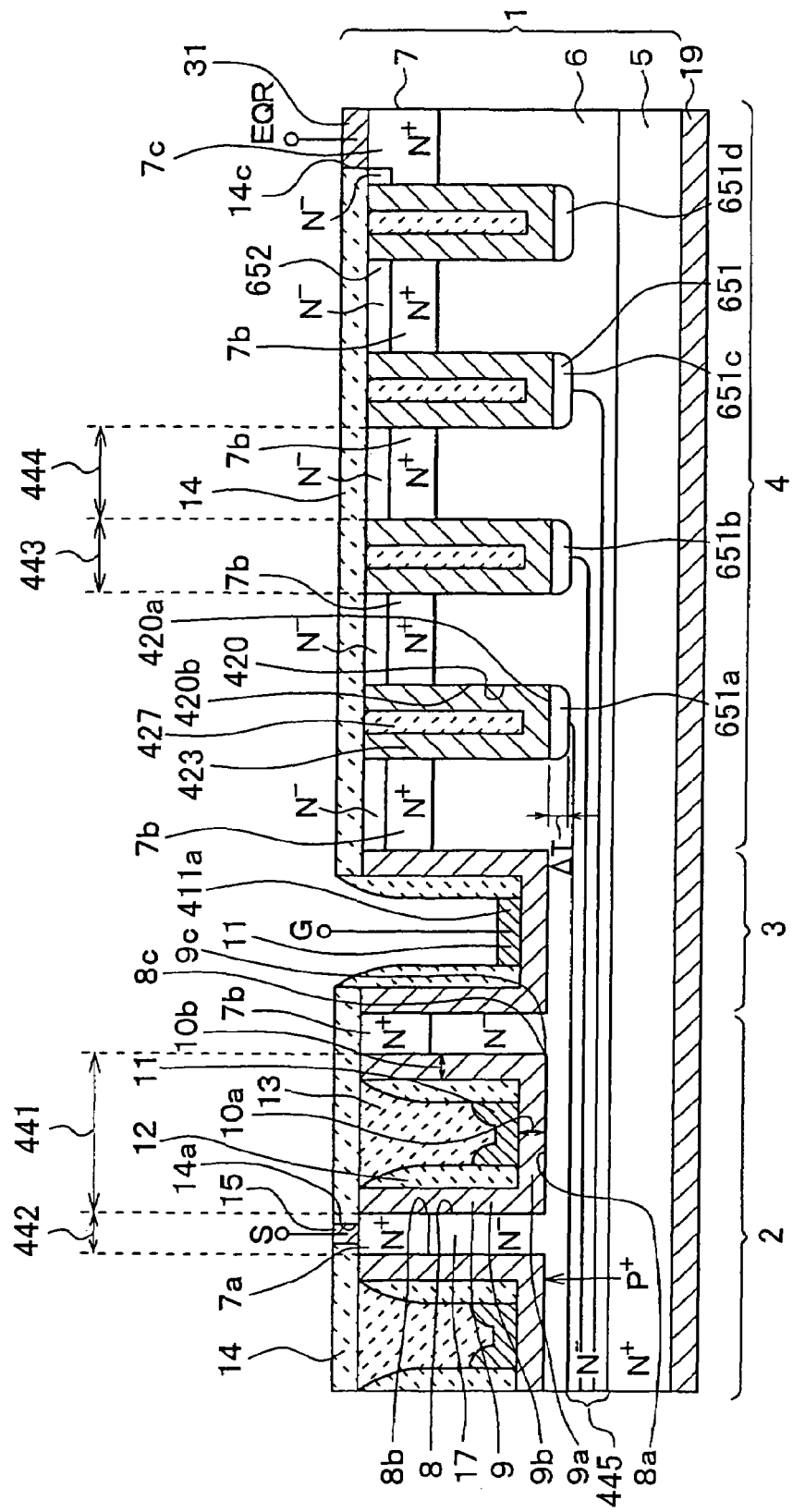
FIG. 25 is a cross sectional view showing a silicon carbide semiconductor device according to a first example of a sixth embodiment of the present invention.

FIG. 25 is a sectional view for indicating a silicon carbide semiconductor device according to a first example of a sixth embodiment mode of the present invention. Also, an equipotential distribution 445 is shown in FIG. 25 in addition thereto. The same reference numerals shown in FIG. 21 will be employed as those for indicating similar structural portions of the silicon carbide semiconductor device indicated in FIG. 25.

The silicon carbide semiconductor device shown in FIG. 25 owns a different structure from that of the silicon carbide semiconductor device indicated in FIG. 21. That is, in the outer peripheral portion 4, P type semiconductor regions 651, 651a, 651b, 651c, and, 651d connected to P type guard ring layers 423 are provided under all of the P type guard ring layers 423. This P type semiconductor region 651 corresponds to a third semiconductor region.

In this silicon carbide semiconductor device, since the P type semiconductor region 651 is provided in the outer peripheral portion 4, such P type semiconductor regions are provided in the outer peripheral portion 4. The depths of the P type semiconductor regions defined from the surface of the semiconductor substrate 1 are deeper than the depth of the P type gate layer 9 of the cell portion 2 by such a difference "ΔT" between a bottom plane of the P type semiconductor region 651 and a bottom plane of the P type gate layer 9 along the thickness direction of the semiconductor substrate 1. Also, this silicon carbide semiconductor device is equipped with the N⁻ type semiconductor layers 652 on the N⁺ type semiconductor layer 7b, in the outer peripheral portion 4.

This silicon carbide semiconductor device is manufactured by additionally providing a step for forming the P type semiconductor region 651 between the step for forming the trenches 420 of the outer peripheral portion 4 and the step for forming the P type guard ring layers 423 with respect to the manufacturing steps which have been explained in the embodiment mode.

Concretely speaking, similar to the fourth embodiment mode, in the step for forming the trenches 420, the trenches 420 are formed in the region which is scheduled to form the outer peripheral portion 4 of the semiconductor substrate 1. Thereafter, in this embodiment mode, in the step for forming the P type semiconductor region 651, such a mask is formed by way of a photography in which a region corresponding to the region which is scheduled to form the outer peripheral portion 4 has been opened. This mask covers the region which is scheduled to form the cell portion 2. While this mask is employed, ion implantation using a P type impurity such as Al (aluminum) is carried out with respect to the region which is scheduled to form the outer peripheral portion 4.

As a result, in the region which is scheduled to form the outer peripheral portion 4, the P type semiconductor regions 651a, 651b, 651c, and, 651d connected to the bottom planes of the trenches 420 are formed in a region which is located lower than the bottom planes of all of the trenches 420. Also, since ion implantation is also carried out with respect to a surface layer of the N⁺ type semiconductor layers 7b, this surface layer of the N⁺ type semiconductor layers 7b constitutes an N⁻ type semiconductor layer 652. It should be noted that even when the N⁻ type semiconductor layer 652 is formed on the surface layer of the N⁺ type semiconductor layers 7b, no adverse influence is given to the characteristic of the element.

Thereafter, similar to the fourth embodiment mode, the step for forming the P type guard ring layers 423 is executed.

As previously explained, in the silicon carbide semiconductor device of this third embodiment mode, both the P type guard ring layers 423, and the P type semiconductor region 651 arranged under the P type guard ring layers 423 are provided in the outer peripheral portion 4.

In this case, in the silicon carbide semiconductor device indicated in FIG. 21, when surge energy is applied to the drain electrode 19, a potential difference between the semiconductor substrate 1 and the P type guard ring layer 423 is decreased in connection with distances separated from the cell portion 2 within the outer peripheral portion 4. As a consequence, an extended amount of a depletion layer from the P type guard ring layer 423 within the outer peripheral portion 4 is decreased in connection with distances thereof separated from the cell portion 2. As a result, as apparent from the equipotential distribution 445 shown in FIG. 21, electric field concentration occurs in a broken line region 446 within the outer peripheral portion 4. This broken line region 446 is shown under the P type guard ring layer 423 which is located at the nearest position from the cell portion 2.

In this case, in this embodiment mode, after the trenches 420 have been formed in the region which is scheduled to form the outer peripheral portion 4, the ion implantation is carried out with respect to the bottom planes of all of the trenches 420, and the P type semiconductor region 651 is formed in the region which is contacted to the bottom plane of the trench 420 in the N⁻ type drift layer 6. Since the ion implantation is carried out with respect to the bottom planes of the trenches 420 as explained above, even in such a case that the trenches 420 in the region which is scheduled to form the outer peripheral portion 4 are formed in the same depths as those of the trenches 8 in the region which is scheduled to form the cell portion 2, a depth of a guard ring can be essentially made deeper than the depth of the gate layer 9 in the cell portion 2.

As previously explained, in this embodiment mode, the depth of the guard ring is deeper than the depth of the gate layer 9 in the cell portion 2. As a consequence, in the case that surge energy is applied to the drain electrode 19, the depletion layer which is extended from the P type guard ring in the outer peripheral portion 4 can be widened along the depth direction of the semiconductor substrate 1, as compared with that of the silicon carbide semiconductor device which has been explained in the fourth embodiment mode and shown in FIG. 21. As a result, as apparent from the equipotential distribution 445 represented in FIG. 25, the electric field concentration occurred in the outer peripheral portion 4 of the silicon carbide semiconductor device of FIG. 21 can be relaxed.

As a result, in accordance with this embodiment mode, as similarly explained in the silicon carbide semiconductor device of FIG. 21, the withstanding voltage of the silicon carbide semiconductor device can be increased, as compared with such a silicon carbide semiconductor device that the depth of the gate layer 9 is equal to the depth of the guard ring.

In view of the higher withstanding voltage of the silicon carbide semiconductor device, it is desirable that the depth of the guard ring becomes deep in connection with the distances thereof separated from the cell portion 2. In other words, it is desirable to control the depth of the guard ring in such a manner that a tip portion of the depletion layer which is extended from the P type guard ring layer 423 along the thickness direction of the semiconductor substrate 1 becomes a straight line with respect to a tip portion of the depletion layer which is extended from the gate layer 9 of the cell portion 2 along the thickness direction of the semiconductor substrate 1.

However, if the depths of the guard rings are made different from each other, then the respective guard rings must be separately formed. As a result, the manufacturing steps thereof are largely increased, as compared with the manufacturing steps explained in the fourth embodiment mode, which cannot be practically employed. Under such a circumstance, in this embodiment mode, in order to suppress the increase of the manufacturing steps, a single ion implanting step is additionally employed, so that the depths of the guard rings are made deeper than the depth of the gate layer 9 in the cell portion 2.

Figure 26:
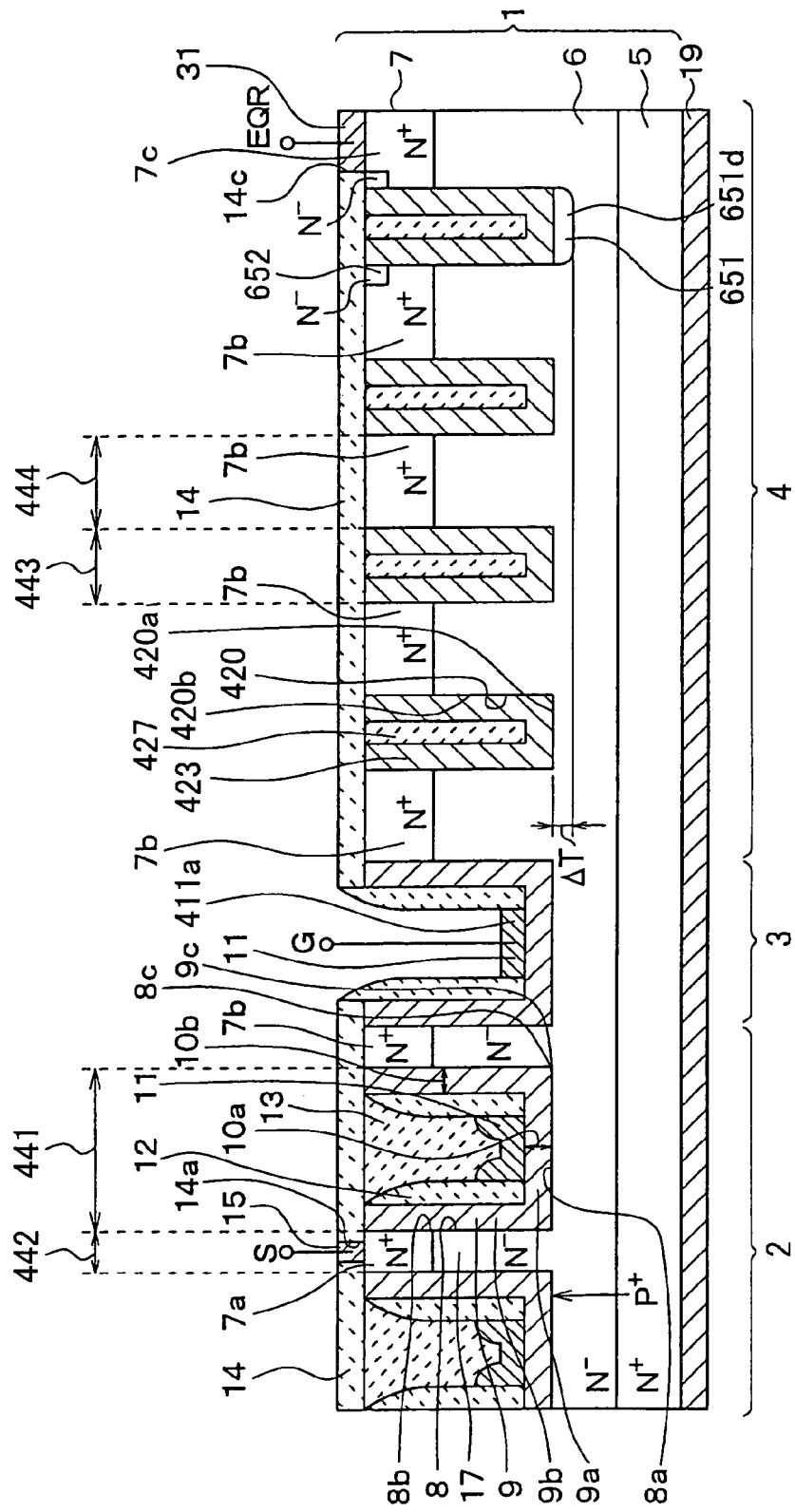
FIG. 26 is a cross sectional view showing a silicon carbide semiconductor device according to a second example of the sixth embodiment of the present invention.

FIG. 26 is a sectional view for showing a silicon carbide semiconductor device according to a second example of the sixth embodiment mode. It should also be noted that the same reference numerals shown in FIG. 21 will be employed as those for denoting similar structural portions of the silicon carbide semiconductor device represented in FIG. 26. In the first example, such an example has been exemplified. That is, the ions have been implanted with respect to all of the trenches 420 of the outer peripheral portion 4, and the P type semiconductor devices 51 have been formed under all of the trenches 420. As indicated in FIG. 26, the P type semiconductor region 651 can be alternatively formed under not all of the trenches 420, but a portion of these trenches 420.

The silicon carbide semiconductor device shown in FIG. 26 owns only such a P type semiconductor region 651*d* under the trench 420 located at the outermost peripheral position among the P type semiconductor regions 651*a*, 651*b*, 651*c*, 651*d* formed in the silicon carbide semiconductor device shown in FIG. 25, and thus, has such a structure not having these P type semiconductor regions 651*a*, 651*b*, 651*c*.

Although not shown in the drawing, a silicon carbide semiconductor device can alternatively own such a structure that this semiconductor device has the P type semiconductor regions 651*c* and 651*d* under the trenches 420 which are located at the outermost peripheral position and the adjoining position thereof among the P type semiconductor regions 651*a*, 651*b*, 651*c*, 651*d* employed in the silicon carbide semiconductor layer shown in FIG. 25, but does not have the P type semiconductor regions 651*a*, and 651*b*. Furthermore, a silicon carbide semiconductor device may alternatively own such a structure that this semiconductor device has the P type semiconductor regions 651*b*, 651*c*, and, 651*d* under the trenches 420 which are located at the outermost peripheral position and the two adjoining positions thereof among the P type semiconductor regions 651*a*, 651*b*, 651*c*, 651*d* employed in the silicon carbide semiconductor layer shown in FIG. 25, but does not have the P type semiconductor region 651*a*.

Even when the structure of the silicon carbide semiconductor device is modified as these structures, the withstanding voltages of the silicon carbide semiconductor deices can be increased, as compared with the silicon carbide semiconductor device shown in FIG. 21.

Seventh Embodiment

Figure 27:
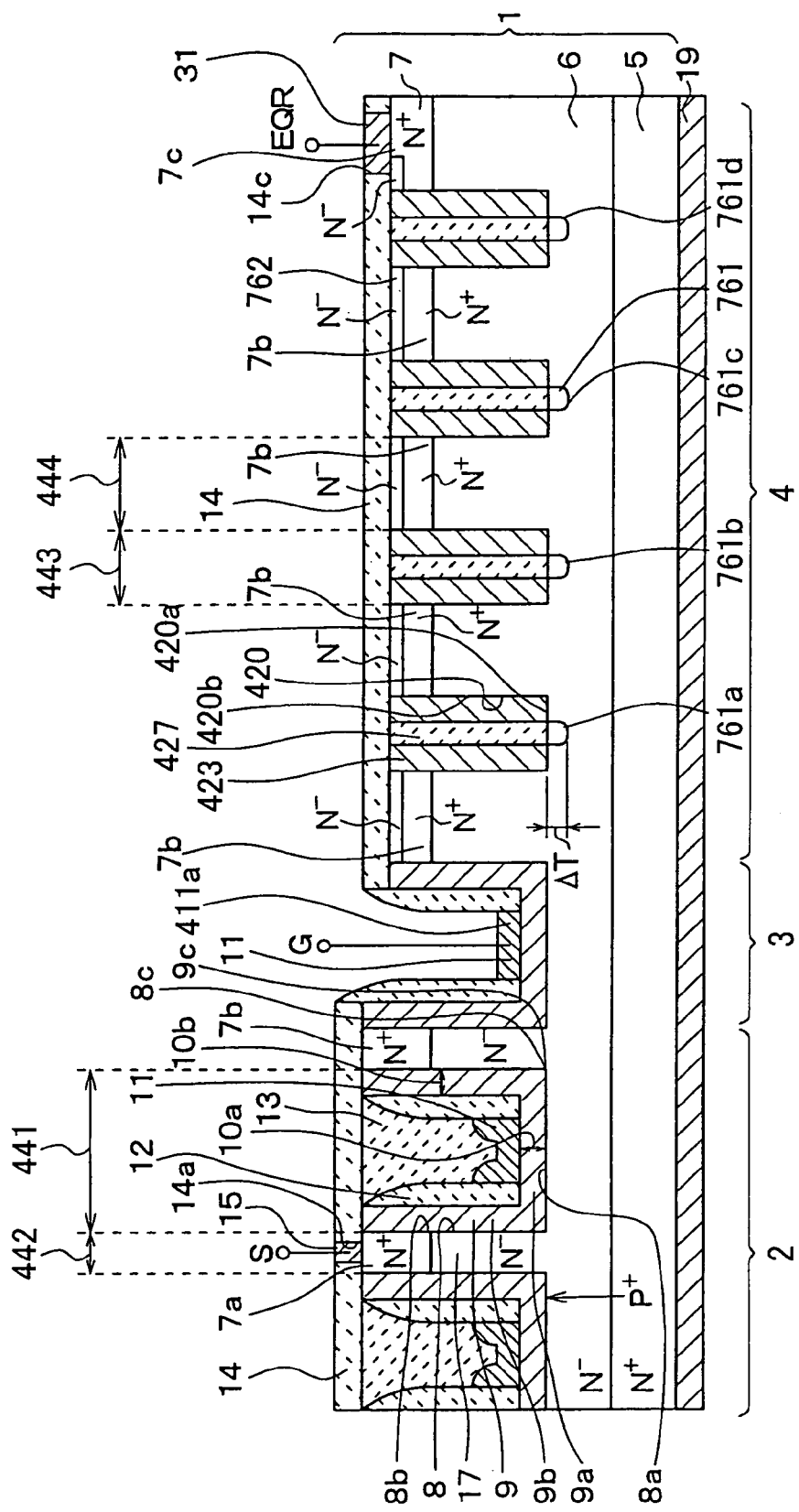
FIG. 27 is a cross sectional view showing a silicon carbide semiconductor device according to a first example of a seventh embodiment of the present invention.

FIG. 27 is a sectional view for showing a silicon carbide semiconductor device according to a first example of a seventh embodiment mode of the present invention. It should also be noted that the same reference numerals shown in FIG. 21 will be employed as those for denoting similar structural portions of the silicon carbide semiconductor device represented in FIG. 27.

Similar to the silicon carbide semiconductor device which is shown in FIG. 25 and has been explained in the sixth embodiment mode, the silicon carbide semiconductor device represented in FIG. 27 is equipped with P type semiconductor regions 761*a*, 761*b*, 761*c*, 761*d*, which are connected to the P type guard ring layers 423 under all of the P type guard ring layers 423 in the outer peripheral portion 4.

In this embodiment mode, a method for forming this P type semiconductor region 761 is different from the method for forming the P type semiconductor region 651 in the sixth embodiment mode. It should also be understood that this P type semiconductor region 761 corresponds to a third semiconductor device.

As represented in FIG. 27, in this silicon carbide semiconductor device, a width of the P type semiconductor region 761 is made nearly equal to a width of the embedded insulating film 427. In the outer peripheral portion 4, the semiconductor substrate 1 thereof has been made thinner than that of the cell portion 2. Also, similar to the semiconductor device shown in FIG. 25, an N-type semiconductor layer 762 has been formed on the surface layer of each of the $N^+$ type semiconductor layers 7b.

Next, a description is made of a method for manufacturing the silicon carbide semiconductor device shown in FIG. 25. In this embodiment mode, a step for forming the P type semiconductor region 761 is carried out between the step for forming the P type guard ring layers 423 and the step for forming the interlayer insulating film in the manufacturing steps as described in the fourth embodiment mode.

Concretely speaking, similar to the fourth embodiment mode, in the step for forming the P type guard ring layers 423, the P type guard ring layers 423 are formed in the region which is scheduled to form the outer peripheral portion 4. The P type guard ring layers 423 own the shapes which are fitted to the inner walls of the trenches 420.

Thereafter, in this embodiment mode, in the step for forming the P type semiconductor region 761, a reactive ion etching process is carried out with respect only to the region which is scheduled to form the outer peripheral portion 4 so as to remove both the surface layer of the semiconductor substrate 1 and such portions which are positioned over the bottom planes of the trenches 420 in the P type guard ring layers 423. At this time, a portion of the $N^+$ type semiconductor layer 7b on the side of the surface thereof is also removed in the region which is scheduled to form the outer peripheral portion 4.

Furthermore, in this step, a mask is formed by way of a photolithography in which a region corresponding to the region which is scheduled to form the outer peripheral portion 4 has been opened. This mask covers the region which is scheduled to form the cell portion 2. While this mask is employed and Al (aluminum) is used as an ion seed, ion implantation is carried out with respect to the region which is scheduled to form the outer peripheral portion 4.

As a result, the P type semiconductor region 761 is formed in such a region within the $N^-$ type drift layer 6, which is contacted to the bottom plane of each of the trenches 420. Also, since the ion implantation is carried out with respect to the surface layer of each of the $N^+$ type semiconductor layers 7b, similar to the sixth embodiment mode, the surface layer of each of the $N^+$ type semiconductor layers 7b becomes an $N^-$ type semiconductor region 762.

Similar to the foruth embodiment mode, thereafter, the step for forming both the side wall 12 of the cell portion 2 and the embedded insulating film 427 of the outer peripheral portion 4, the step for forming the gate wiring-purpose metal film 11 of the cell portion 2 and the gate wiring portion 3, and the step for forming the interlayer insulating film 14 are sequentially carried out. Thus, the silicon carbide semiconductor device shown in FIG. 27 may be accomplished in the above-described manufacturing manner.

As explained in this embodiment mode, even when both the etching process and the ion implantation are carried out after the P type guard ring layers 423 have been formed, a depth of a guard ring can be made essentially deeper than the depth of the gate layer 9 in the cell portion 2 even in such a case that the trenches 420 in the region which is scheduled to form the outer peripheral portion 4 are made in the same depths as those of the trenches 8 in the region which is scheduled to form the cell portion 2.

In the above-described first example, the description has been made of such a case that Al has been employed as the ion seed when the ion implantation is carried out. Alternatively, as will be described in a second example, B (boron) may be employed.

Figure 28:
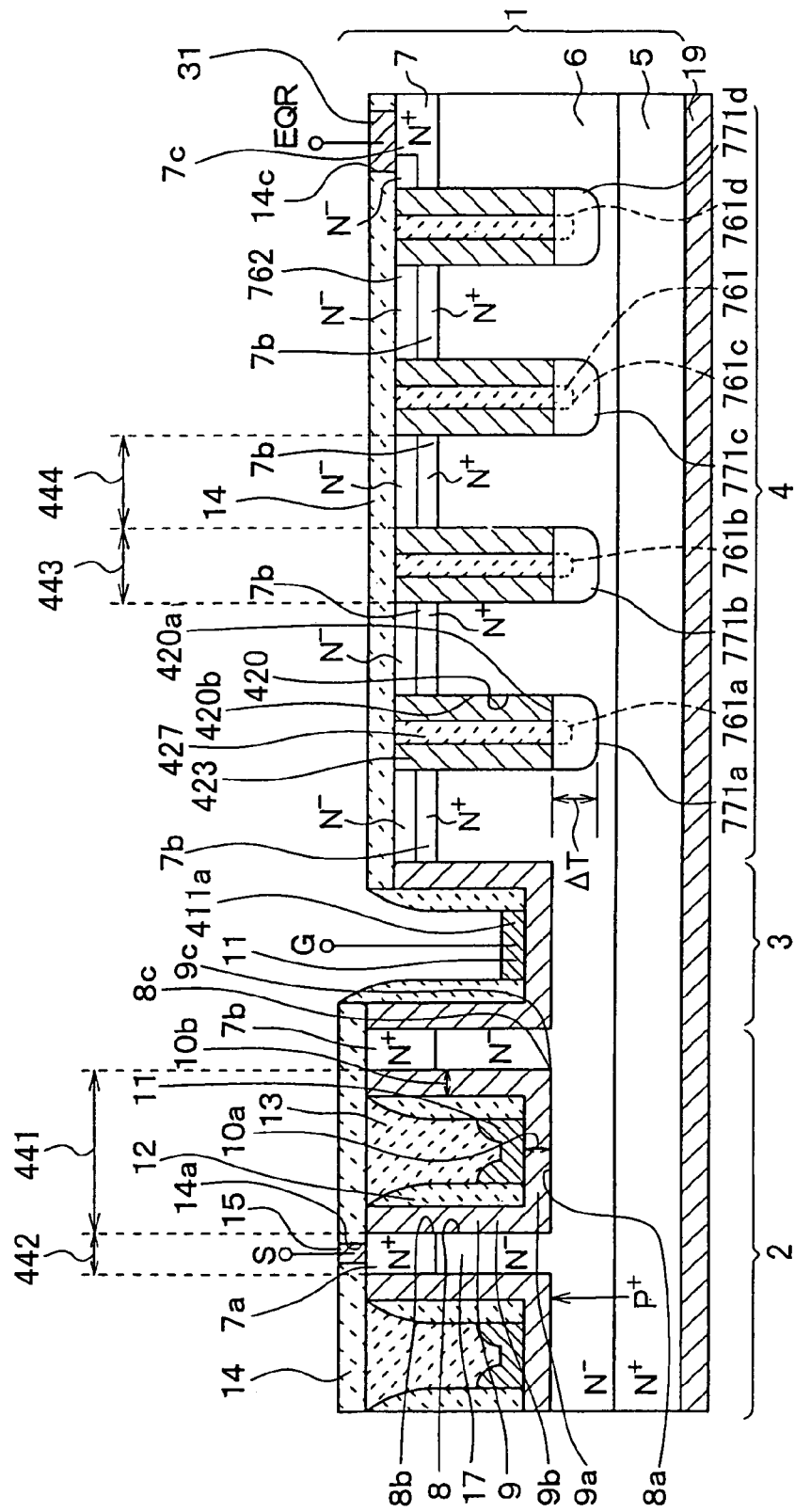
FIG. 28 is a cross sectional view showing a silicon carbide semiconductor device according to a second example of the sixth embodiment of the present invention.

FIG. 28 is a sectional view for showing a silicon carbide semiconductor device according to a second example of the seventh embodiment mode. It should also be noted that the same reference numerals shown in FIG. 21 will be employed as those for denoting similar structural portions of the silicon carbide semiconductor device represented in FIG. 28.

The silicon carbide semiconductor device represented in FIG. 28 is equipped with P type semiconductor regions 771a, 771b, 771c, 771d, which are connected to the P type guard ring layers 423 under all of the P type guard ring layers 423 in the outer peripheral portion 4. It should also be understood that this P type semiconductor region 771 corresponds to the third semiconductor device. As represented in FIG. 27, a width viewed in a sectional plane of this P type semiconductor region 771 along the thickness direction of the semiconductor substrate 1 is made wider than the width of the P type semiconductor region 761 of the silicon carbide semiconductor device shown in FIG. 27.

This silicon carbide semiconductor device can be manufactured by partially changing the manufacturing steps explained in the first example. When the ion implantation is carried out in the step for forming the P type semiconductor region 761, boron is employed as the ion seed. Similar to the first example, the P type semiconductor region 761 is formed by this ion implantation. Thereafter, since a thermal diffusion process operation is carried out, such a P type semiconductor region 771 having the wider width than the width of the P type semiconductor region 761 may be formed. This reason is given as follows: That is, B (boron) may be easily diffused even in the silicon carbide semiconductor layer, as compared with Al (aluminum).

In this embodiment mode, such an example has been explained in which the P type semiconductor regions 761 and 771 have been formed under all of the P type guard ring layers 423. Alternatively, the P type semiconductor regions 761 and 771 may be formed under a portion of the P type guard ring layers 423.

Eighth Embodiment

In the sixth and seventh embodiment modes, such a forming case has been exemplified. That is, after the trenches 420 have been formed, the ion implantation is carried out, so that the guard ring is formed in the outer peripheral portion 4, while the depth of this guard ring which is defined from the surface of the semiconductor substrate 1 is made deeper than the depth of the P type gate layer 9 in the cell portion 2. Alternatively, even when a method of this embodiment mode is carried out, such a guard ring having a depth deeper than the depth of the P type gate layer 9 of the cell portion 2 may be formed in the outer peripheral portion 4.

Figure 29:
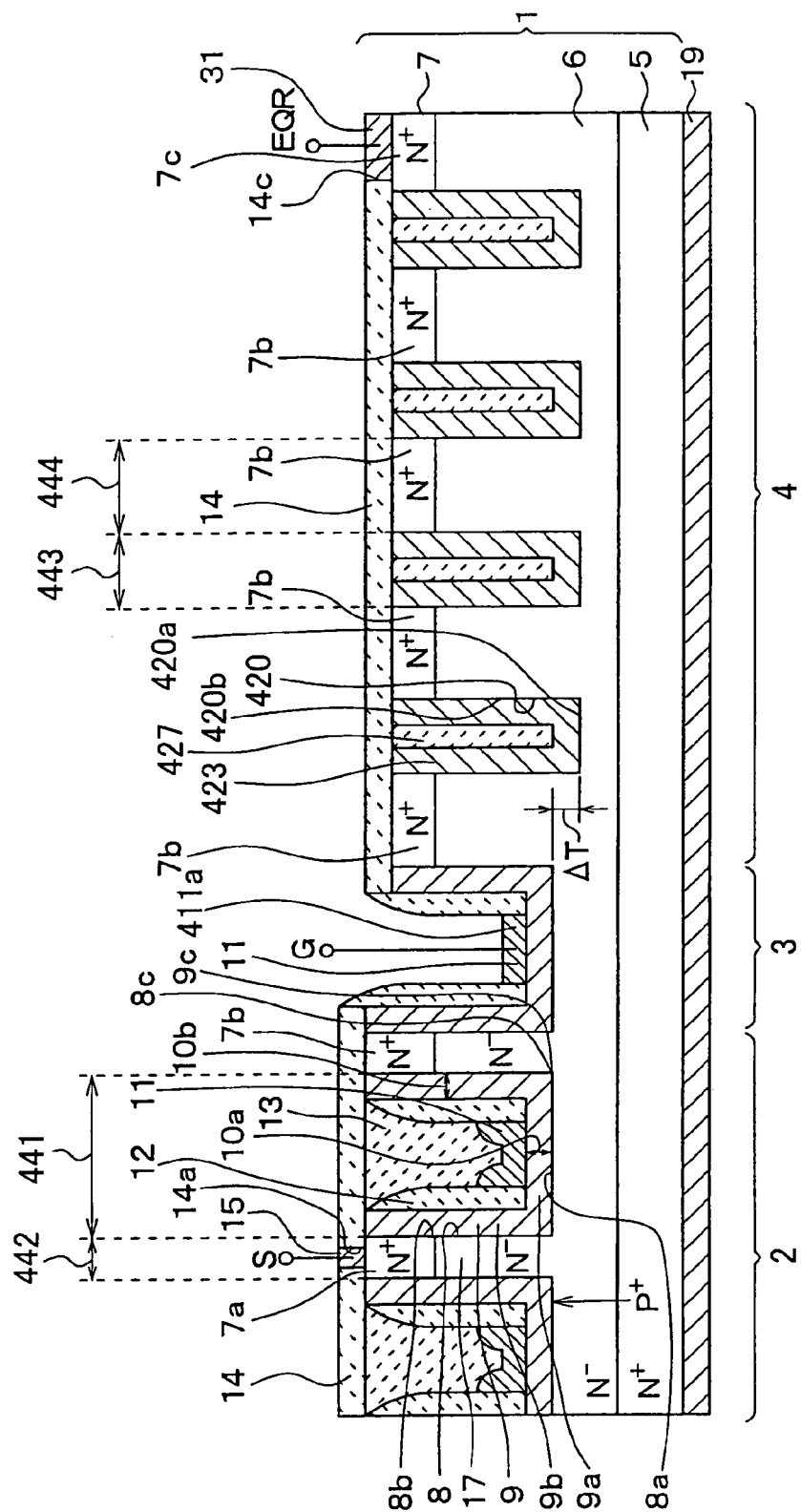
FIG. 29 is a cross sectional view showing a silicon carbide semiconductor device according to a first example of an eighth embodiment of the present invention.

FIG. 29 is a sectional view for showing a silicon carbide semiconductor device according to a first example of the eighth embodiment mode. It should also be noted that the same reference numerals shown in FIG. 21 will be employed as those for denoting similar structural portions of the silicon carbide semiconductor device represented in FIG. 29.

As shown in FIG. 29, this silicon carbide semiconductor device owns the following different structure from the structure of the silicon carbide semiconductor device represented in FIG. 21. That is, a thickness of an N⁺ type semiconductor layer 7 in the outer peripheral portion 4 has been made thinner than a thickness of an N⁺ type semiconductor layer 7 in the cell portion 2, and also, a bottom plane of a P type guard ring layer 423 has been located at a position deeper than a bottom plane of a P type gate layer 9.

A description is made of a method for manufacturing this silicon carbide semiconductor device. In this embodiment mode, a step for removing a portion of the surface plane side of the N⁺ type semiconductor layer 7 in the outer peripheral portion 4 is additionally provided between the step for preparing the semiconductor substrate 1 and the step for forming the trenches 420 in the manufacturing steps explained in the fourth embodiment mode.

Concretely speaking, after the semiconductor substrate 1 has been prepared, a portion of the substrate surface side rather than the N⁺ type semiconductor layer 7 is removed by way of a photolithography and an etching process in the region which is scheduled to form the outer peripheral portion 4 of the semiconductor substrate 1. As a consequence, a thickness of the semiconductor substrate 1 in the outer peripheral portion 4 is made thinner than a thickness of the semiconductor substrate 1 in the cell portion 2. In other words, a surface of the semiconductor substrate 1 in the region which is scheduled to form the outer peripheral portion 4 is made lower than a surface of the semiconductor substrate 1 in the region which is scheduled to form the cell portion 2.

Subsequently, a step for forming both the trenches 8 of the cell portion 2 and the trenches 420 of the outer peripheral portion 4 is carried out. The trenches 8 and trenches 420 are formed at the same time. As a result, the depths of the trenches 420 from the surface of the semiconductor substrate 1 in the region which is scheduled to form the outer peripheral portion 4 can be made deeper than the depths of the trenches 8 in the region which is scheduled to form the cell portion 2. It should also be understood that a "depth" defined from the surface of the semiconductor substrate 1, which is described in this embodiment mode, implies such a depth that the surface of the semiconductor substrate 1 in the region which is scheduled to form the cell portion 2 is employed as a reference.

Subsequently, similar to the fourth embodiment mode, a step for forming both the P type gate layers 9 and the P type guard ring layers 423 is carried out.

Also, in this embodiment mode, such a guard ring may be formed, the depth of which defined from the surface of the semiconductor substrate 1 in the cell portion 2 is made deeper than the depth of the gate layer of the cell portion 2.

As previously explained, in the first example, the description has been made of such a case that a portion of the N⁺ type semiconductor layer 7 on the surface side thereof in the outer peripheral portion 4 has been removed. Alternatively, as will be explained in a second example, all of the N⁺ type semiconductor layers 7b of the outer peripheral portion 4 employed in the silicon carbide semiconductor device shown in FIG. 21 may be removed.

Figure 30:
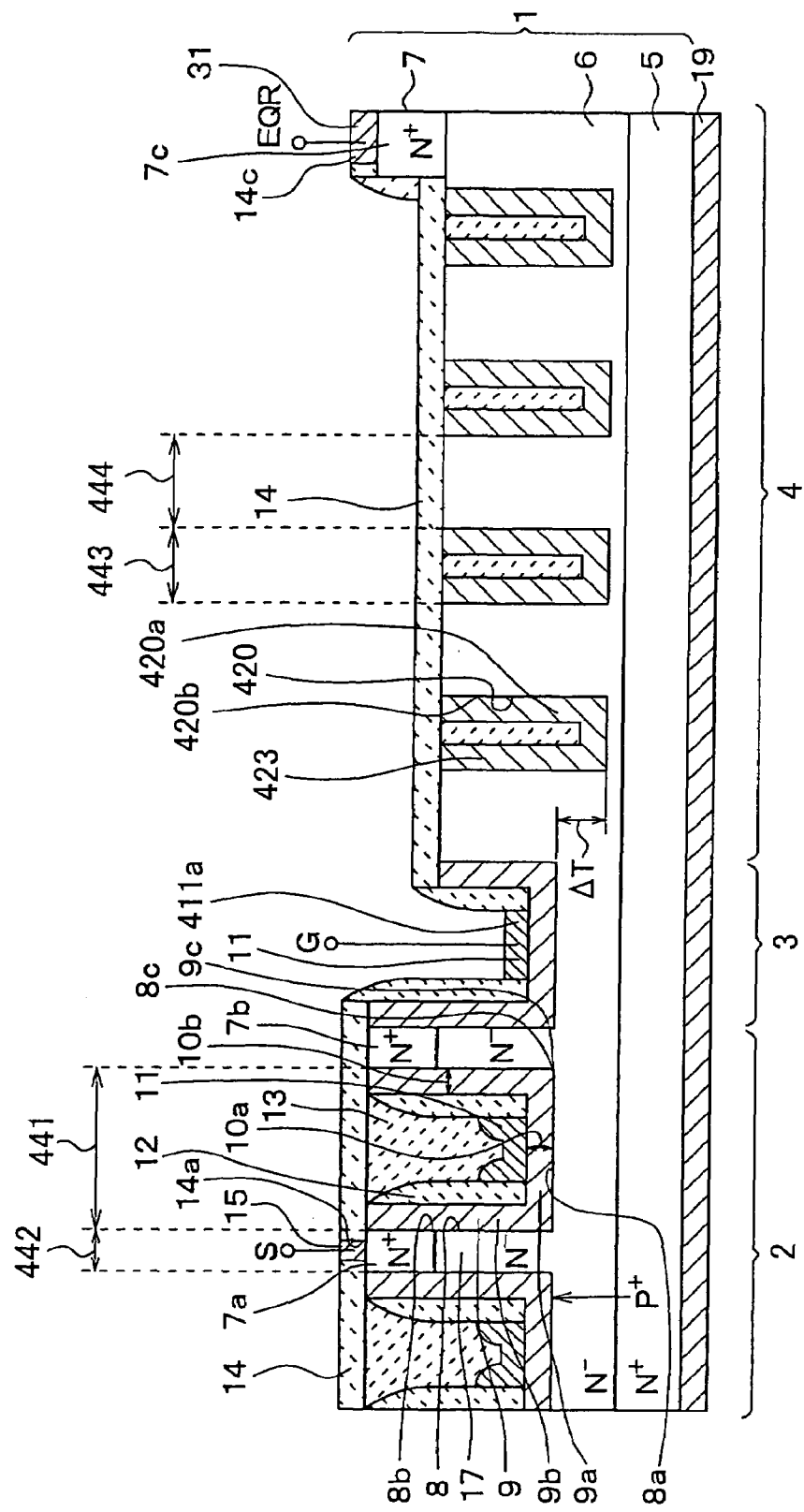
FIG. 30 is a cross sectional view showing a silicon carbide semiconductor device according to a second example of the eighth embodiment of the present invention.
Figure 31:
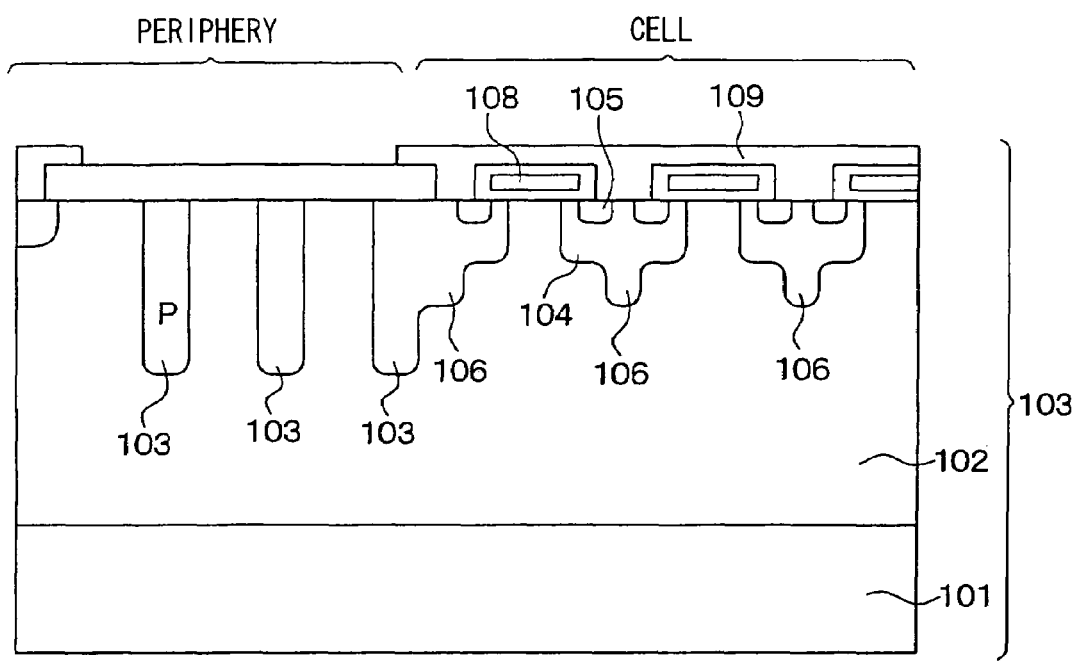
FIG. 31 is a cross sectional view showing a silicon carbide semiconductor device according to a related art.

FIG. 30 is a sectional view for showing a silicon carbide semiconductor device according to a second example of the eighth embodiment mode. It should also be noted that the same reference numerals shown in FIG. 21 will be employed as those for denoting similar structural portions of the silicon carbide semiconductor device represented in FIG. 30. The silicon carbide semiconductor device shown in FIG. 30 owns such a structure that while such N⁺ type semiconductor layers 7b provided in the silicon carbide semiconductor device shown in FIG. 29 are not present in the outer peripheral portion 4, only an N⁺ type semiconductor layer 7c arranged at the outermost position in this outer peripheral portion 4 is provided. Also, in this silicon carbide semiconductor device, a bottom plane of each of the P type guard ring layers 423 is located at a position deeper than the position within the semiconductor substrate 1, as compared with that of the silicon carbide semiconductor device shown in FIG. 29.

A description is made of a method for forming this silicon carbide semiconductor device. In the manufacturing steps explained in the first example, as to the step for removing the N⁺ type semiconductor layers 7 in the outer peripheral portion 4, this removing step is changed as follows: That is, all of the N⁺ type semiconductor layers 7b in the region which is scheduled to form the outer peripheral portion 4 are removed. It should also be noted that the N⁺ type semiconductor layer 7c located at the outermost peripheral position is left. This is because the N⁺ type semiconductor layer 7c is employed as a guard ring. The steps subsequent to this removing step are similar to those of the first example.

As a result, the depths of the trenches 420 can be made deeper than those of the silicon carbide semiconductor device explained in the first example. Accordingly, such a guard ring can be formed, while the depth of this guard ring defined from the surface of the semiconductor substrate 1 in the cell portion 2 is deeper than that of the silicon carbide semiconductor device of the first example.

Also, similar to the fifth embodiment mode, in this embodiment mode, the N⁺ type semiconductor layers 7b are removed among the plural N⁺ type semiconductor layers 7 which are separated by the trenches 420. As a result, this embodiment mode owns a similar effect to that of the fifth embodiment mode.

It should also be understood that each of the second example and the third example of the fourth embodiment mode, the sixth embodiment mode, and the seventh embodiment mode can be alternatively combined with this embodiment mode. In other words, also in this embodiment mode, the interval 444 of the trenches 420 can be increased in connection with distances thereof separated from the cell portion 2, which is similar to the second example of the fourth embodiment mode.

Further, similar to the third example of the fourth embodiment mode, the P type guard ring layers 423 may be alternatively formed by completely embedding the interior portions of the trenches 420 by using only the P type semiconductor layers.

Also, similar to the sixth embodiment mode and the seventh embodiment mode, since the ion implantation is carried out after the trenches 420 have been formed, both the P type semiconductor regions 761 and 771 may be formed under the P type guard ring layers 423.

(Modifications)

In the above-described respective embodiment modes, the silicon carbide semiconductor devices equipped with the JFETs have been described in which such an N type impurity layer referred to as the N⁻ type channel layer 17 constitutes the channel. Alternatively, the present invention may be applied to such a silicon carbide semiconductor device equipped with a JFET, in which conductivity types as to respective structure elements of this silicon carbide semiconductor device are inverted with respect to the conductivity types of the above-explained silicon carbide semiconductor devices, and a P type impurity layer constitutes a channel thereof.

Also, in the above-described embodiment modes, the normally-off type JFETs have been exemplified. The present invention may be applied not only to such a normally-off type JFET, but also may be applied to a normally-on type JFET.

Such changes and modifications are to be understood as being within the scope of the present invention as defined by the appended claims.

What is claimed is:

1. A silicon carbide semiconductor device comprising:
    a semiconductor substrate including a silicon carbide substrate, a drift layer and a first semiconductor layer, which are disposed in this order, where in the silicon carbide substrate has a first conductive type, wherein the drift layer has the first conductive type and is made of silicon carbide, and wherein the first semiconductor layer has the first conductive type and is made of silicon carbide;
    a plurality of first trenches disposed in a cell portion of the semiconductor substrate, wherein each of the first trenches has a depth from a surface of the first semiconductor layer to the drift layer, and has a rectangular cross section in a vertical direction of the semiconductor substrate;
    a gate layer disposed on an inner wall of each first trench, wherein the gate layer is made of silicon carbide, has a second conductive type, and has an epitaxial construction;
    a channel region disposed between the gate layer;
    a first insulation film disposed on a surface of the semiconductor substrate;
    a gate electrode disposed on the first insulation film and connected to the gate layer electrically;
    a source electrode electrically connected to the first semiconductor layer disposed in the cell portion;
    a drain electrode electrically connected to the silicon carbide substrate
    a plurality of second trenches disposed in a region, which is different from the cell portion, wherein each second trench has a depth from the surface of the first semiconductor layer to the drift layer, and has an interval between two neighboring second trenches, the interval being wider than an interval between two neighboring first trenches;
    a second semiconductor layer disposed on an inner wall of each second trench, wherein the second semiconductor layer has the second conductive type and connected to the source electrode electrically, wherein the second semiconductor layer in the second trench and the drift layer provide a diode;
    a third trench disposed between the cell portion and the diode, wherein the third trench has a depth from the surface of the first semiconductor layer to the drift layer; and
    a third semiconductor layer disposed on an inner wall of the third trench, wherein
    the third semiconductor layer has the second conductive type and is made of silicon carbide, and
    the third semiconductor layer is electrically isolated from the gate electrode and the source electrode.

2. The device according to claim 1, wherein the first semiconductor layer in the region different from the cell portion is electrically isolated from the source electrode and the gate electrode.

3. The device according to claim 1, further comprising:
    a second insulation film disposed on the gate layer, wherein the gate layer has a shape along with the inner wall of the first trench, and the second insulation film fills the first trench.

4. The device according to claim 3, wherein
    the semiconductor substrate has a principal surface of a (0001)-Si surface, and
    the first trench has a bottom parallel to the principal surface of the semiconductor substrate and a sidewall perpendicular to the principal surface of the semiconductor substrate.

5. The device according to claim 3, further comprising:
    a metal layer including aluminum, wherein
    the first trench, the gate layer disposed on the inner wall of the first trench, and the second insulation film are disposed in a region including the gate electrode,
    the second insulation film is made of a silicon oxide film,
    the silicon oxide film includes aluminum so that the silicon oxide film has conductivity,
    the gate electrode is disposed on the conductive silicon oxide film through the metal layer so that the gate electrode is connected to the gate layer electrically through the conductive silicon oxide film.

6. The device according to claim 1, wherein the gate layer having the second conductive type completely fills the first trench.

7. The device according to claim 1, further comprising:
    a fourth semiconductor layer having the second conductive type and is made of silicon carbide, wherein
    the first trench and the gate layer are disposed in the region including the gate electrode,
    the fourth semiconductor layer is connected to the gate layer, covers the first semiconductor layer, and is disposed on the surface of the semiconductor substrate in the region including the gate electrode, and
    the gate electrode is connected to the gate layer electrically through the fourth semiconductor layer.

8. The device according to claim 7, wherein the fourth semiconductor layer is only disposed below the gate electrode.

* * * * *